US012563962B2

(12) United States Patent
Ko et al.

(10) Patent No.: US 12,563,962 B2
(45) **Date of Patent: *Feb. 24, 2026**

(54) ORGANIC LIGHT-EMITTING DEVICE AND ELECTRONIC APPARATUS INCLUDING THE SAME

(71) Applicant: Samsung Display Co., Ltd., Yongin-si (KR)

(72) Inventors: Soobyung Ko, Yongin-si (KR); Sungbum Kim, Yongin-si (KR); Junha Park, Yongin-si (KR); Munki Sim, Yongin-si (KR); Heechoon Ahn, Yongin-si (KR); Hyoyoung Lee, Yongin-si (KR); Mina Jeon, Yongin-si (KR); Mieun Jun, Yongin-si (KR); Junghoon Han, Yongin-si (KR); Youngkook Kim, Yongin-si (KR); Seokhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/813,749

(22) Filed: Jul. 20, 2022

(65) Prior Publication Data

US 2022/0384745 A1 Dec. 1, 2022

Related U.S. Application Data

(63) Continuation of application No. 16/360,938, filed on Mar. 21, 2019.

(30) Foreign Application Priority Data

Mar. 22, 2018 (KR) ........................ 10-2018-0033482

(51) Int. Cl.
*H10K 85/40* (2023.01)
*H10K 50/11* (2023.01)
(Continued)

(52) U.S. Cl.
CPC .......... *H10K 85/40* (2023.02); *H10K 85/346* (2023.02); *H10K 85/654* (2023.02);
(Continued)

(58) Field of Classification Search
None
See application file for complete search history.

(56) References Cited

U.S. PATENT DOCUMENTS 7,381,479 B2 6/2008 Lamansky et al.
7,393,599 B2 7/2008 Thompson et al.
(Continued)

FOREIGN PATENT DOCUMENTS

CN 103360303 B 10/2013
CN 103492383 A 1/2014
(Continued)

OTHER PUBLICATIONS

Tyler Fleetham et al. "Efficient "Pure" Blue OLEDs Employing Tetradentate Pt Complexes with a Narrow Spectral Bandwidth", Adv. Mater. 2014, vol. 26, p. 7116-7121 (Year: 2014).*
(Continued)

*Primary Examiner* — Seokmin Jeon
(74) *Attorney, Agent, or Firm* — Womble Bond Dickinson (US) LLP

(57) ABSTRACT

Provided are an organic light-emitting device including a first compound, a second compound, and a third compound, and an electronic apparatus including the same. The organic light-emitting device includes a first electrode; a second electrode facing the first electrode; and an emission layer disposed between the first electrode and the second elec-
(Continued)

trode, the emission layer including the first compound, the second compound, and the third compound.

13 Claims, 7 Drawing Sheets

(51) Int. Cl.
*H10K 85/30* (2023.01)
*H10K 85/60* (2023.01)
*H10K 101/00* (2023.01)
*H10K 101/10* (2023.01)

(52) U.S. Cl.
CPC ..... *H10K 85/6572* (2023.02); *H10K 85/6574* (2023.02); *H10K 50/11* (2023.02); *H10K 2101/10* (2023.02); *H10K 2101/90* (2023.02)

(56) References Cited

U.S. PATENT DOCUMENTS

| | | | | |
|---|---|---|---|---|
| 7,585,573 | B2 | 9/2009 | Lee et al. | |
| 7,652,287 | B2 | 1/2010 | Jeong et al. | |
| 7,776,458 | B2 | 8/2010 | Ragini et al. | |
| 8,106,199 | B2 | 1/2012 | Jabbour et al. | |
| 8,389,725 | B2 | 3/2013 | Li et al. | |
| 8,669,364 | B2 | 3/2014 | Li et al. | |
| 8,680,760 | B2 | 3/2014 | Cheng et al. | |
| 8,816,080 | B2 | 8/2014 | Li et al. | |
| 8,846,940 | B2 | 9/2014 | Li et al. | |
| 8,883,322 | B2 | 11/2014 | Wu et al. | |
| 8,946,417 | B2 | 2/2015 | Jian et al. | |
| 9,051,344 | B2 | 6/2015 | Lin et al. | |
| 9,076,974 | B2 | 7/2015 | Li et al. | |
| 9,093,650 | B2 | 7/2015 | Kim et al. | |
| 9,142,710 | B2 | 9/2015 | Seo et al. | |
| 9,142,791 | B2 | 9/2015 | Adamovich et al. | |
| 9,172,046 | B1 | 10/2015 | Kim et al. | |
| 9,203,039 | B2 | 12/2015 | Li et al. | |
| 9,221,857 | B2 | 12/2015 | Li et al. | |
| 9,224,963 | B2 | 12/2015 | Li et al. | |
| 9,238,668 | B2 | 1/2016 | Li et al. | |
| 9,299,944 | B2 | 3/2016 | Seo et al. | |
| 9,312,502 | B2 | 4/2016 | Li et al. | |
| 9,324,957 | B2 | 4/2016 | Li et al. | |
| 9,340,728 | B2 | 5/2016 | Ise et al. | |
| 9,382,273 | B2 | 7/2016 | Li et al. | |
| 9,391,289 | B2 | 7/2016 | Seo et al. | |
| 9,425,415 | B2 | 8/2016 | Li et al. | |
| 9,478,764 | B2 | 10/2016 | Seo | |
| 9,620,722 | B2 | 4/2017 | Martynova et al. | |
| 9,783,564 | B2 | 10/2017 | Kottas et al. | |
| 9,923,155 | B2 | 3/2018 | Li et al. | |
| 10,256,419 | B2 | 4/2019 | Brooks et al. | |
| 10,326,111 | B2 | 6/2019 | Yoo et al. | |
| 10,361,388 | B2 | 7/2019 | Mitsumori et al. | |
| 10,374,186 | B2 | 8/2019 | Ohsawa et al. | |
| 10,586,932 | B2 | 3/2020 | Hosoumi et al. | |
| 10,833,280 | B2 | 11/2020 | Ahn et al. | |
| 10,847,727 | B2 | 11/2020 | Hayer et al. | |
| 11,289,668 | B2 | 3/2022 | Kwak et al. | |
| 12,035,617 | B2 * | 7/2024 | Shin | H10K 85/346 |
| 12,201,017 | B2 * | 1/2025 | Lee | H10K 85/40 |
| 12,250,873 | B2 | 3/2025 | Lee et al. | |
| 12,250,874 | B2 | 3/2025 | Ahn et al. | |
| 2003/0175553 | A1 | 9/2003 | Thompson et al. | |
| 2004/0080267 | A1 | 4/2004 | Cok | |
| 2005/0287394 | A1 | 12/2005 | Yang et al. | |
| 2006/0103298 | A1 * | 5/2006 | Lee | 313/504 |
| 2008/0018221 | A1 | 1/2008 | Egen et al. | |
| 2011/0024735 | A1 | 2/2011 | Sawada et al. | |
| 2011/0114922 | A1 | 5/2011 | Pretot et al. | |
| 2011/0272679 | A1 | 11/2011 | Yokoyama et al. | |
| 2012/0256535 | A1 | 10/2012 | Seo et al. | |
| 2013/0168656 | A1 | 7/2013 | Tsai et al. | |
| 2013/0264561 | A1 | 10/2013 | Dobbs et al. | |
| 2013/0270531 | A1 | 10/2013 | Seo et al. | |
| 2014/0027733 | A1 * | 1/2014 | Zeng | H01L 51/0071 257/40 |
| 2014/0042370 | A1 | 2/2014 | Martynova et al. | |
| 2014/0246660 | A1 | 9/2014 | Tanaka et al. | |
| 2014/0309428 | A1 | 10/2014 | Egen et al. | |
| 2015/0053958 | A1 | 2/2015 | Ishisone et al. | |
| 2015/0060794 | A1 | 3/2015 | Oh et al. | |
| 2015/0105556 | A1 * | 4/2015 | Li | H01L 51/0087 |
| 2015/0137051 | A1 | 5/2015 | Jung et al. | |
| 2015/0155511 | A1 | 6/2015 | Ohsawa et al. | |
| 2015/0194616 | A1 * | 7/2015 | Li | H01L 51/0087 |
| 2015/0194622 | A1 | 7/2015 | Yamamoto et al. | |
| 2015/0280140 | A1 | 10/2015 | Matsuki et al. | |
| 2015/0340618 | A1 | 11/2015 | Lee et al. | |
| 2015/0349279 | A1 | 12/2015 | Li et al. | |
| 2016/0013427 | A1 | 1/2016 | Kim et al. | |
| 2016/0028028 | A1 | 1/2016 | Li et al. | |
| 2016/0056401 | A1 | 2/2016 | Lee et al. | |
| 2016/0072078 | A1 | 3/2016 | Lee et al. | |
| 2016/0351829 | A1 | 12/2016 | Hosoumi et al. | |
| 2017/0018600 | A1 | 1/2017 | Ito et al. | |
| 2017/0062752 | A1 * | 3/2017 | Ihn | H01L 51/5004 |
| 2017/0077421 | A1 | 3/2017 | Ihn et al. | |
| 2017/0092873 | A1 | 3/2017 | Kang et al. | |
| 2017/0098778 | A1 | 4/2017 | Oh et al. | |
| 2017/0162796 | A1 | 6/2017 | Jeong et al. | |
| 2017/0194570 | A1 | 7/2017 | Kang et al. | |
| 2017/0200899 | A1 | 7/2017 | Kim et al. | |
| 2017/0309687 | A1 | 10/2017 | Watabe et al. | |
| 2017/0309829 | A1 | 10/2017 | Jung et al. | |
| 2017/0338436 | A1 | 11/2017 | Mitsumori et al. | |
| 2017/0346029 | A1 * | 11/2017 | Kim | H01L 51/5004 |
| 2017/0352819 | A1 | 12/2017 | Son et al. | |
| 2018/0013073 | A1 | 1/2018 | Duan et al. | |
| 2018/0105741 | A1 | 4/2018 | Ko et al. | |
| 2018/0151630 | A1 | 5/2018 | Yamaoka et al. | |
| 2018/0269410 | A1 | 9/2018 | Shitagaki et al. | |
| 2018/0309080 | A1 | 10/2018 | Seo et al. | |
| 2019/0006608 | A1 | 1/2019 | Koo et al. | |
| 2019/0051834 | A1 | 2/2019 | Liu et al. | |
| 2019/0074468 | A1 | 3/2019 | Kwak et al. | |
| 2019/0140204 | A1 | 5/2019 | Seo et al. | |
| 2019/0157599 | A1 | 5/2019 | Nakamura et al. | |
| 2019/0165286 | A1 | 5/2019 | Li et al. | |
| 2019/0203114 | A1 | 7/2019 | Ihn et al. | |
| 2019/0214584 | A1 | 7/2019 | Chen et al. | |
| 2019/0284137 | A1 | 9/2019 | Baek et al. | |
| 2019/0296254 | A1 | 9/2019 | Ko et al. | |
| 2019/0312210 | A1 | 10/2019 | Akashi et al. | |
| 2019/0375768 | A1 | 12/2019 | Kim et al. | |
| 2020/0020870 | A1 | 1/2020 | Seo et al. | |
| 2020/0136059 | A1 | 4/2020 | Hong et al. | |
| 2020/0140471 | A1 * | 5/2020 | Chen | C07F 15/0086 |
| 2020/0168818 | A1 | 5/2020 | Lin et al. | |
| 2020/0203610 | A1 | 6/2020 | Duan et al. | |
| 2020/0295272 | A1 | 9/2020 | Lee et al. | |
| 2020/0308209 | A1 | 10/2020 | Yoon et al. | |
| 2020/0313096 | A1 | 10/2020 | Kim et al. | |
| 2020/0350507 | A1 * | 11/2020 | Sun | H01L 51/5004 |
| 2021/0159440 | A1 | 5/2021 | Mitsumori et al. | |
| 2021/0257574 | A1 | 8/2021 | Ishisone et al. | |
| 2021/0343965 | A1 | 11/2021 | Seo | |
| 2021/0359227 | A1 * | 11/2021 | Shin | H01L 51/0087 |
| 2021/0376248 | A1 | 12/2021 | Song et al. | |
| 2022/0020939 | A1 * | 1/2022 | Lee | H01L 51/0094 |
| 2022/0131095 | A1 * | 4/2022 | Ko | H01L 51/0094 |
| 2022/0173339 | A1 * | 6/2022 | Lee | H01L 51/0087 |
| 2022/0190246 | A1 | 6/2022 | Ishisone et al. | |
| 2022/0190276 | A1 | 6/2022 | Naijo et al. | |
| 2022/0199918 | A1 * | 6/2022 | Ahn | H01L 51/0087 |
| 2022/0340550 | A1 | 10/2022 | Yang et al. | |
| 2024/0138221 | A1 | 4/2024 | Song et al. | |

FOREIGN PATENT DOCUMENTS

| | | |
|---|---|---|
| CN | 103682108 A | 3/2014 |
| CN | 104370974 A | 2/2015 |

(56) References Cited

FOREIGN PATENT DOCUMENTS

| | | | | |
|---|---|---|---|---|
| DE | 10-2014-008722 A1 | | 12/2015 | |
| EP | 1820801 A1 | | 8/2007 | |
| EP | 2461390 A1 | | 6/2012 | |
| EP | 3275968 A1 | | 1/2018 | |
| EP | 3 425 690 A1 | | 1/2019 | |
| EP | 3 432 380 A2 | | 1/2019 | |
| EP | 3428174 A1 | | 1/2019 | |
| EP | 3 439 063 A1 | | 2/2019 | |
| EP | 3 451 403 A1 | | 3/2019 | |
| EP | 3537495 A1 | | 9/2019 | |
| JP | 2004-273190 A | | 9/2004 | |
| JP | 2005-514754 A | | 5/2005 | |
| JP | 2007-45742 A | | 2/2007 | |
| JP | 2007-335904 A | | 12/2007 | |
| JP | 2008-147424 A | | 6/2008 | |
| JP | 2008-525366 A | | 7/2008 | |
| JP | 2010-184910 A | | 8/2010 | |
| JP | 2011-091366 A | | 5/2011 | |
| JP | 2011-216656 A | | 10/2011 | |
| JP | 2011-256143 A | | 12/2011 | |
| JP | 2013-023500 A | | 2/2013 | |
| JP | 2014-513679 A | | 6/2014 | |
| JP | 2015-17231 A | | 1/2015 | |
| JP | 2017-123463 A | | 7/2017 | |
| JP | 2017-523270 A | | 8/2017 | |
| JP | 2017-199903 A | | 11/2017 | |
| JP | 2017-212443 A | | 11/2017 | |
| JP | 2019-016788 A | | 1/2019 | |
| JP | 2019-047124 A | | 3/2019 | |
| JP | 2019-062184 A | | 4/2019 | |
| KR | 10-0730115 B1 | | 6/2007 | |
| KR | 10-2012-0042886 A | | 5/2012 | |
| KR | 10-2013-0116185 A | | 10/2013 | |
| KR | 10-2014-0015298 A | | 2/2014 | |
| KR | 10-2014-0033091 A | | 3/2014 | |
| KR | 10-2014-0092826 A | | 7/2014 | |
| KR | 10-2015-0030660 A | | 3/2015 | |
| KR | 10-2016-0012941 A | | 2/2016 | |
| KR | 10-2016-0045508 A | | 4/2016 | |
| KR | 10-2016-0080090 A | | 7/2016 | |
| KR | 10-2016-0130940 A | | 11/2016 | |
| KR | 10-2017-0026075 A | | 3/2017 | |
| KR | 10-2017-0065733 A | | 6/2017 | |
| KR | 10-2017-0136823 A | | 12/2017 | |
| KR | 10-2018-0013958 A | | 2/2018 | |
| KR | 10-2018-0085007 A | | 7/2018 | |
| KR | 10-2019-0004236 A | | 1/2019 | |
| KR | 10-2019-0011754 A | | 2/2019 | |
| KR | 10-2019-0026618 A | | 3/2019 | |
| KR | 10-2019-0069584 A | | 6/2019 | |
| KR | 10-2019-0112232 A | | 10/2019 | |
| KR | 10-2020-0011059 A | | 2/2020 | |
| KR | 10-2083434 B1 | | 3/2020 | |
| KR | 10-2020-0115795 A | | 10/2020 | |
| KR | 10-2020-0115890 A | | 10/2020 | |
| TW | 201711243 A | | 3/2017 | |
| WO | WO 2011/013830 A1 | | 2/2011 | |
| WO | WO2011055912 A1 | * | 5/2011 | ................ C07F 7/08 |
| WO | WO 2012/121936 A2 | | 9/2012 | |
| WO | WO 2012/143080 A2 | | 10/2012 | |
| WO | WO 2013/069338 A1 | | 5/2013 | |
| WO | WO 2015/171627 A1 | | 11/2015 | |
| WO | 2017/111543 A1 | | 6/2017 | |

OTHER PUBLICATIONS

Xiao-Chun Hang et al. "Highly Efficient Blue-Emitting Cyclometalated Platinum(II) Complexes by Judicious Molecular Design", Angew. Chem. Int. Ed., 2013, vol. 52, p. 6753-6756 (Year: 2013).*

Merriam-Webster dictionary, Definition of "apparatus"; https://www.merriam-webster.com/dictionary/apparatus (Year: 2022).*

Huiqing Pang et al. "A full-color, low-power, wearable display for mobile applications", SPIE, Mar. 29, 2012 (Year: 2012).*

Cha, Jae-Ryung, et al. "Effect of increasing electron donor units for high-efficiency blue thermally activated delayed fluorescence", Dyes and Pigments, 2017, vol. 140, p. 399-406.

Im, Yirang, et al. "Molecular Design Strategy of Organic Thermally Activated Delayed Fluorescence Emitters", Chem. Mater. 2017, vol. 29, p. 1946-1963.

U.S. Notice of Allowance dated Oct. 20, 2022, issued in U.S. Appl. No. 16/859,763 (8 pages).

US Office Action dated Oct. 3, 2022, issued in U.S. Appl. No. 16/360,938 (63 pages).

Goushi, Kenichi et al., "Organic light-emitting diodes employing efficient reverse intersystem crossing for triplet-to-singlet state conversation", Nature Photonics, Apr. 2012, pp. 253-258, Macmillan Publishers Limited.

Graves, David et al.; "Photophysical Investigation of the Thermally Activated Delayed Emission from Films of m-MTDATA:PBD Exciplex"; Adv. Funct. Mater. 2014; 24; pp. 2343-2351.

Kesti, Tero J et al., "Exciplex Intermediates in Photoinduced Electron Transfer of Porphyrin-Fullerene Dyads", J. Am. Chem. Soc., 2002, pp. 8067-8077, vol. 124, No. 27, American Chemical Society, U.S.

Kim, Kwon-Hyeon et al., "Phosphorescent dye-based supramolecules for high-efficiency organic light-emitting diodes", Nature Communications, Sep. 10, 2014, pp. 1-8, Macmillan Publishers Limited.

Kim, Sei-Yong et al., "Organic Light-Emitting Diodes with 30% External Quantum Efficiency Based on a Horizontally Oriented Emitter", Advanced Functional Materials, 2013, pp. 3896-3900, vol. 23, WILEY-VCH Verlag Gmbh & Co. KGaA, Weinheim.

Kuzmin, Michael G. et al., "Exciplex mechanism of excited state electron transfer reactions in polar media", Journal of Photochemistry and Photobiology A: Chemistry, 1996, pp. 51-57, vol. 102, Elsevier Science S.A.

Lee, Jeong-Hwan et al., "An Exciplex Forming Host for Highly Efficient Blue Organic Light Emitting Diodes with Low Driving Voltage", Advanced Functional Materials, 2014, 6 pages, WILEY-VCH Verlag Gmbh & Co. KGaA, Weinheim.

Lee, Jeong-Hwan et al., "Exciplex-Forming Co-Host-Based Red Phosphorescent Organic Light-Emitting Diodes with Long Operational Stability and High Efficiency", Applied Materials & Interfaces, Jan. 18, 2017, 5 pages, ACS Publications, U.S.

Liu, Xiao-Ke et al., "Prediction and Design of Efficient Exciplex Emitters for High-Efficiency, Thermally Activated Delayed-Fluorescence Organic Light-Emitting Diodes", Advanced Materials, 2015, 6 pages, WILEY-VCH Verlag GmbH & Co. KGaA, Weinheim.

Notice of Allowance for U.S. Appl. No. 16/859,763 dated Jul. 7, 2022, 8 pages.

Shin, Hyun et al., "Effect of Triplet Exciplex Confinement in Organic Light-Emitting Diodes according to Donor/Acceptor forming ratio", Organic Photonics Laboratory, Poster, 2020, 1 page, Industrial Technology Development Program.

Shin, Hyun et al., "Sky-Blue Phosphorescent OLEDs with 34.1% External Quantum Efficiency Using a Low Refractive Index Electron Transporting Layer", Advanced Materials, 2016, pp. 4920-4925, vol. 28, WILEY-VCH Verlag Gmbh & Co. KGaA, Weinheim.

Shin, Hyun, "Exciplex based Organic Light-Emitting Diodes with Theoretical Efficiency and Long Operational Lifetime", 2018, 185 pages, Department of Materials Science and Engineering, The Graduate School, Seoul National University.

Wei, Xiaofang et al., "Design of Efficient Exciplex Emitters by Decreasing the Energy Gap between the local excited triplet(3LE)state of the Acceptor and the charge transfer (CT) states of the Exciplex", Frontiers in Chemistry, Mar. 11, 2019, 17 pages, Frontiers in Chemistry.

Office action issued in U.S. Appl. No. 16/859,763, mailed Mar. 9, 2022, 10 pages.

European Patent Office, Search report corresponding to related European Application No. 20188007.7, Oct. 22, 2020, 9 pages.

Extended European Patent Office Search Report for corresponding European Application No. 19163558.0, dated Jul. 25, 2019, 7 pages.

Tyler Fleetham et al. "Efficient "Pure" Blue OLEDs Employing Tetradentate Pt Complexes with a Narrow Spectral Bandwidth", Adv. Mater. 2014, vol. 26, pp. 7116-7121 (Year: 2014).

(56) References Cited

OTHER PUBLICATIONS

Definition of "apparatus" in Merriam-Webster online dictionary, https://www.merriam-webster.com/dictionary/apparatus (Year: 2021).
Pang et al. "A full-color, low-power, wearable display for mobile applications", SPIE, Mar. 29, 2012 (Year: 2012).
US Office Action dated Feb. 16, 2023, issued in U.S. Appl. No. 17/003,743 (33 pages).
Final Rejection for U.S. Appl. No. 16/360,938 dated Mar. 28, 2023, 43 pages.
Notice of Allowance for U.S. Appl. No. 16/859,763 dated Mar. 22, 2023, 10 pages.
Jae-Wook Kang et al. "A Host Material Containing Tetraphenylsilane for Phosphorescent OLEDs with High Efficiency and Operational Stability," Org. Electronics 2008, 9, pp. 452-460.
Final Rejection for U.S. Appl. No. 17/003,743, filed Jun. 9, 2023, 42 pages.
Office Action for U.S. Appl. No. 16/360,938 dated Sep. 12, 2023, 60 pages.
US Notice of Allowance dated Jul. 19, 2023, issued in U.S. Appl. No. 16/859,763 (10 pages).
US Final Office Action dated Jan. 29, 2024, issued in U.S. Appl. No. 16/360,938 (46 pages).
US Notice of Allowance dated Feb. 16, 2024, issued in U.S. Appl. No. 16/859,763 (11 pages).
US Notice of Allowance dated Mar. 20, 2024, issued in U.S. Appl. No. 18/157,335 (9 pages).
US Office Action dated Mar. 22, 2024, issued in U.S. Appl. No. 17/399,013 (7 pages).
US Office Action dated Oct. 11, 2023, issued in U.S. Appl. No. 18/157,335 (10 pages).
US Notice of Allowance dated Nov. 2, 2023, issued in U.S. Appl. No. 16/859,763 (10 pages).
Restriction Requirement for U.S. Appl. No. 17/399,013 dated Dec. 20, 2023, 7 pages.
English translation of JP 2008147424 A obtained from Global Dossier (Year: 2008).
US Office Action dated Apr. 12, 2024, issued in U.S. Appl. No. 17/003,743 (24 pages).
US Notice of Allowance dated Jun. 5, 2024, issued in U.S. Appl. No. 16/859,763 (10 pages).
US Notice of Allowance dated Jul. 16, 2024, issued in U.S. Appl. No. 17/399,013 (5 pages).
US Office Action dated Jul. 30, 2024, issued in U.S. Appl. No. 16/360,938 (71 pages).
US Notice of Allowance dated Aug. 2, 2024, issued in U.S. Appl. No. 18/157,335 (9 pages).
US Final Office Action dated Sep. 6, 2024, issued in U.S. Appl. No. 17/003,743 (26 pages).
US Notice of Allowance dated Sep. 25, 2024, issued in U.S. Appl. No. 16/859,763 (10 pages).
US Final Office Action dated Nov. 22, 2024, issued in in U.S. Appl. No. 16/360,938 (49 pages).
Office Acton for U.S. Appl. No. 17/003,743 dated Mar. 12, 2025, 26 pages.
US Notice of Allowance dated May 20, 2025, issued in U.S. Appl. No. 16/859,763 (10 pages).
US Office Action dated Jul. 2, 2025, issued in U.S. Appl. No. 16/360,938 (38 pages).
US Final Office Action dated Aug. 12, 2025, issued in U.S. Appl. No. 17/003,743 (33 pages).
US Notice of Allowance dated Oct. 7, 2025, issued in U.S. Appl. No. 16/360,938 (12 pages).

* cited by examiner

ORGANIC LIGHT-EMITTING DEVICE AND ELECTRONIC APPARATUS INCLUDING THE SAME

CROSS-REFERENCE TO RELATED APPLICATION

This application is a continuation of U.S. application Ser. No. 16/360,938, filed Mar. 21, 2019, which claims priority to and the benefit of Korean Patent Application No. 10-2018-0033482, filed on Mar. 22, 2018, in the Korean Intellectual Property Office, the entire content of which is incorporated herein by reference.

BACKGROUND

1. Field

One or more embodiments relate to an organic light-emitting device and an electronic apparatus including the same.

2. Description of the Related Art

Organic light-emitting devices are self-emission devices that have wide viewing angles, high contrast ratios, short response times, and excellent characteristics in terms of brightness, driving voltage, and response speed, compared to devices in the art.

An example of such organic light-emitting devices may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit (e.g., transition or relax) from an excited state to a ground state, thereby generating light.

SUMMARY

Aspects of embodiments of the present disclosure provide an organic light-emitting device having high luminescent efficiency and a long lifespan and an electronic apparatus including the same.

Additional aspects of embodiments will be set forth in part in the description which follows and, in part, will be apparent from the description, or may be learned by practice of the presented embodiments.

An aspect of an embodiment provides an organic light-emitting device including:

a first electrode;

a second electrode facing the first electrode; and an emission layer disposed between the first electrode and the second electrode, wherein the emission layer includes a first compound, a second compound, and a third compound, the first compound, the second compound, and the third compound are different from one another, the first compound is represented by Formula 1, the second compound is represented by Formula 2, and the third compound includes a group represented by Formula 3:

Formula 1

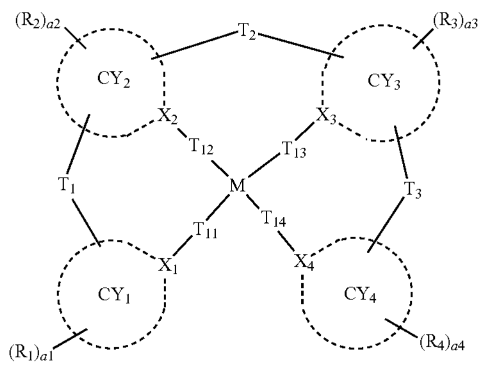

Formula 2

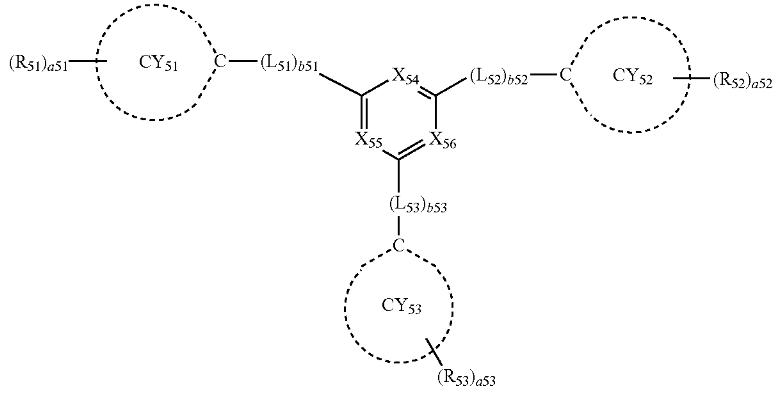

-continued

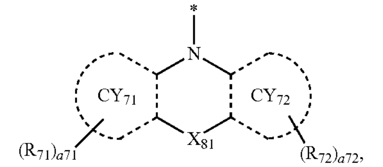

Formula 3 wherein, in Formulae 1 to 3,

M may be a transition metal, but may not be iridium (Ir), $X_1$ to $X_4$ may each independently be N or C, $T_{11}$ to $T_{14}$ may each independently be a chemical bond, O, S, B(R'), N(R'), P(R'), C(R')(R"), Si(R')(R"), Ge(R')(R"), C(=O), B(R')(R"), N(R')(R"), or P(R')(R"), wherein, when $T_{11}$ is the chemical bond, $X_1$ and M may be directly bound, when $T_{12}$ is the chemical bond, $X_2$ and M may be directly bound, when $T_{13}$ is the chemical bond, $X_3$ and M may be directly bound, and when $T_{14}$ is the chemical bond, $X_4$ and M may be directly bound, two bonds selected from a bond between $X_1$ or $T_{11}$ and M, a bond between $X_2$ or $T_{12}$ and M, a bond between $X_3$ or $T_{13}$ and M, and a bond between $X_4$ or $T_{14}$ and M may each be a coordinate bond (e.g., a coordinate covalent bond), and the others thereof may each be a covalent bond (e.g., a covalent single bond, which may be referred to herein as a single bond), $T_1$ may be selected from a single bond, a double bond, *—N($R_5$)—*', *—B($R_5$)—*', *—P($R_5$)—*', *—C($R_{5a}$)($R_{5b}$)—*', *—Si($R_{5a}$)($R_{5b}$)—*', *—Ge($R_{5a}$)($R_{5b}$)—*', *—S—*', *—Se—*', *—O—*', *—C(=O)—*', *—S(=O)—*', *—S(=O)$_2$—*', *—C($R_5$)=*', *=C($R_5$)—*', *—C($R_{5a}$)=C($R_{5b}$)—*', *—C(=S)—*', and *—C≡C—*', $T_2$ may be a single bond, a double bond, *—N($R_6$)—*', *—B($R_6$)—*', *—P($R_6$)—*', *—C($R_{6a}$)($R_{6b}$)—*', *—Si($R_{6a}$)($R_{6b}$)—*', *—Ge($R_{6a}$)($R_{6b}$)—*', *—S—*', *—Se—*', *—O—*', *—C(=O)—*', *—S(=O)—*', *—S(=O)$_2$-*', *—C($R_6$)=*', *=C($R_6$)—*', *—C($R_{6a}$)=C($R_{6b}$)—*', *—C(=S)—*', and *—C≡C—*', $T_3$ may be a single bond, a double bond, *—N($R_7$)—*', *—B($R_7$)—*', *—P($R_7$)—*', *—C($R_{7a}$)($R_{7b}$)—*', *—Si($R_{7a}$)($R_{7b}$)—*', *—Ge($R_{7a}$)($R_{7b}$)—*', *—S—*', *—Se—*', *—O—*', *—C(=O)—*', *—S(=O)—*', *—S(=O)$_2$-*', *—C($R_7$)=*', *=C($R_7$)—*', *—C($R_{7a}$)=C($R_{7b}$)—*', *—C(=S)—*', and *—C≡C—*', ring $CY_1$ to ring $CY_4$, ring $CY_{51}$ to ring $CY_{53}$, ring $CY_{71}$, and ring $CY_{72}$ may each independently be selected from a $C_5$-$C_{30}$ carbocyclic group and a $C_1$-$C_{30}$ heterocyclic group, $L_{51}$ to $L_{53}$ may each independently be selected from a substituted or unsubstituted $C_5$-$C_{30}$ carbocyclic group and a substituted or unsubstituted $C_1$-$C_{30}$ heterocyclic group, a bond between $L_{51}$ and ring $CY_{51}$, a bond between $L_{52}$ and ring $CY_{52}$, a bond between $L_{53}$ and ring $CY_{53}$, a bond between two or more $L_{51}$(S), a bond between two or more $L_{52}$(s), a bond between two or more $L_{53}$(s), a bond between $L_{51}$ and carbon between $X_{54}$ and $X_{55}$ in Formula 2, a bond between $L_{52}$ and carbon between $X_{54}$ and $X_{56}$ in Formula 2, and a bond between $L_{53}$ and carbon between $X_{55}$ and $X_{56}$ in Formula 2 may each be a carbon-carbon single bond, b51 to b53 may each independently be an integer of 0 to 5, wherein, when b51 is 0, *-$(L_{51})_{b51}$-*' may be a single bond, when b52 is 0, *-$(L_{52})_{b52}$-*' may be a single bond, and when b53 is 0, *-$(L_{53})_{b53}$-*' may be a single bond, $X_{54}$ may be N or C($R_{54}$), $X_{55}$ may be N or C($R_{55}$), $X_{56}$ may be N or C($R_{56}$), and at least one selected from $X_{54}$ to $X_{56}$ may be N, $X_{81}$ may be a single bond, O, S, N($R_{81}$), B($R_{81}$), C($R_{81a}$)($R_{81b}$), or Si($R_{81a}$)($R_{81b}$), $R_1$ to $R_7$, $R_{5a}$, $R_{5b}$, $R_{6a}$, $R_{6b}$, $R_{7a}$, $R_{7b}$, R', R", $R_{51}$ to $R_{56}$, $R_{71}$, $R_{72}$, $R_{81}$, $R_{81a}$, and $R_{81b}$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), and a bidentate organic ligand, a1 to a4, a51 to a53, a71, and a72 may each independently be an integer of 0 to 20, i) two groups selected from $R_1$(s) in the number of a1, ii) two groups selected from $R_2$(s) in the number of a2, iii) two groups selected from $R_3$(s) in the number of a3, iv) two groups selected from $R_4$(s) in the number of a4, v) $R_{5a}$ and $R_{5b}$, vi) $R_{6a}$ and $R_{6b}$, vii) $R_{7a}$ and $R_{7b}$, and viii) two groups selected from $R_1$ to $R_7$, $R_{5a}$, $R_{5b}$, $R_{6a}$, $R_{6b}$, $R_{7a}$, $R_{7b}$, R', and R" may optionally be linked via a single bond, a double bond, or a first linking group to form a $C_5$-$C_{30}$ carbocyclic group that is unsubstituted or substituted with at least one $R_{10a}$ or a $C_1$-Coo heterocyclic group that is unsubstituted or substituted with at least one $R_{10a}$, $R_{10a}$ may be the same as defined in connection with $R_1$,

* and *' each indicate a binding site to a neighboring atom, at least one substituent of the substituted $C_5$-$C_{30}$ carbocyclic group, the substituted $C_1$-Coo heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_1$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —O($Q_{11}$), —S($Q_{11}$), —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, -Q($Q_{21}$), —S($Q_{21}$), —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)$_2$($Q_{21}$) and P(=O)($Q_{21}$)($Q_{22}$); and —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), P($Q_{31}$)($Q_{32}$), —C(=O)($Q_{31}$), —S(=O)$_2$($Q_{31}$), and —P(=O)($Q_{31}$)($O_{32}$), and $Q_1$ to $Q_3$, $Q_{11}$ to $O_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, a cyano group, a $C_1$-$C_{60}$ alkyl group, a phenyl group, and a biphenyl group, and a $C_6$-$C_{60}$ aryl group substituted with at least one selected from deuterium, —F, a cyano group, a —$C_1$ C alkyl$_{10}$ group, a phenyl group, and a biphenyl group.

Another aspect of an embodiment provides an organic light-emitting device including:

a first electrode;

a second electrode facing the first electrode; and an emission layer disposed between the first electrode and the second electrode, wherein the emission layer includes a first compound, a second compound, and a third compound, the first compound, the second compound, and the third compound are different from one another, an amount of the first compound is smaller than a total amount of the second compound and the third compound, the first compound is an iridium (Ir)-free organometallic compound, the second compound includes at least one group selected from a pyridine group, a pyrimidine group, a pyridazine group, a pyrazine group, a triazine group, and a tetrazine group, the first compound and the second compound form an exciplex, a decay time of delayed fluorescence in a time-resolved electroluminescence (TREL) spectrum of the organic light-emitting device is about 50 ns or more.

Another aspect of an embodiment provides an electronic apparatus including the organic light-emitting device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
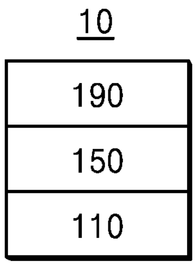
FIGS. 1-4 are schematic views of organic light-emitting devices.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

An organic light-emitting device according to an embodiment may include a first electrode, a second electrode facing the first electrode, and an emission layer disposed between the first electrode and the second electrode.

The emission layer may include a first compound, a second compound, and a third compound. The first compound, the second compound, and the third compound may be different from one another, wherein the first compound may be represented by Formula 1, the second compound may be represented by Formula 2, and the third compound may include a group represented by Formula 3.

Formula 1

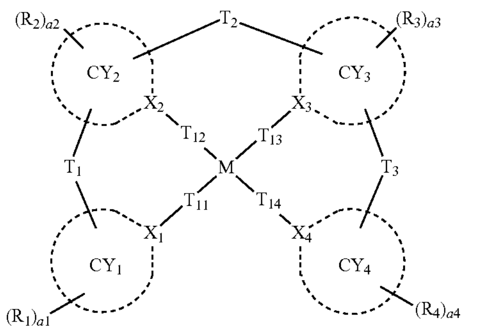

Formula 2

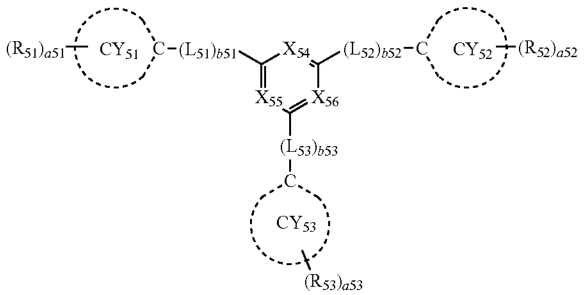

-continued

Formula 3

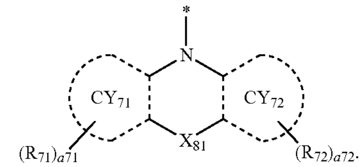

M in Formula 1 may be a transition metal, but may not be iridium (Ir).

For example, M may be titanium (Ti), cobalt (Co), copper (Cu), zinc (Zn), zirconium (Zr), ruthenium (Ru), rhodium (Rh), palladium (Pd), platinum (Pt), gold (Au), osmium (Os), or rhenium (Re).

For example, M in Formula 1 may be Pt, Pd, or Au, but embodiments of the present disclosure are not limited thereto.

$X_1$ to $X_4$ in Formula 1 may each independently be N or C.

For example, in Formula 1, $X_1$ may be N, and $X_2$ to $X_4$ may each be C;

$X_1$ and $X_4$ may each be N, and $X_2$ and $X_3$ may each be C;

$X_1$ to $X_4$ may each be C; or $X_1$ to $X_5$ may each be C, and $X_4$ may be N, but embodiments of the present disclosure are not limited thereto.

In Formula 1, $T_{11}$ to $T_{14}$ may each independently be a chemical bond, O, S, B(R'), N(R'), P(R'), C(R')(R"), Si(R')(R"), Ge(R')(R"), C(=O), B(R')(R"), N(R')(R"), or P(R')(R"), wherein, when $T_{11}$ is the chemical bond, $X_1$ and M may be directly bound, when $T_{12}$ is the chemical bond, $X_2$ and M may be directly bound, when $T_{13}$ is the chemical bond, $X_3$ and M may be directly bound, and when $T_{14}$ is the chemical bond, $X_4$ and M may be directly bound.

For example, $T_{11}$ to $T_{14}$ in Formula 1 may each be a chemical bond.

In Formula 1, two bonds selected from a bond between $X_1$ or $T_{11}$ and M, a bond between $X_2$ or $T_{12}$ and M, a bond between $X_3$ or $T_{13}$ and M, and a bond between $X_4$ or $T_{14}$ and M may each be a coordinate bond (e.g., a coordinate covalent bond), and the others thereof may each be a covalent bond (e.g., a covalent single bond, which may be referred to herein as a single bond). Therefore, the first compound represented by Formula 1 may be electrically neutral.

For example, in Formula 1, $T_{11}$ to $T_{14}$ may each be a chemical bond, a bond between $X_1$ and M and a bond between $X_4$ and M may each be a coordinate bond (e.g., a coordinate covalent bond or dative bond), and a bond between $X_2$ and M and a bond between $X_3$ and M may each be a covalent bond (e.g., a covalent single bond, which may be referred to herein as a single bond).

In one embodiment, in Formula 1, $T_{11}$ to $T_{14}$ may each be a chemical bond, a bond between $X_1$ and M and a bond between $X_4$ and M may each be a coordinate bond (e.g., a coordinate covalent bond), and at least one of $X_1$ and $X_4$ may be C, but embodiments of the present disclosure are not limited thereto.

In Formula 1, $T_1$ may be selected from a single bond, a double bond, $*-N(R_5)-*'$, $*-B(R_5)-*'$, $*-P(R_5)-*'$, $*-C(R_{5a})(R_{5b})-*'$, $*-Si(R_{5a})(R_{5b})-*'$, $*-Ge(R_{5a})(R_{5b})-*'$, $*-S-*'$, $-S-'$, $*-O-*'$, $*-C(=O)-*'$, $*-S(=O)-*'$, $*-S(=O)_2-*'$, $*-C(R_5)=*'$, $*=C(R_5)-*'$, $*-C(R_{5a})=C(R_{5b})-*'$, $*-C(=S)-*'$, and $*-C\equiv C*$, $T_2$ may be selected from a single bond, a double bond, *—N($R_6$)—*', *—B($R_6$)—*', *—P($R_6$)—*', *—C($R_{6a}$)($R_{6b}$)—*', *—Si($R_{6a}$)($R_{6b}$)—*', *—Ge($R_{6a}$)($R_{6b}$)—*', *—S—*', *—Se*, *—O—*', *—C(=O)—*', *—S(=O)—*', *—S(=O)$_2$—*', *—C($R_6$)=*', *=C($R_6$)—*', *—C($R_{6a}$)=C($R_{6b}$)—*', *—C(=S)—*', and *—C≡C*', and $T_3$ may be selected from a single bond, a double bond, *—N($R_7$)—*', *—B($R_7$)—*, *—P($R_7$)—*', *—C($R_{7a}$)($R_{7b}$)—*', *—Si($R_{7a}$)($R_{7b}$)—*', *—Ge($R_{7a}$)($R_{7b}$)—*', *—S—*', —Se—*', *—O—*', *—C(=O)—*', *—S(=O)—*', *—S(=O)$_2$—*', *—C($R_7$)=*', *=C($R_7$)—*', *—C($R_{7a}$)=C($R_{7b}$)—*', *—C(=S)—*', and *—C≡C*.

For example, $T_1$ in Formula 1 may be a single bond, *—N($R_5$)—*', *—C($R_{5a}$)($R_{5b}$)—*', *—Si($R_{5a}$)($R_{5b}$)—*', *—S—*', or *—O—*', $T_2$ in Formula 1 may be *—N($R_6$)—*', *—C($R_{6a}$)($R_{6b}$)—*', *—Si($R_{6a}$)($R_{6b}$)—*', *—S—*', or *—O—*', and $T_3$ in Formula 1 may be a single bond, but embodiments of the present disclosure are not limited thereto.

In Formulae 1 to 3, ring $CY_1$ to ring $CY_4$, ring $CY_{51}$ to ring $CY_{53}$, and ring $CY_{71}$ and ring $CY_{72}$ may each independently be selected from a $C_5$-$C_{30}$ carbocyclic group and a $C_1$-$C_{30}$ heterocyclic group.

For example, in Formulae 1 to 3, ring $CY_1$ to ring $CY_4$, ring $CY_{51}$ to ring $CY_{53}$, ring $CY_{71}$, and ring $CY_{72}$ may each independently be i) first ring, ii) second ring, iii) a condensed ring in which at least two first rings are condensed (e.g., combined together), iv) a condensed ring in which at least two second rings are condensed (e.g., combined together), or v) a condensed ring in which at least one first ring is condensed with (e.g., combined with) at least one second ring, wherein the first ring may be selected from a cyclopentane group, a cyclopentadiene group, a furan group, a thiophene group, a pyrrolegroup, a silole group, an oxazole group, an isoxazole group, an oxadiazole group, an isoxadiazole group, an oxatriazole group, an isoxatriazole group, a thiazole group, an isothiazole group, a thiadiazole, group an isothiadiazole group, a thiatriazole group, an isothiatriazole group, a pyrazole group, an imidazole group, a triazole group, a tetrazole group, an aza silolegroup, a diazasilole group, and a triazasilole group, and the second ring may be selected from an adamantane group, a norbornane group, a norbornene group, a cyclohexane group, a cyclohexene group, a benzene group, a pyridine group, a pyrimidine group, a pyrazine group, a pyridazine group, a triazine group, an oxasiline group, a thiasiline group, a dihydroazasiline group, a dihydrodisiline group, a dihydrosiline group, a dioxine group, an oxathiine group, an oxazine group, a pyran group, a dithiine group, a thiazine group, a thiopyran group, a cyclohexadiene group, a dihydropyridine group, and a dihydropyrazine group.

For example, in Formula 1 to 3, ring $CY_1$ to ring $CY_4$, ring $CY_{51}$ to $CY_{53}$, ring $CY_{71}$, and ring $CY_{72}$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, afuran group, an indolegroup, a benzoborol group, a benzophosphole group, an indenegroup, a benzosilole group, a benzogermole group, a benzothiophenegroup, a benzoselenophene group, a benzofuran group, a carbazole group, a dibenzoborol group, a dibenzophosphole group, a fluorene group, a dibenzo silolegroup, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborol group, an azabenzophosphol group, an azaindene group, an azabenzo silolegroup, an azabenzogermolegroup, an azabenzothiophene group, an azabenzoselenophenegroup, an azabenzofurangroup, an azacarbazole group, an azadibenzoborol group, an azadibenzophosphole group, an azafluorene group, an azadibenzo silolegroup, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a trazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group, but embodiments of the present disclosure are not limited thereto.

In Formula 2, $L_{51}$ to $L_{53}$ may each independently be selected from a substituted or unsubstituted $C_5$-$C_{30}$ carbocyclic group, and a substituted or unsubstituted $C_1$-$C_{30}$ heterocyclic group.

For example, $L_{51}$ to $L_{53}$ may each independently be selected from:

a benzene group, a naphthalene group, an anthracene group, a phenanthrene group, a triphenylene group, a pyrene group, a chrysene group, a cyclopentadiene group, a furan group, a thiophenegroup, a silolegroup, an indene group, a fluorene group, an indole group, a carbazole group, a benzofuran group, a dibenzofuran group, a benzothiophene group, a dibenzothiophenegroup, a benzosilolegroup, a dibenzosilole group, an azafluorenegroup, an azacarbazole group, an azadibenzofurangroup, an azadibenzothiophene group, an azadibenzo silolegroup, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a trazole group, an oxazole group, an isoxazole group, a thiazole group, an isothiazole group, an oxadiazole group, a thiadiazole group, a benzopyrazole group, a benzimidazole group, a benzoxazole group, a benzothiazolegroup, a benzooxadiazole group, and a benzo thiadiazole group; and a benzene group, a naphthalene group, an anthracene group, a phenanthrene group, a triphenylene group, a pyrene group, a chrysene group, a cyclopentadiene group, a furan group, a thiophenegroup, a silolegroup, an indene group, a fluorene group, an indole group, a carbazole group, a benzofuran group, a dibenzofuran group, a benzothiophene group, a dibenzothiophenegroup, a benzosilolegroup, a dibenzosilole group, an azafluorenegroup, an azacarbazole group, an azadibenzofurangroup, an azadibenzothiophene group, an azadibenzo silolegroup, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, and a benzo thiadiazole group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl (dibenzothienyl) group, a dibenzosilolyl group, a dimethyldibenzosilolyl group, a diphenyldibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ may each independently be selected from hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, and a triazinyl group, but embodiments of the present disclosure are not limited thereto.

In Formula 2, a bond between $L_{51}$ and ring $CY_{51}$, a bond between $L_{52}$ and ring $CY_{52}$, a bond between $L_{53}$ and ring $CY_{55}$, a bond between at least two $L_{51}$(s), a bond between at least two $L_{52}$(s), a bond between at least two $L_{53}$(s), a bond between $L_{51}$ and a carbon atom between $X_{54}$ and $X_{55}$ in Formula 2, a bond between $L_{52}$ and a carbon atom between $X_{54}$ and $X_{56}$ in Formula 2, and a bond between $L_{53}$ and a carbon atom between $X_{55}$ and $X_{56}$ in Formula 2 may each be a "carbon-carbon single bond".

In Formula 2, b51 to b53 indicates the number of $L_{51}$ to $L_{53}$, respectively, and may each independently be an integer of 0 to 5. When b51 is 0, $*-(L_{51})_{b51}-*'$ may be a single bond, when b52 is 0, $*-(L_{52})_{bs2}-*'$ may be a single bond, when b53 is 0, $*-(L_{53})_{ab3}-*$ may be a single bond, when b51 is two or more, two or more $L_{51}$(s) may be identical to or different from each other, when b52 is two or more, two or more $L_{52}$(s) may be identical to or different from each other, when b53 is two or more, two or more $L_3$(s) may be identical to or different from each other. For example, b51 to b53 may each independently be 0, 1, or 2.

In Formula 2, $X_{54}$ may be N or $C(R_{54})$, $X_{55}$ may be N or $C(R_{55})$, and $X_{56}$ may be N or $C(R_{56})$, and at least one selected from $X_{54}$ to $X_{56}$ may be nitrogen atom (N). $R_{54}$ to $R_{56}$ may respectively be the same as defined above.

In Formula 3, $X_{81}$ may be a single bond, O, S, $N(R_{81})$, $B(R_{81})$, $C(R_{81a})(R_{81b})$, or $Si(R_{81a})(R_{81b})$. $R_{81}$, $R_{81a}$, and $R_{81b}$ may respectively be the same as defined above.

$R_1$ to $R_7$, $R_{5a}$, $R_{5b}$, $R_{6a}$, $R_{6a}$, $R_{7a}$, $R_{7b}$, R', R", $R_{51}$ to $R_{56}$, $R_{71}$, $R_{72}$, $R_{81}$, $R_{81a}$, and $R_{81b}$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, —$P(=O)(Q_1)(Q_2)$, and a bidentate organic ligand, wherein $Q_1$ to $Q_3$ may respectively be the same as defined above.

The bidentate organic ligand may be, for example, represented by Formula 93, but embodiments of the present disclosure are not limited thereto:

Formula 93

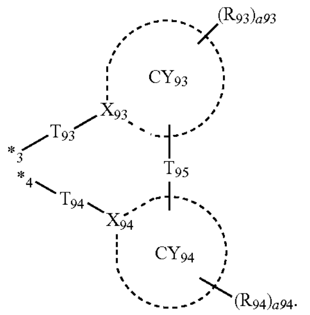

In Formula 93, $X_{93}$, $T_{93}$, ring $CY_{93}$, $R_{93}$, and a93 may respectively be the same as defined in connection with $X_3$, $T_{13}$, ring $CY_3$, $R_3$, and a3, $X_{94}$, $T_{94}$, ring $CY_{94}$, $R_{94}$, and a94 may respectively be the same as defined in connection with $X_4$, $T_{14}$, ring $CY_4$, $R_4$, and a4, $T_{95}$ may be the same as defined in connection with $T_3$, and $*^3$ and $*^4$ each indicate a binding site to a neighboring atom.

For example, in Formula 93, $T_{93}$ may be a chemical bond, ring $CY_{93}$ may be an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, or a tetrazole group, $T_{94}$ may be O, or S, and ring $CY_{94}$ may be a benzene group, a pyridine group, a pyrimidine group, a pyrazine group, a pyridazine group, or a triazine group, but embodiments of the present disclosure are not limited thereto.

In one embodiment, in Formula 1, $T_2$ may be $*$—$N(R_6)$—$*'$, $*$—$B(R_6)$—$*'$, or $*$—$P(R_6)$—$*'$, and $R_6$ may be a bidentate organic ligand as described above, but embodiments of the present disclosure are not limited thereto.

For example, $R_1$ to $R_7$, $R_{5a}$, $R_{5b}$, $R_{6a}$, $R_{6b}$, $R_{7a}$, $R_{7b}$, R', R", $R_{51}$ to $R_{56}$, $R_{71}$, $R_{72}$, $R_{81}$, $R_{81a}$, $R_{81b}$, and $R_{10a}$ may each independently be selected from:

hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a —$C_1C$ $alkyl_{10}$ group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl (thienyl) group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl (benzothienyl) group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, and a group represented by Formula 91;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, and a group represented by Formula 91, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, and —$P(=O)(Q_{31})(Q_{32})$; and —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, —$P(=O)(Q_1)(Q_2)$, and a bidentate organic ligand represented by Formula 93, and $Q_1$ to $Q_3$ and $Q_{31}$ to $Q_{33}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, and a triazinyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, and a triazinyl group, each substituted with at least one selected from deuterium, a —$C_1C$ $alkyl_{10}$ group, a phenyl group, a biphenyl group, a pyrdinyl group, a pyrimidinyl group, a pyridazinyl group, a pyrazinyl group, and a triazinyl group, but embodiments of the present disclosure are not limited thereto:

Formula 91

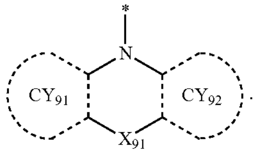

In Formula 91, ring $CY_{91}$ and ring $CY_{92}$ may each independently be selected from a $C_5$-$C_{30}$ carbocyclic group and a $C_1$-$C_{30}$ heterocyclic group, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ may respectively be the same as defined in connection with $R_{81}$, $R_{81a}$, and $R_{81b}$, and

* indicates a binding site to a neighboring atom.

For example, in Formula 91, ring $CY_{91}$ and ring $CY_{92}$ may each independently be selected from a benzene group, a pyridine group, a pyrimidine group, a pyrazine group, a pyridazine group, and a triazine group, $R_{91}$, $R_{91a}$, and $R_{91b}$ may each independently be selected from:

hydrogen and a —$C_1$C alkyl$_{10}$ group;

a phenyl group, a biphenyl group, a pyridinyl group, a pyrimidinyl group, a pyridazinyl group, a pyrazinyl group, and a triazinyl group; and a phenyl group, a pyridinyl group, a pyrimidinyl group, a pyridazinyl group, a pyrazinyl group, and a triazinyl group, each substituted with at least one selected from deuterium, a —$C_1$C alkyl$_{10}$ group, a phenyl group, a biphenyl group, a pyridinyl group, a pyrimidinyl group, a pyridazinyl group, a pyrazinyl group, and a triazinyl group;

but embodiments of the present disclosure are not limited thereto.

In one or more embodiments, $R_1$ to $R_7$, $R_{5a}$, $R_{5b}$, $R_{6a}$, $R_{6b}$, $R_{7a}$, $R_{7b}$, R', R", $R_{51}$ to $R_{56}$, $R_{71}$, $R_{72}$, $R_{81}$, $R_{81a}$, $R_{81b}$ and $R_{10a}$ may each independently be selected from hydrogen, deuterium, —F, a cyano group, a nitro group, —$CH_3$, —$CD_3$, —$CD_2H$, —$CDH_2$, —$CF_3$, —$CF_2H$, —$CFH_2$, groups represented by Formulae 9-1 to 9-19, groups represented by Formulae 10-1 to 10-243, —$C(Q_1)(Q_2)(Q_3)$, —$Si(Q_1)(Q_2)(Q_3)$, —$P(=O)(Q_1)(Q_2)$ (wherein $Q_1$ to $Q_3$ may respectively be the same as defined above), and a bidentate organic ligand represented by Formula 93, but embodiments of the present disclosure are not limited thereto:

9-1

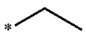

9-2

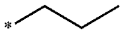

9-3

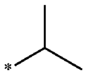

9-4

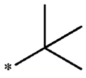

9-5

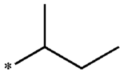

-continued 9-6

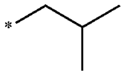

9-7

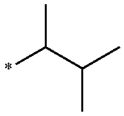

9-8

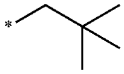

9-9

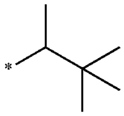

9-10

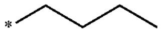

9-11

9-12

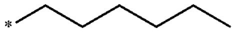

9-13

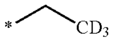

9-14

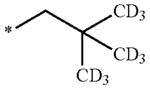

9-15

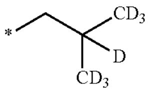

9-16

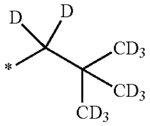

9-17

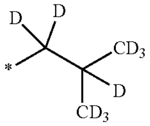

9-18

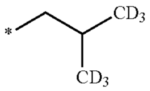

9-19

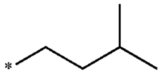

10-1

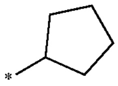

10-2

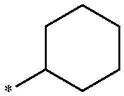

-continued
10-3
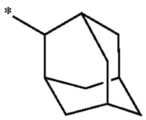
10-4
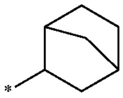
10-5
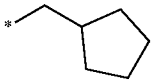
10-6
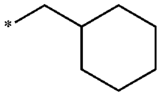
10-7
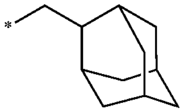
10-8
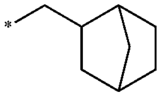
10-9
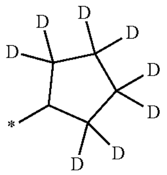
10-10
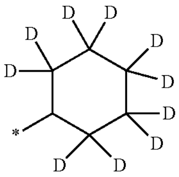
10-11
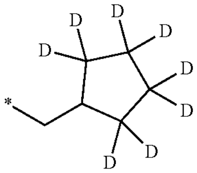
10-12
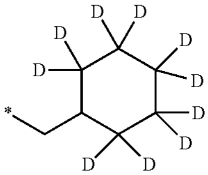
10-13
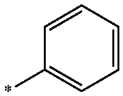
-continued
10-14
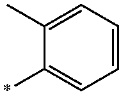
10-15
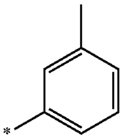
10-16
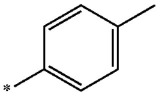
10-17
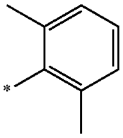
10-18
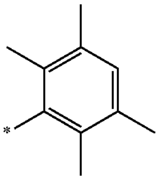
10-19
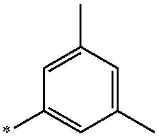
10-20
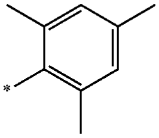
10-21
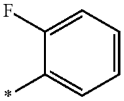
10-22
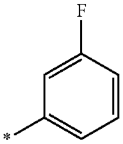
10-23
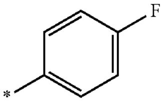
10-24
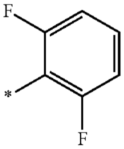

-continued
10-25
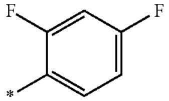
10-26
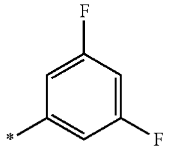
10-27
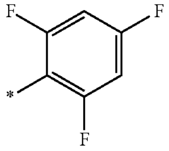
10-28
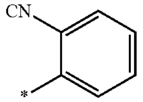
10-29
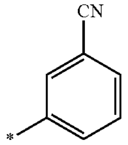
10-30
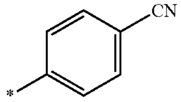
10-31
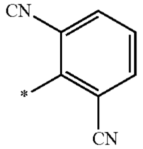
10-32
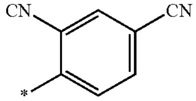
10-33
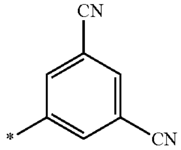
10-34
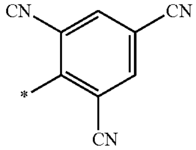
10-35
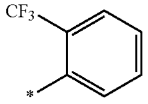
-continued
10-36
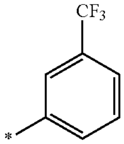
10-37
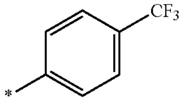
10-38
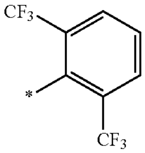
10-39
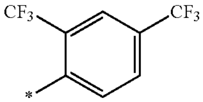
10-40
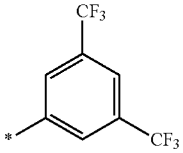
10-41
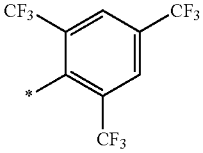
10-42
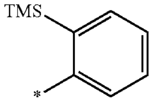
10-43
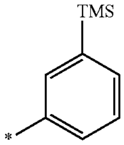
10-44
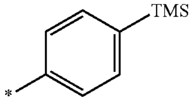
10-45
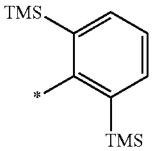
10-46
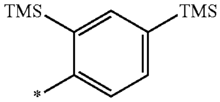

-continued
10-47
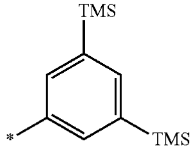
10-48
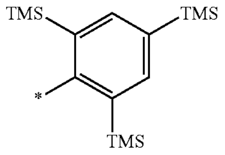
10-49
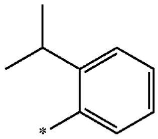
10-50
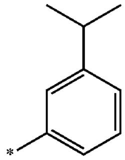
10-51
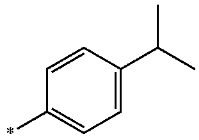
10-52
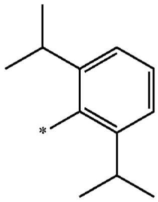
10-53
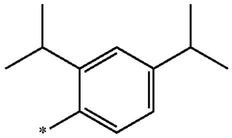
10-54
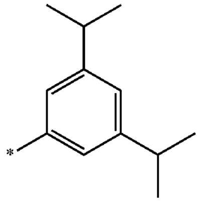
10-55
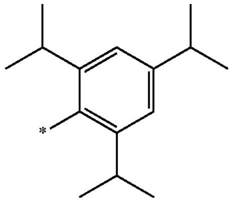
-continued
10-56
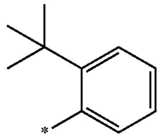
10-57
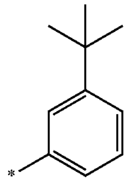
10-58
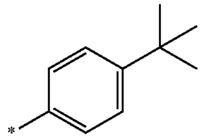
10-59
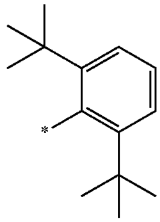
10-60
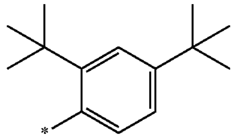
10-61
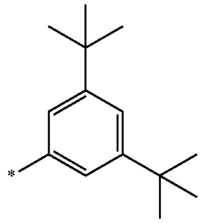
10-62
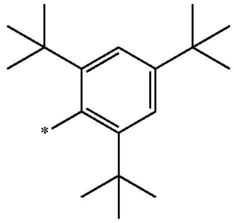
10-63
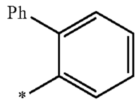
10-64
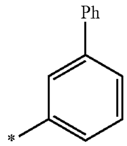

-continued
10-65
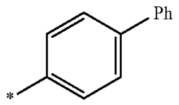
10-66
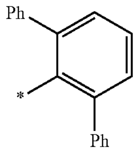
10-67
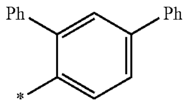
10-68
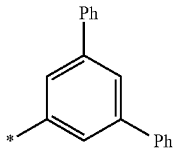
10-69
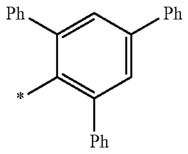
10-70
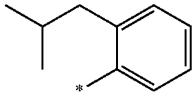
10-71
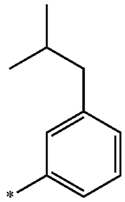
10-72
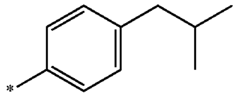
10-73
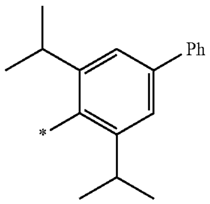
10-74
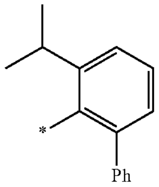
-continued
10-75
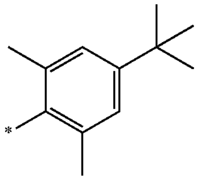
10-76
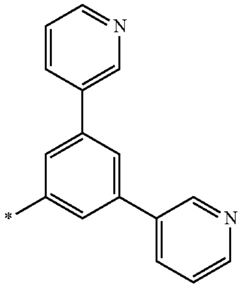
10-77
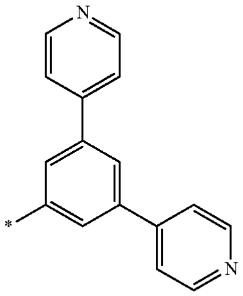
10-78
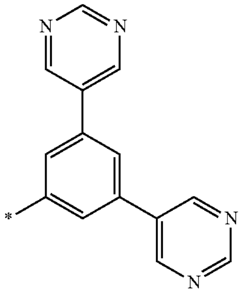
10-79
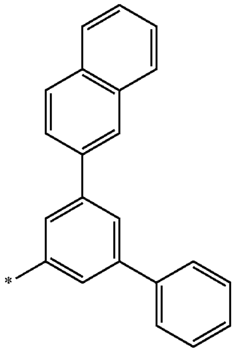

-continued
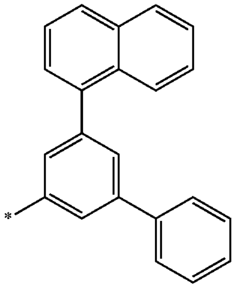
10-80
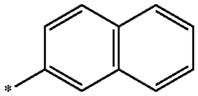
10-81
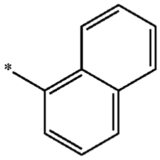
10-82
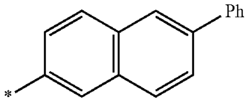
10-83
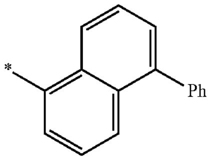
10-84
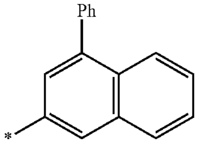
10-85
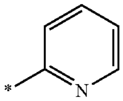
10-86
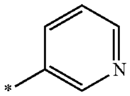
10-87
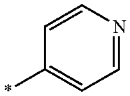
10-88
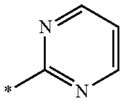
10-89
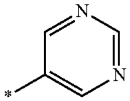
10-90
-continued
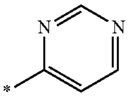
10-91
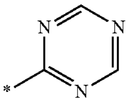
10-92
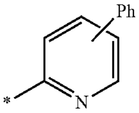
10-93
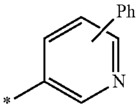
10-94
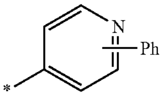
10-95
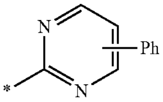
10-96
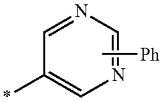
10-97
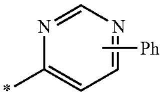
10-98
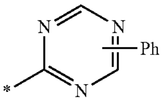
10-99
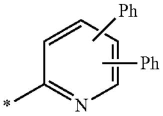
10-100
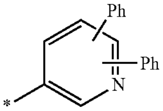
10-101
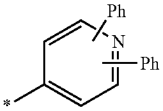
10-102
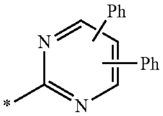
10-103

-continued
10-104
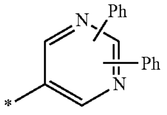
10-105
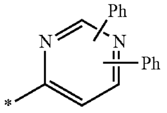
10-106
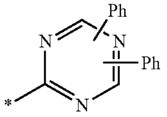
10-107
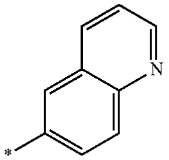
10-108
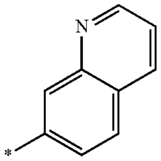
10-109
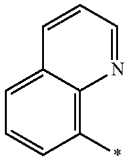
10-110
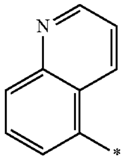
10-111
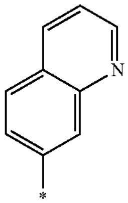
10-112
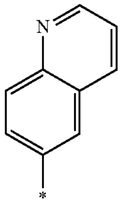
-continued
10-113
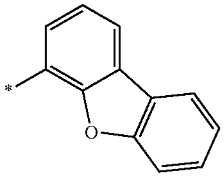
10-114
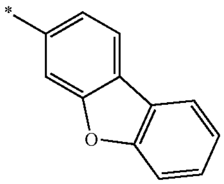
10-115
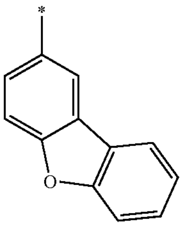
10-116
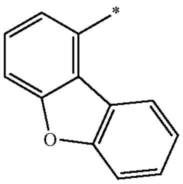
10-117
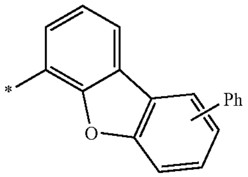
10-118
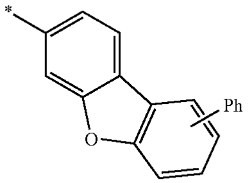
10-119
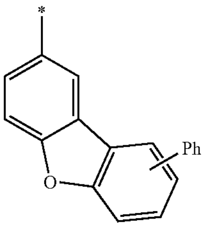
10-120
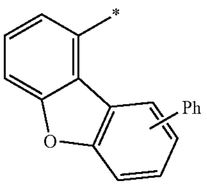

-continued
10-121
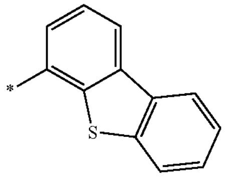
10-122
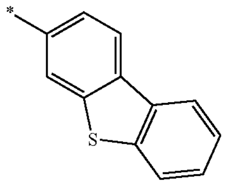
10-123
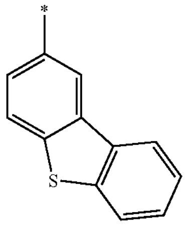
10-124
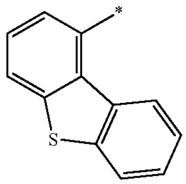
10-125
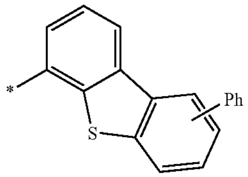
10-126
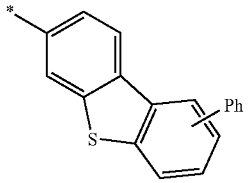
10-127
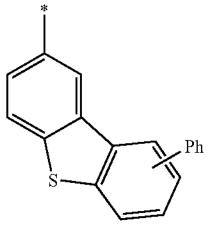
10-128
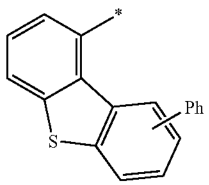
-continued
10-129
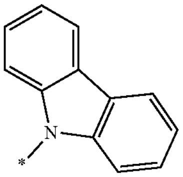
10-130
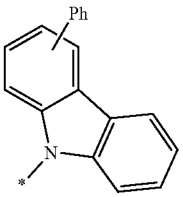
10-131
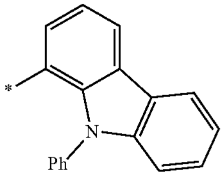
10-132
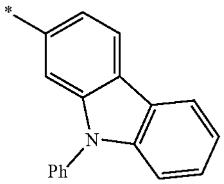
10-133
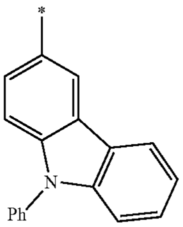
10-134
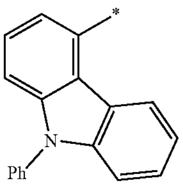
10-135
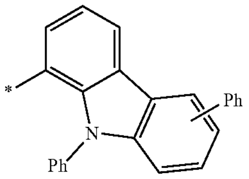
10-136
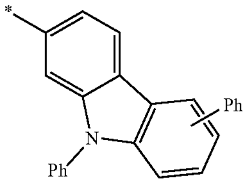

-continued
10-137
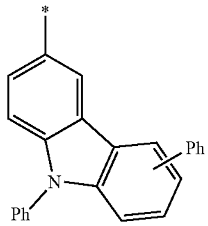
10-138
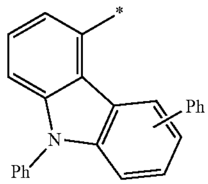
10-139
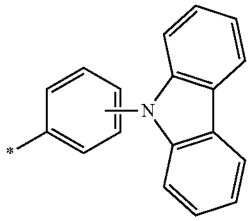
10-140
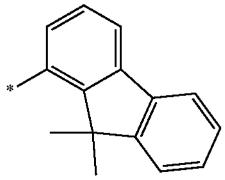
10-141
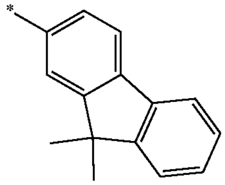
10-142
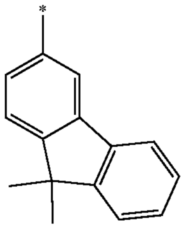
10-143
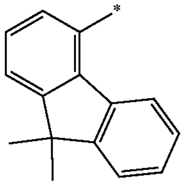
-continued
10-144
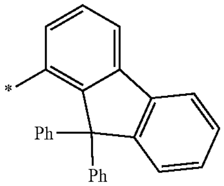
10-145
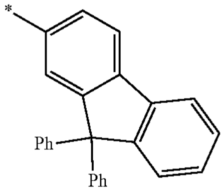
10-146
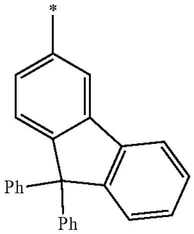
10-147
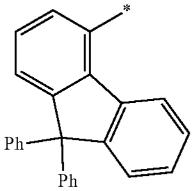
10-148
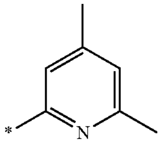
10-149
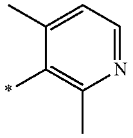
10-150
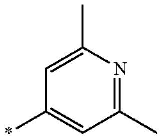
10-151
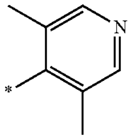
10-152
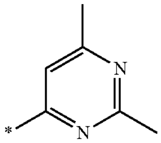

-continued
10-153
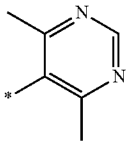
10-154
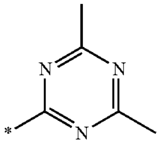
10-155
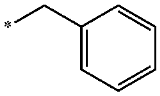
10-156
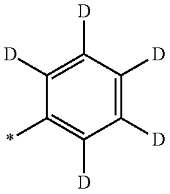
10-157
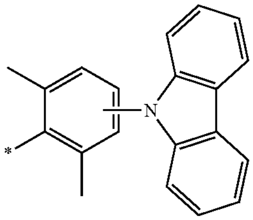
10-158
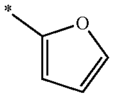
10-159
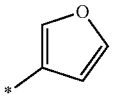
10-160
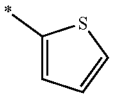
10-161
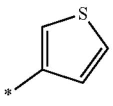
10-162
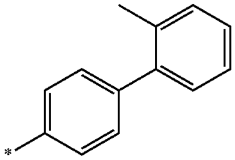
-continued
10-163
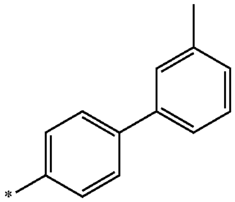
10-164
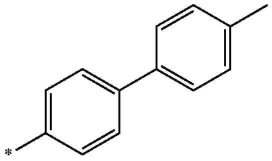
10-165
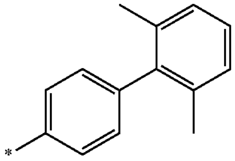
10-166
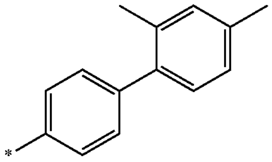
10-167
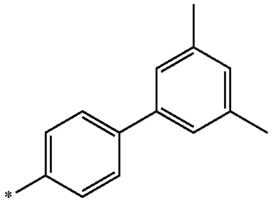
10-168
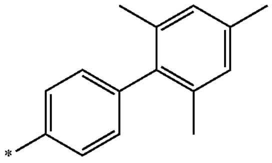
10-169
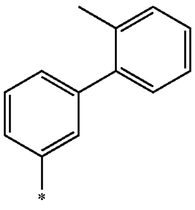
10-170
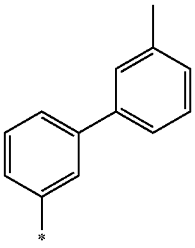

-continued
10-171
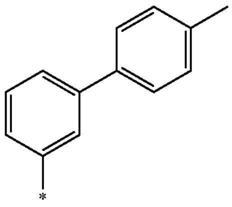
10-172
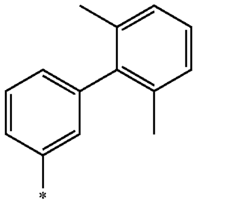
10-173
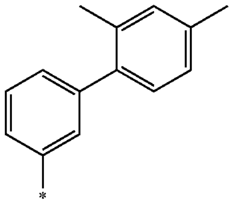
10-174
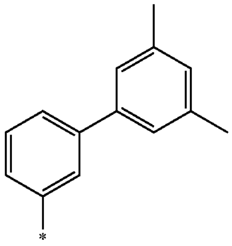
10-175
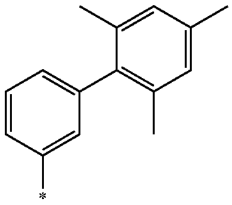
10-176
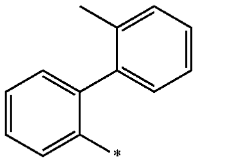
10-177
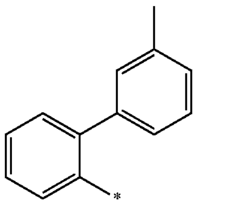
-continued
10-178
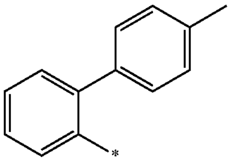
10-179
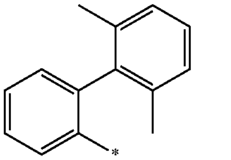
10-180
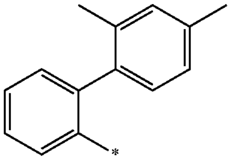
10-181
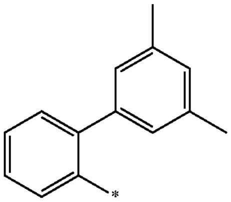
10-182
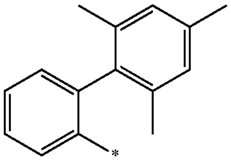
10-183
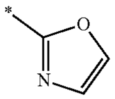
10-184
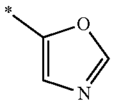
10-185
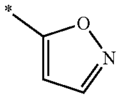
10-186
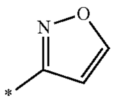
10-187
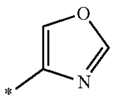
10-188
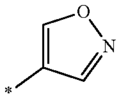

-continued
10-189
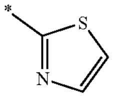
10-190
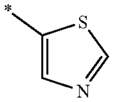
10-191
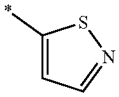
10-192
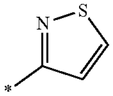
10-193
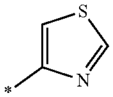
10-194
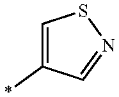
10-195
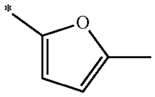
10-196
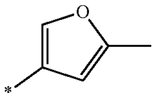
10-197
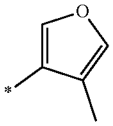
10-198
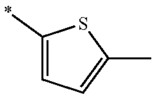
10-199
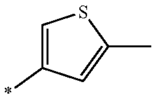
10-200
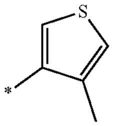
10-201
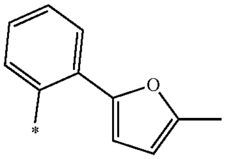
-continued
10-202
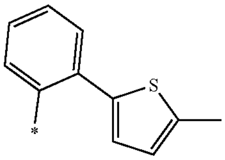
10-203
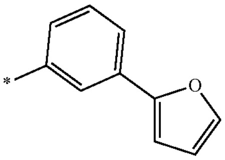
10-204
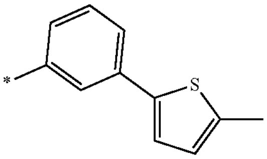
10-205
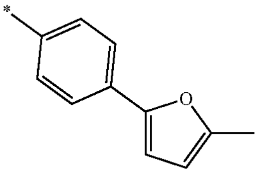
10-206
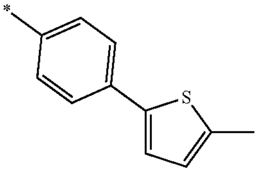
10-207
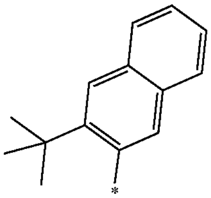
10-208
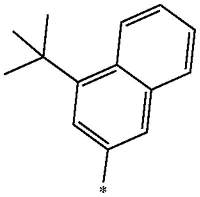
10-209
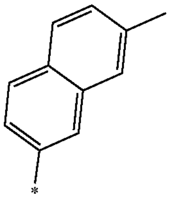

-continued
10-210
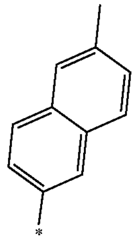
10-211
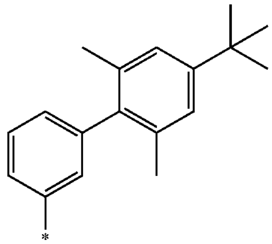
10-212
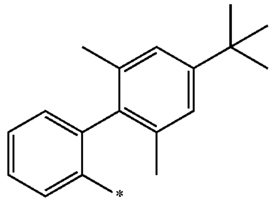
10-213
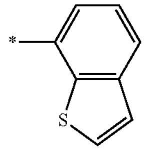
10-214
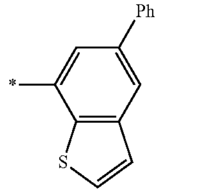
10-215
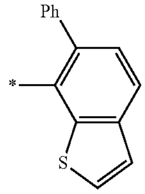
10-216
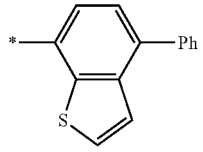
-continued
10-217
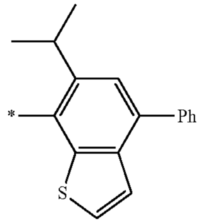
10-218
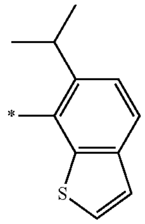
10-219
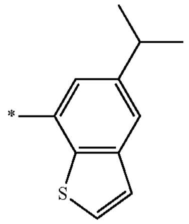
10-220
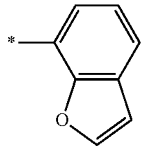
10-221
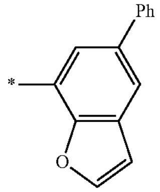
10-222
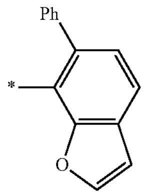
10-223
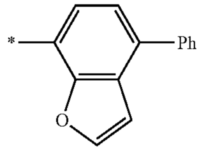

-continued
10-224
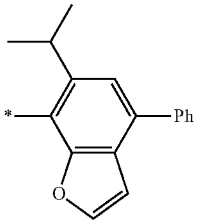
10-225
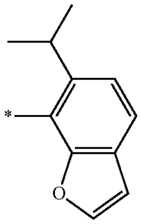
10-226
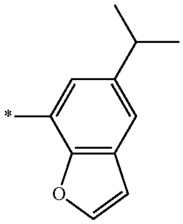
10-227
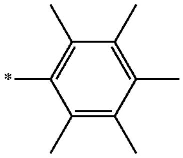
10-228
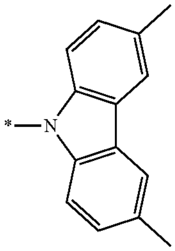
10-229
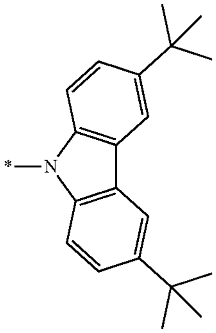
-continued
10-230
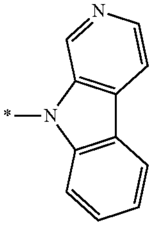
10-231
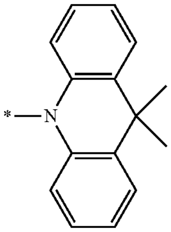
10-232
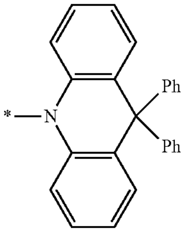
10-233
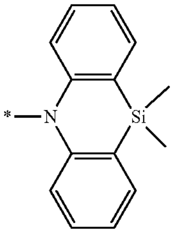
10-234
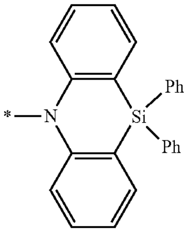
10-235
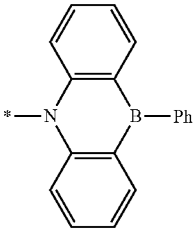
10-236
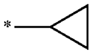

-continued 10-237

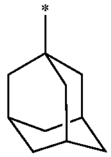

10-238

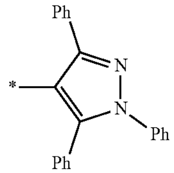

10-239

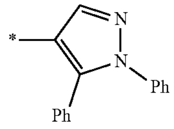

10-240

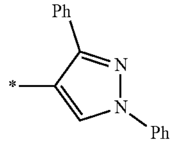

10-241

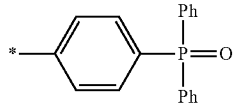

10-242

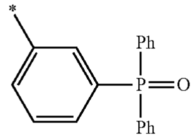

10-243

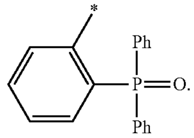

In Formulae 9-1 to 9-19 and 10-1 to 10-243, * indicates a binding site to a neighboring atom, Ph indicates a phenyl group, and TMS indicates a trimethylsilyl group.

$R_1$ to $R_4$, $R_{5a}$, $R_{5b}$, $R_{6a}$, $R_{6a}$, $R_{7a}$, $R_{7b}$, R', R", $R_{51}$ to $R_{56}$, $R_{71}$, $R_{72}$, $R_{81}$, $R_{81a}$, $R_{81b}$, and $R_{10a}$ may not be the bidentate organic ligand.

a1 to a4, a51 to a53, a71, and a72 respectively indicate the number of $R_1$(s) to $R_4$(s), $R_{51}$(s) to $R_{53}$(s), $R_{71}$(s), and $R_{72}$(s), and may each independently be an integer of 0 to 20 (for example, an integer of 0 to 5). When a1 is two or more, two or more $R_1$(s) may be identical to or different from each other, and the same applies to a2 to a4, a51 to a53, a71 and a72 and $R_2$ to $R_4$, $R_{51}$ to $R_{53}$, $R_{71}$, and $R_{72}$.

In Formula 1, i) two groups selected from $R_1$(s) in the number of a1, ii) two groups selected from $R_2$(s) in the number of a2, iii) two groups selected from $R_3$(s) in the number of a3, iv) two groups selected from $R_4$(s) in the number of a4, v) $R_{5a}$ and $R_{5b}$, vi) $R_{6a}$ and $R_{6b}$, vii) $R_{7a}$ and $R_{7b}$, and viii) two groups selected from $R_1$ to $R_7$, $R_{5a}$, $R_{5b}$, $R_{6a}$, $R_{6b}$, $R_{7a}$, $R_{7b}$, R', and R" may optionally be linked via a single bond, a double bond, or a first linking group to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. $R_{10a}$ may be the same as defined in connection with $R_1$. The first linking group may be selected from *—N($R_{95}$)—*', *—B($R_{95}$)—*', *—P($R_{95}$)—*', *—C($R_{95a}$)($R_{95b}$)—*', *—Si($R_{95a}$)($R_{95b}$)—*', *—Ge($R_{95a}$)($R_{95b}$)—*', *—S—*', *—Se*', *—O—*', *—C(═O)—*', *—S(═O)—*', *—S(═O)$_2$—*', *—C($R_{95}$)=*', *═C($R_{95}$)—*', *—C($R_{95a}$)═C($R_{95b}$)—*', *—C(═S)—*', and *—C≡C—*, and $R_{95}$, $R_{95a}$, and $R_{95b}$ may respectively be the same as defined in connection with $R_1$. The "$C_5$-$C_{30}$ carbocyclic group" and the "$C_1$-$C_{30}$ heterocyclic group" may respectively be the same as defined in connection with ring $CY_1$.

In one embodiment, a moiety represented by

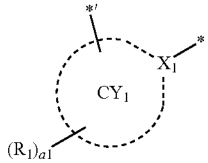

in Formula 1 may be selected from groups represented by Formulae A1-1(1) to A1-1(49):

A1-1(1)

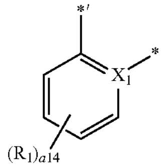

A1-1(2)

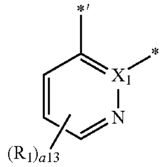

A1-1(3)

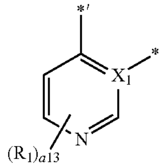

A1-1(4)

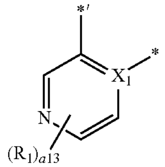

A1-1(5)

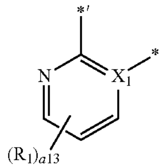

-continued
A1-1(6)
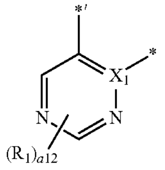
A1-1(7)
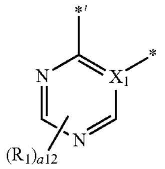
A1-1(8)
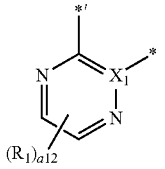
A1-1(9)
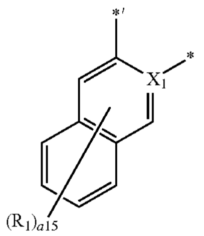
A1-1(10)
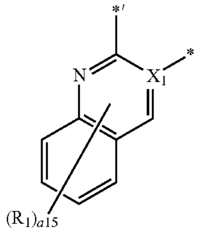
A1-1(11)
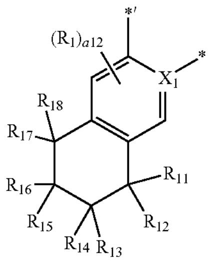
A1-1(12)
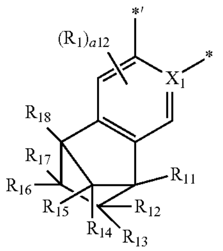
-continued
A1-1(13)
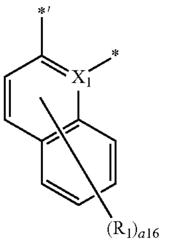
A1-1(14)
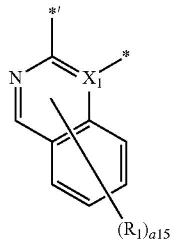
A1-1(15)
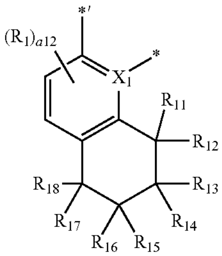
A1-1(16)
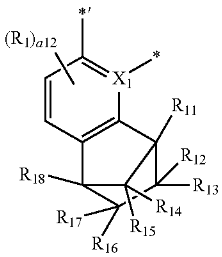
A1-1(17)
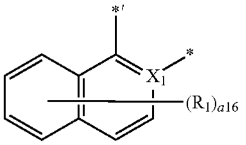
A1-1(18)
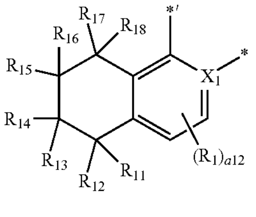
A1-1(19)
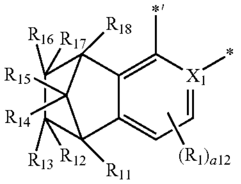

-continued
A1-1(20)
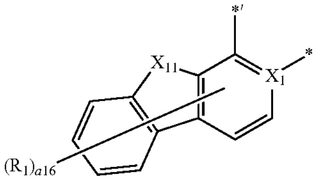
A1-1(21)
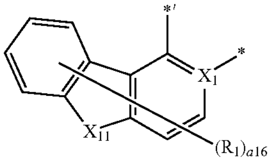
A1-1(22)
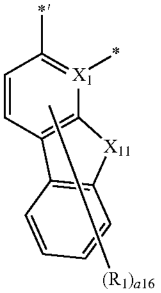
A1-1(23)
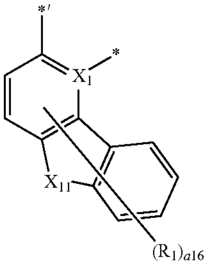
A1-1(24)
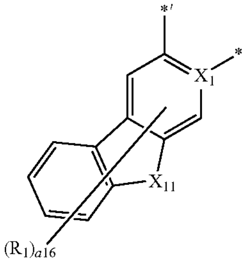
A1-1(25)
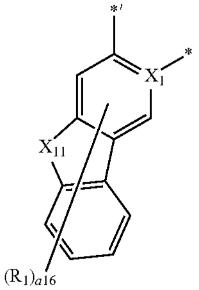
A1-1(26)
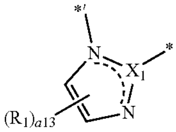
-continued
A1-1(27)
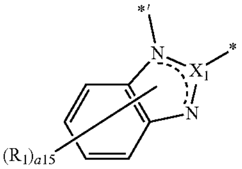
A1-1(28)
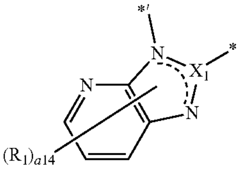
A1-1(29)
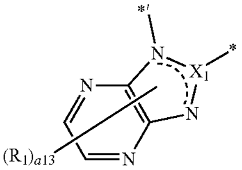
A1-1(30)
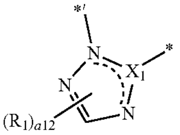
A1-1(31)
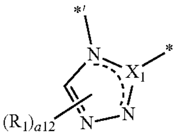
A1-1(32)
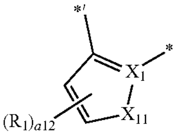
A1-1(33)
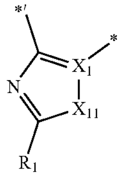
A1-1(34)
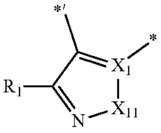
A1-1(35)
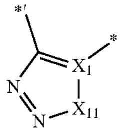
A1-1(36)
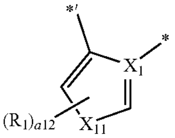

-continued

A1-1(37)

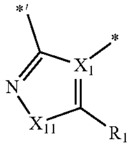

A1-1(38)

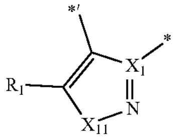

A1-1(39)

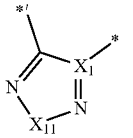

A1-1(40)

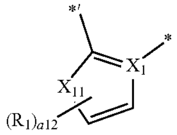

A1-1(41)

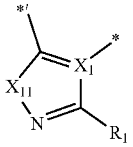

A1-1(42)

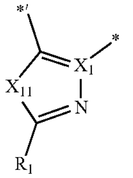

A1-1(43)

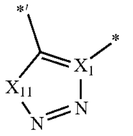

A1-1(44)

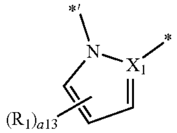

A1-1(45)

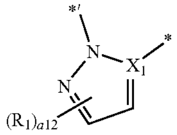

A1-1(46)

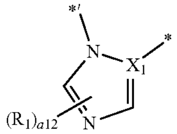

-continued

A1-1(47)

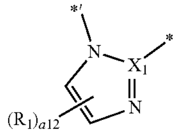

A1-1(48)

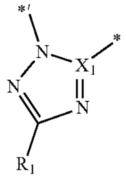

A1-1(49)

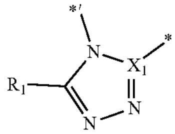

In Formulae A1-1(1) to A1-1(49), $X_1$ and R, may respectively be the same as defined herein, $X_{11}$ may be O, S, $C(R_{11})(R_{12})$, $Si(R_{11})(R_{12})$, or $N(R_{11})$, $X_{11}$ to $X_{18}$ may respectively be the same as defined in connection with $R_1$, a16 may be an integer of 0 to 6, a15 may be an integer of 0 to 5, a14 may be an integer of 0 to 4, a13 may be an integer of 0 to 3, a12 may be an integer of 0 to 2, a indicates a binding site to $T_{11}$ or M in Formula 1, and

* indicates a binding site to $T_1$ in Formula 1.

In one or more embodiments, a moiety represented by

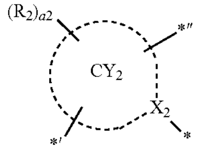

in Formula 1 may be selected from groups represented by Formulae A2-1(1) to A2-1(17) and A2-2(1) to A2-2(7):

A2-1(1)

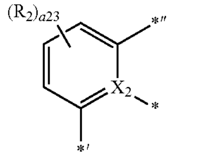

A2-1(2)

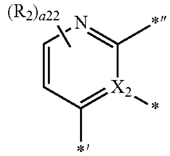

-continued
A2-1(3)
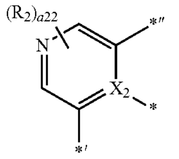
A2-1(4)
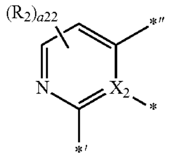
A2-1(5)
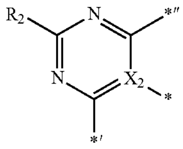
A2-1(6)
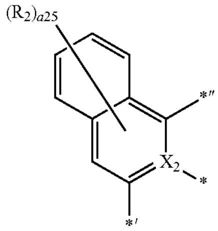
A2-1(7)
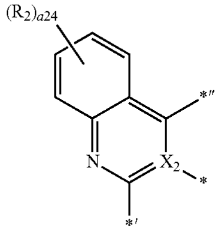
A2-1(8)
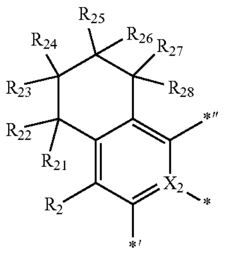
A2-1(9)
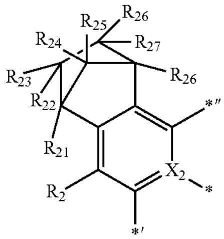
A2-1(10)
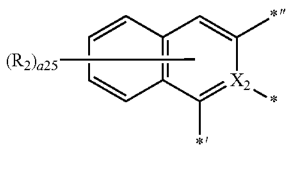
-continued
A2-1(11)
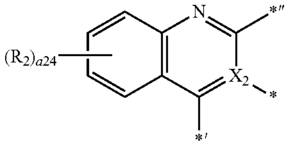
A2-1(12)
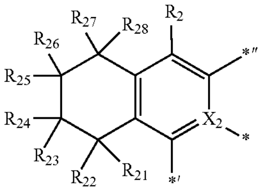
A2-1(13)
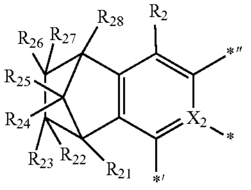
A2-1(14)
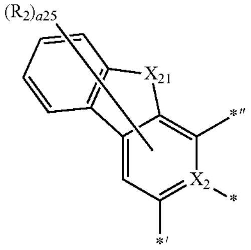
A2-1(15)
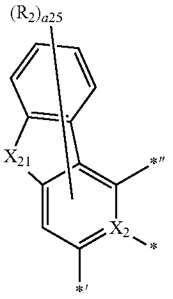
A2-1(16)
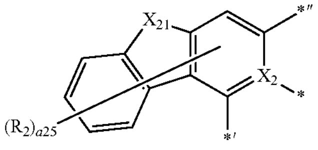
A2-1(17)
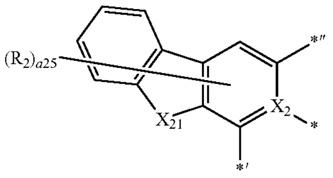

-continued

A2-2(1)

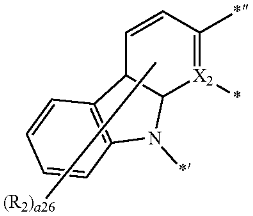

A2-2(2)

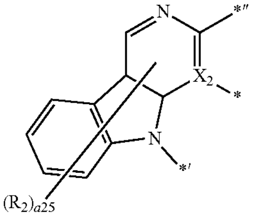

A2-2(3)

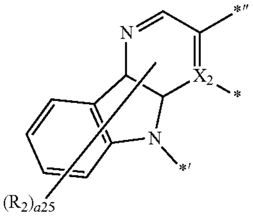

A2-2(4)

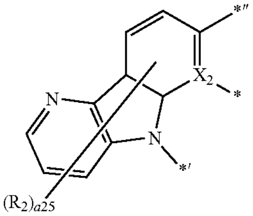

A2-2(5)

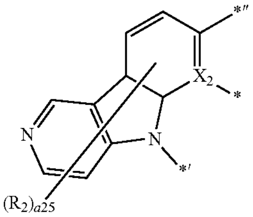

A2-2(6)

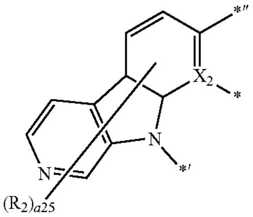

A2-2(7)

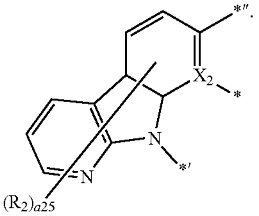

In Formulae A2-1(1) to A2-1(17) and A2-2(1) to A2-2(7), $X_2$ and $R_2$ may respectively be the same as defined herein, $X_{21}$ may be O, S, $C(R_{21})(R_{22})$, $Si(R_{21})(R_{22})$, or $N(R_{21})$, $X_{21}$ to $X_{28}$ may respectively be the same as defined in connection with $R_2$, a25 may be an integer of 0 to 5, a24 may be an integer of 0 to 4, a23 may be an integer of 0 to 3, a22 may be an integer of 0 to 2,

* indicates a binding site to $T_{12}$ or M in Formula 1,

*' indicates a binding site to $T_1$ in Formula 1, and

*" indicates a binding site to $T_2$ in Formula 1.

In one or m e embodiments, a moiety represented by

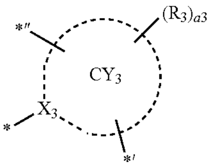

in Formula 1 may be selected from groups represented by Formulae A3-1(1) to A3-1(17) and A3-2(1) to A3-2(7):

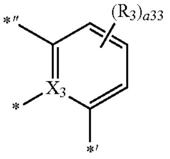

A3-1(1)

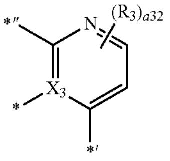

A3-1(2)

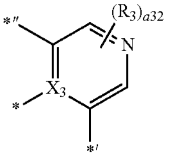

A3-1(3)

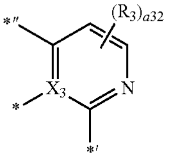

A3-1(4)

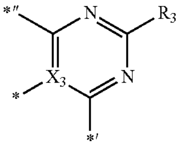

A3-1-(5)

-continued
A3-1(6)
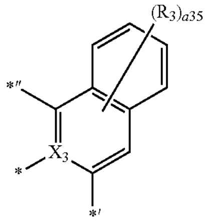
A3-1(7)
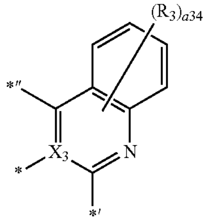
A3-1(8)
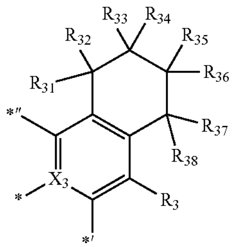
A3-1(9)
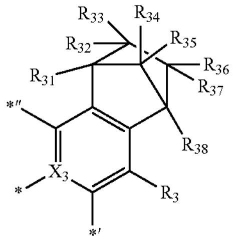
A3-1(10)
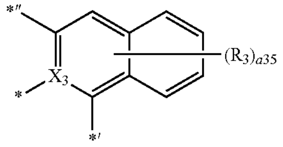
A3-1(11)
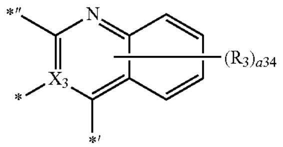
A3-1(12)
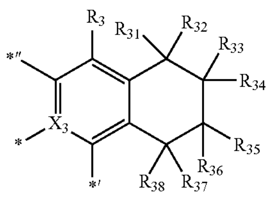
-continued
A3-1(13)
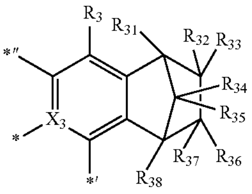
A3-1(14)
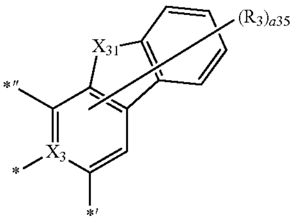
A3-1(15)
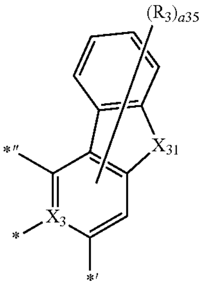
A3-1(16)
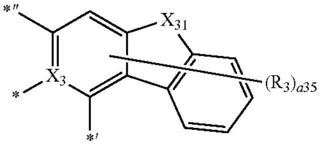
A3-1(17)
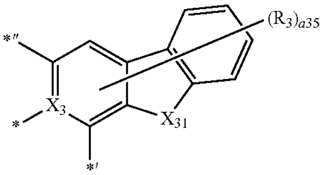
A3-2(1)
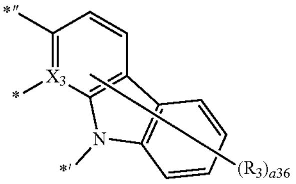
A3-2(2)
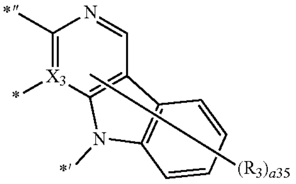
A3-2(3)
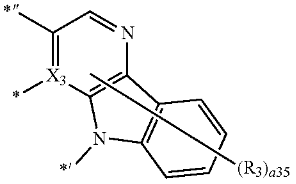

-continued

A3-2(4)

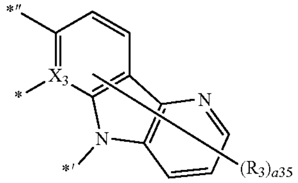

A3-2(5)

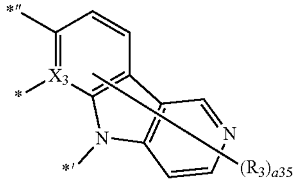

A3-2(6)

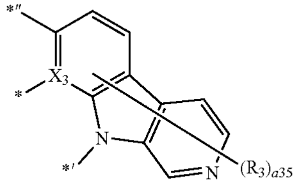

A3-2(7)

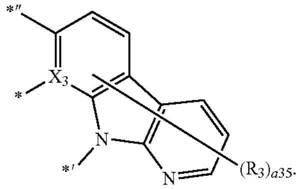

In Formulae A3-1(1) to A3-1(17) and A3-2(1) to A3-2(7), $X_3$ and $R_3$ may respectively be the same as defined herein, $X_{31}$ may be O, S, $C(R_{31})(R_{32})$, $Si(R_{31})(R_{32})$, or $N(R_{31})$, $X_{31}$ to $X_{38}$ may respectively be the same as defined in connection with $R_3$, a35 may be an integer of 0 to 5, a34 may be an integer of 0 to 4, a33 may be an integer of 0 to 3, a32 may be an integer of 0 to 2,

* indicates a binding site to $T_{13}$ or M in Formula 1,

*' indicates a binding site to $T_{13}$ or M in Formula 1, and

*" indicates a binding site to $T_2$ in Formula 1.

In one or more embodiments, a moiety represented by

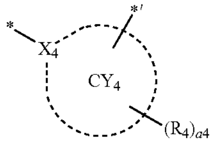

in Formula 1 may be selected from groups represented by Formulae A4-1(1) to A4-1(49):

A4-1(1)

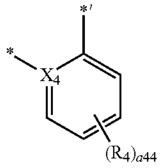

-continued

A4-1(2)

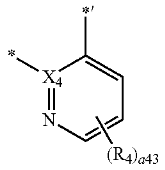

A4-1(3)

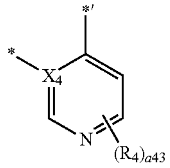

A4-1(4)

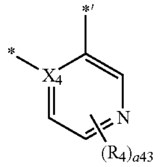

A4-1(5)

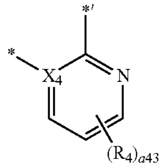

A4-1(6)

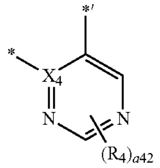

A4-1(7)

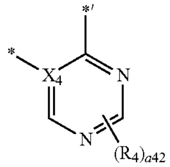

A4-1(8)

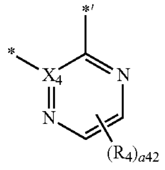

A4-1(9)

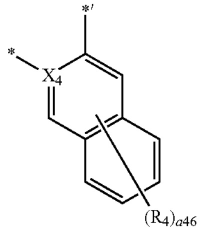

A4-1(10)
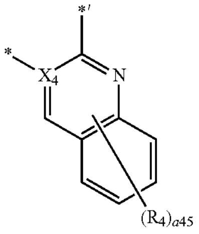
A4-1(11)
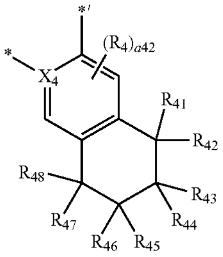
A4-1(12)
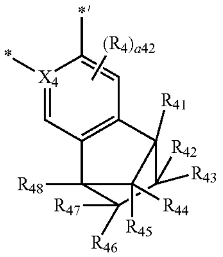
A4-1(13)
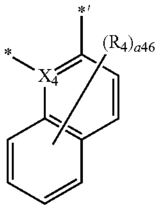
A4-1(14)
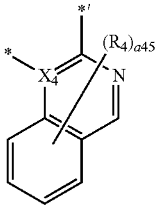
A4-1(15)
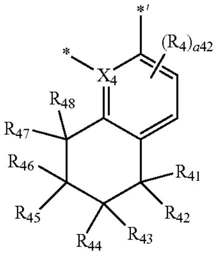
A4-1(16)
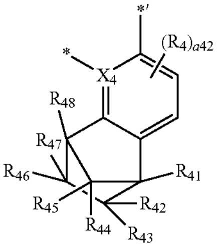
A4-1(17)
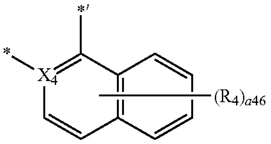
A4-1(18)
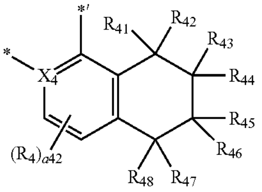
A4-1(19)
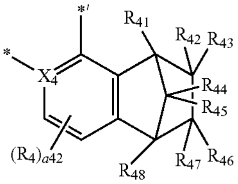
A4-1(20)
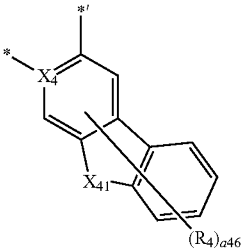
A4-1(21)
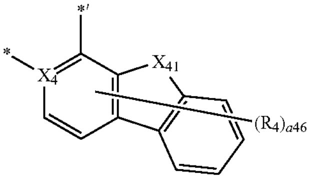
A4-1(22)
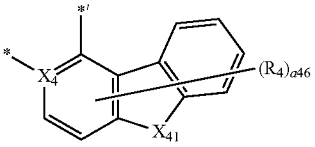

-continued
A4-1(23)
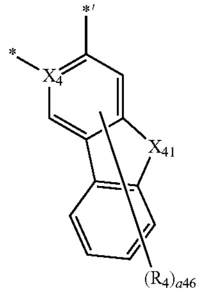
A4-1(24)
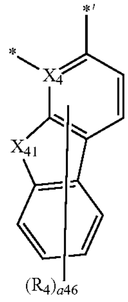
A4-1(25)
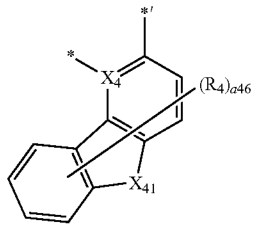
A4-1(26)
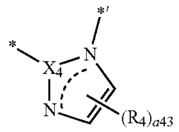
A4-1(27)
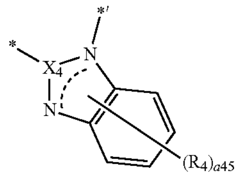
A4-1(28)
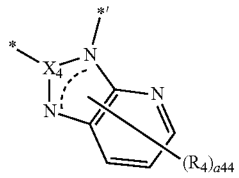
A4-1(29)
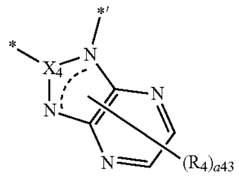
-continued
A4-1(30)
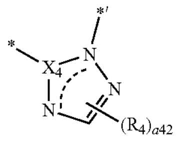
A4-1(31)
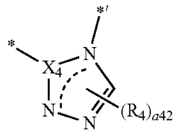
A4-1(32)
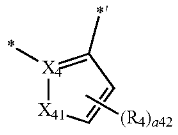
A4-1(33)
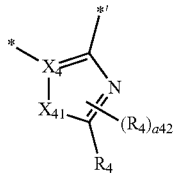
A4-1(34)
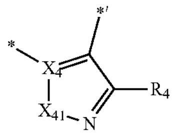
A4-1(35)
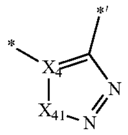
A4-1(36)
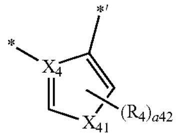
A4-1(37)
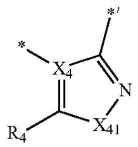
A4-1(38)
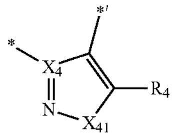
A4-1(39)
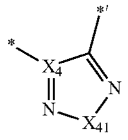

-continued

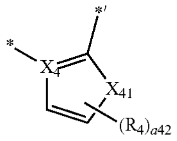

A4-1(40)

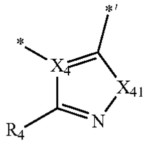

A4-1(41)

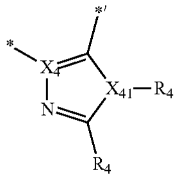

A4-1(42)

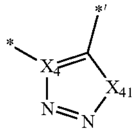

A4-1(43)

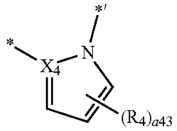

A4-1(44)

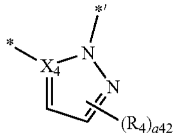

A4-1(45)

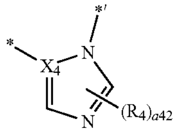

A4-1(46)

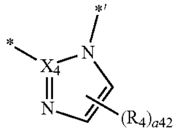

A4-1(47)

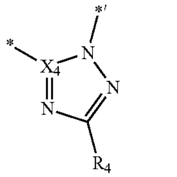

A4-1(48)

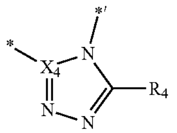

A4-1(49)

$X_{41}$ may be O, S, $C(R_{41})(R_{42})$, $Si(R_{41})(R_{42})$, or $N(R_{41})$, $X_{41}$ to $X_4$ may respectively be the same as defined in connection with $R_4$, a46 may be an integer of 0 to 6, a45 may be an integer of 0 to 5, a44 may be an integer of 0 to 4, a43 may be an integer of 0 to 3, a42 may be an integer of 0 to 2,

* indicates a binding site to $T_{14}$ or M in Formula 1, and

*' indicates a binding site to $T_3$ in Formula 1.

In one or more embodiments, in Formula 2, a group represented by

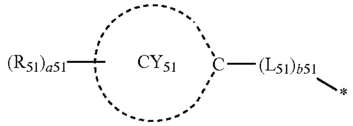

and a group represented by

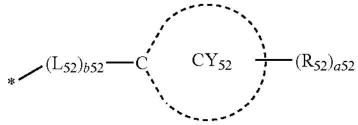

may not be a phenyl group.

In one or more embodiments, in Formula 2, a group represented by

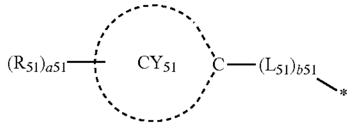

a group represented by

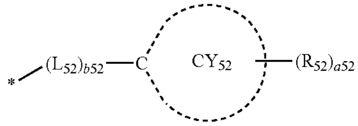

may be identical to each other.

In one or more embodiments, in Formula 2, ring $CY_{51}$ and ring $CY_{52}$ may each independently be selected from a benzene group, a pyridine group, a pyrimidine group, a pyridazine group, a pyrazine group, and a triazine group, $R_{51}$ and $R_{52}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, and —$Si(Q_1)(Q_2)(Q_3)$, $Q_1$ to $Q_3$ may each independently be selected from a $C_3$-$C_{10}$ cycloalkyl group, a $C_1$-$C_1$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and a $C_6$-$C_{60}$ aryl group substituted with at least one selected from deuterium, —F, a cyano group, a —$C_1C$ alkyl$_{10}$ group, a phenyl group, and a biphenyl group, and a51 and a52 may each independently be 1, 2, or 3.

In one or more embodiments, in Formula 2, a moiety represented by

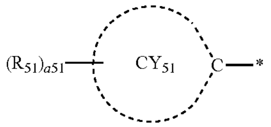

may be selected from groups represented by Formulae CY51-1 to CY52-17 and/or, a moiety represented by

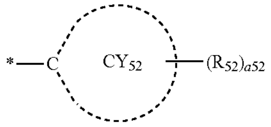

may be selected from groups represented by Formulae CY52-1 to CY52-17 and/or, a moiety represented by

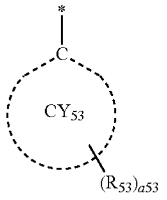

may be selected from groups represented by Formulae CY53-1 to CY53-18:

CY51-1

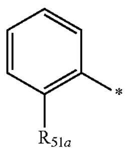

CY51-2

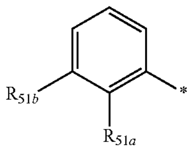

-continued

CY51-3

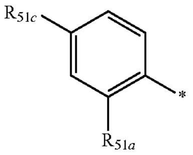

CY51-4

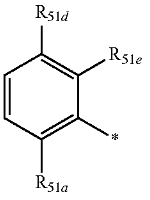

CY51-5

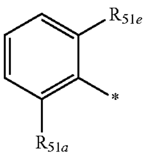

CY51-6

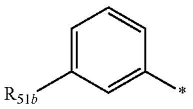

CY51-7

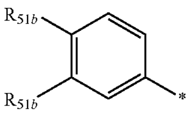

CY51-8

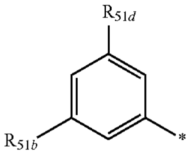

CY51-9

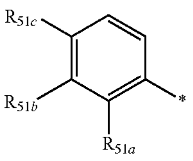

CY51-10

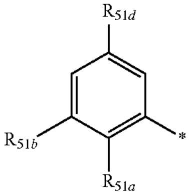

CY51-11

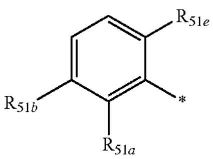

-continued
CY51-12
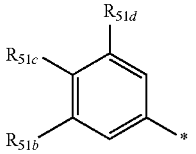
CY51-13
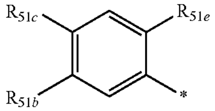
CY51-14
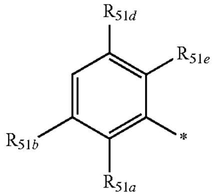
CY51-15
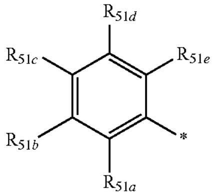
CY51-16
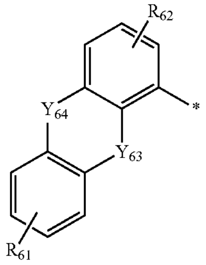
CY51-17
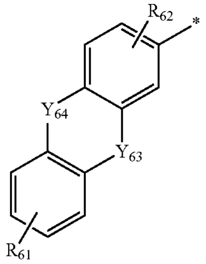
CY52-1
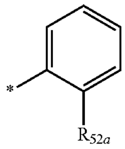
CY52-2
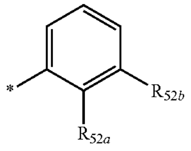
-continued
CY52-3
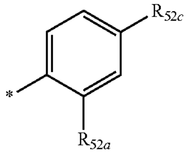
CY52-4
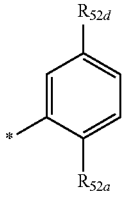
CY52-5
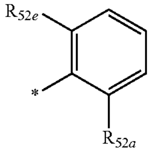
CY52-6
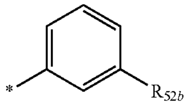
CY52-7
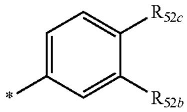
CY52-8
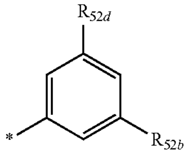
CY52-9
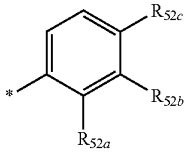
CY52-10
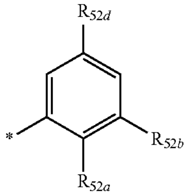
CY52-11
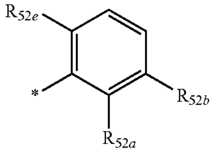

-continued
CY52-12
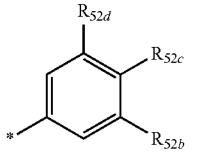
CY52-13
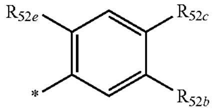
CY52-14
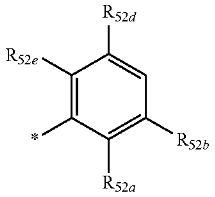
CY52-15
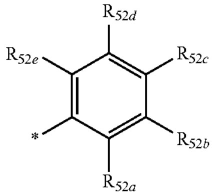
CY52-16
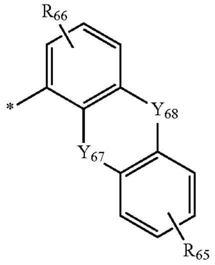
CY52-17
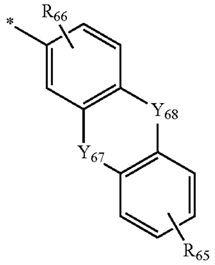
CY53-1
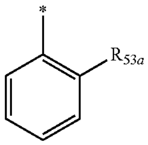
CY53-2
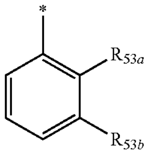
-continued
CY53-3
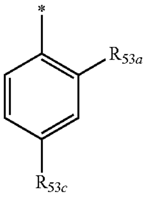
CY53-4
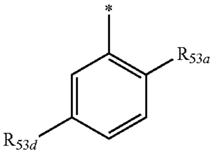
CY53-5
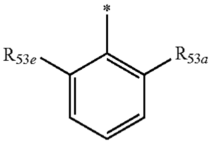
CY53-6
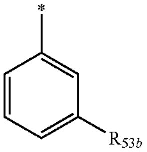
CY53-7
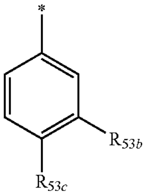
CY53-8
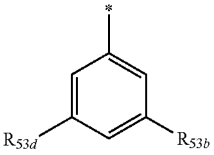
CY53-9
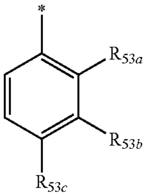
CY53-10
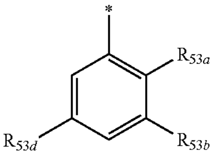
CY53-11
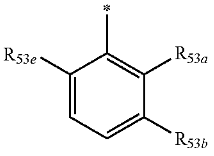

-continued

CY53-12

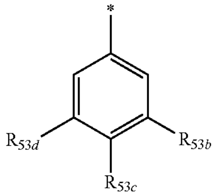

CY53-13

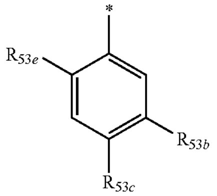

CY53-14

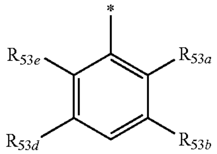

CY53-15

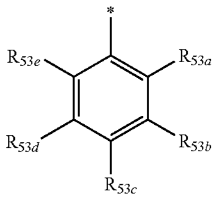

CY53-16

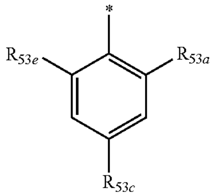

CY53-17

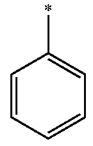

CY53-18

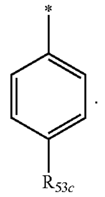

In Formulae CY51-1 to CY51-17, CY52-1 to CY52-17, and CY53-1 to CY53-18, $Y_{63}$ may be a single bond, O, S, $N(R_{63})$, $B(R_{63})$, $C(R_{63a})(R_{63b})$, or $Si(R_{63a})(R_{63b})$, $Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, $N(R_{67})$, $B(R_{67})$, $C(R_{67a})(R_{67b})$, or $Si(R_{67a})(R_{67b})$, and $Y_{68}$ may be a single bond, O, S, $N(R_{68})$, $B(R_{68})$, $C(R_{68a})(R_{68b})$, or $Si(R_{68a})(R_{68b})$.

$Y_{63}$ and $Y_{65}$ in Formulae CY51-16 and CY51-17 may not both be a single bond (e.g., may not be concurrently or simultaneously a single bond), $Y_{67}$ and $Y_{68}$ in Formulae CY52-16 and CY52-17 may not both be a single bond (e.g., may not be concurrently or simultaneously a single bond), $R_{51a}$ to $R_{51e}$, $R_{61}$ to $R_{64}$, $R_{63a}$, $R_{63b}$, $R_{64a}$, and $R_{64b}$ may respectively be the same as defined in connection with $R_{51}$, wherein $R_{51a}$ to $R_{51e}$ may not be hydrogen, $R_{52a}$ to $R_{52e}$, $R_{65}$ to $R_{68}$, $R_{67a}$, $R_{67b}$, $R_{68a}$, and $R_{68b}$ may respectively be the same as defined in connection with $R_{52}$, wherein $R_{52a}$ to $R_{52e}$ may not be hydrogen, $R_{53a}$ to $R_{53e}$ may respectively be the same as defined in connection with $R_{53}$, wherein $R_{53a}$ to $R_{53e}$ may not be hydrogen, and

* indicates a binding site to a neighboring atom.

For example, in Formulae CY51-1 to CY51-15 and CY52-1 to 52-15, $R_{51a}$ to $R_{51e}$ and $R_{52a}$ to $R_{52e}$ may each independently be selected from:

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, and a group represented by Formula 91;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, and a group represented by Formula 91, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $—C(Q_1)(Q_2)(Q_3)$ and $—Si(Q_1)(Q_2)(Q_3)$, and $Q_1$ to $Q_3$ may each independently be selected from:

a phenyl group, a naphthyl group, a pyridinyl group, a pyrimidinyl group, a pyridazinyl group, a pyrazinyl group, and a triazinyl group; and a phenyl group, a naphthyl group, a pyridinyl group, a pyrimidinyl group, a pyridazinyl group, a pyrazinyl group, and a triazinyl group, each substituted with at least one selected from deuterium, a $—C_1C$ $alkyl_{10}$ group, a phenyl group, a biphenyl group, a pyridinyl group, a pyrimidinyl group, a pyridazinyl group, a pyrazinyl group, and a triazinyl group.

In Formulae CY51-16 and CY51-17, i) $Y_{63}$ may be O or S, and $Y_{64}$ may be $Si(R_{64a})(R_{64b})$; or ii) $Y_{63}$ may be $Si(R_{63a})(R_{63b})$, and $Y_{64}$ may be O or S.

In Formulae CY52-16 and CY52-17, i) $Y_{67}$ may be O or S, and $Y_{68}$ may be $Si(R_{68a})(R_{68b})$; or ii) $Y_{67}$ may be $Si(R_{67a})(R_{67b})$, and $Y_{68}$ may be O or S, but embodiments of the present disclosure are not limited thereto.

In one or more embodiments, the third compound may be represented by Formulae 3-1 to 3-5:

3-1

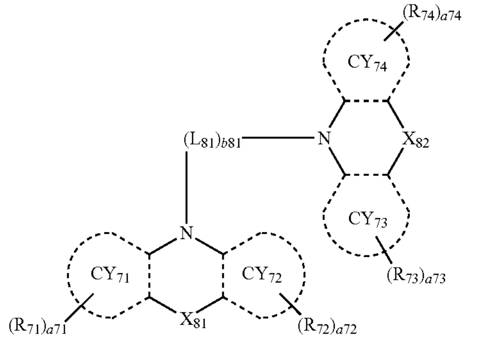

3-2

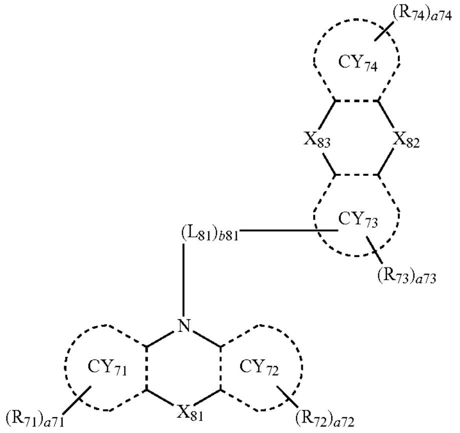

3-3

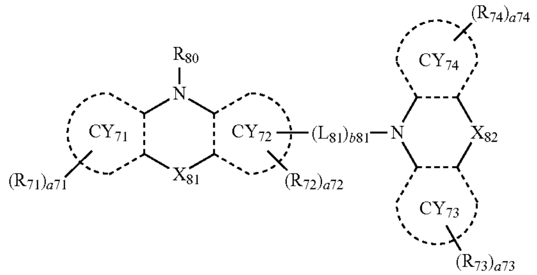

-continued 3-4

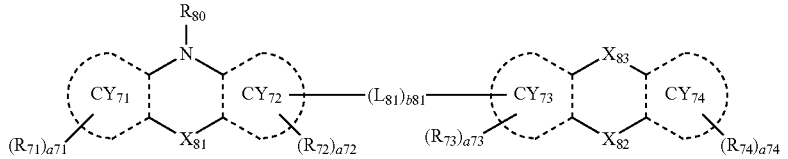

3-5

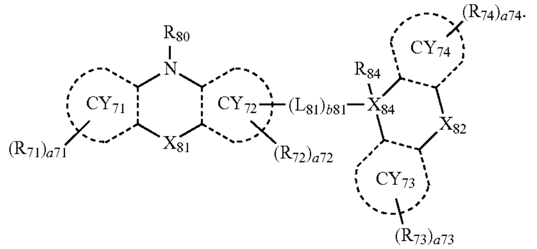

In Formulae 3-1 to 3-5, ring $CY_{71}$, ring $CY_{72}$, $X_{81}$, $R_{71}$, $R_{72}$, a71, and a72 may respectively be the same as defined above, ring $CY_{73}$, ring $CY_{74}$, $R_{73}$, $R_{74}$, a73, and a74 may respectively be the same as defined in connection with ring $CY_{71}$, ring $CY_{72}$, $R_{71}$, $R_{72}$, a71, and a72, $L_{81}$ may be selected from *—C($Q_4$)($Q_5$)—*', *—Si($Q_4$)($Q_5$)-*', a substituted or unsubstituted $C_5$-$C_{30}$ carbocyclic group, and a substituted or unsubstituted $C_1$-$C_{30}$ heterocyclic group, wherein $Q_4$ and 05 may respectively be the same as defined in connection with $Q_1$, b81 may be an integer of 0 to 5, wherein, when b81 is 0, *-$(L_{81})_{b81}$-*' may be a single bond, and when b81 is two or more, two or more $L_{81}$(s) may be identical to or different from each other, $X_{82}$ may be a single bond, O, S, N($R_{82}$), B($R_{82}$), C($R_{82a}$)($R_{82b}$), or Si($R_{82a}$)($R_{82b}$), $X_{83}$ may be a single bond, O, S, N($R_{83}$), B($R_{83}$), C($R_{83a}$)($R_{83b}$), or Si($R_{83a}$)($R_{83b}$), in Formula e3-2 and 3-4, $X_{82}$ and $X_{83}$ may not both be a single bond (e.g., may not be concurrently or simultaneously a single bond), $X_{84}$ may be C or Si, $R_{80}$, $R_{82}$, $R_{83}$, $R_{82a}$, $R_{82b}$, $R_{83a}$, $R_{83a}$, and $R_{84}$ may respectively be the same as defined in connection with $R_{81}$, and

* and *' each indicate a binding site to a neighboring atom.

For example, $L_{81}$ may be selected from:

*—C($Q_4$)($Q_5$)-*' and *—Si($Q_4$)($Q_5$)-*';

a benzene group, a naphthalene group, an anthracene group, a phenanthrene group, a triphenylene group, a pyrene group, a chrysene group, a cyclopentadiene group, a furan group, a thiophenegroup, a silolegroup, an indene group, a fluorene group, an indole group, a carbazole group, a benzofuran group, a dibenzofuran group, a benzothiophene group, a dibenzothiophene-group, a benzosilolegroup, a dibenzosilole group, an azafluorenegroup, an azacarbazole group, an azadibenzofurangroup, an azadibenzothiophene group, an azadibenzo silolegroup, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a trazole group, an oxazole group, an isoxazole group, a thiazole group, an isothiazole group, an oxadiazole group, a thiadiazole group, a benzopyrazole group, a benzimidazole group, a benzoxazole group, a benzothiazolegroup, a benzooxadiazole group, and a benzo thiadiazole group; and a benzene group, a naphthalene group, an anthracene group, a phenanthrene group, a triphenylene group, a pyrene group, a chrysene group, a cyclopentadiene group, a furan group, a thiophenegroup, a silolegroup, an indene group, a fluorene group, an indole group, a carbazole group, a benzofuran group, a dibenzofuran group, a benzothiophene group, a dibenzothiophene-group, a benzosilolegroup, a dibenzosilole group, an azafluorenegroup, an azacarbazole group, an azadibenzofurangroup, an azadibenzothiophene group, an azadibenzo silolegroup, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a trazole group, an oxazole group, an isoxazole group, a thiazole group, an isothiazole group, an oxadiazole group, a thiadiazole group, a benzopyrazole group, a benzimidazole group, a benzoxazole group, a benzothiazolegroup, a benzooxadiazole group, and a benzo thiadiazole group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenyl fluorenyl group, a carbazolyl group, a phenylcarbazolyl group, a dibenzofuranyl group, a dibenzothiophenyl group, a dibenzosilolyl group, a dimethyl dibenzosilolyl group, a diphenyl dibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), and —P(=O)($Q_{31}$)($Q_{32}$), and $Q_4$, $Q_5$, and $Q_{31}$ to $Q_{33}$ may each independently be selected from hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, and a triazinyl group, but embodiments of the present disclosure are not limited thereto.

For example, a moiety represented by

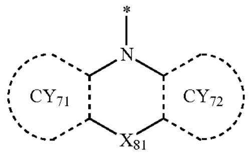

in Formulae 3-1 and 3-2 may be selected from groups represented by Formulae CY71-1(1) to CY71-1(8), a moiety represented by eFormulain

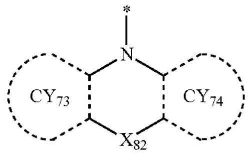

3-1 and 3-3 may be selected from groups represented by Formulae CY71-2(1) to CY71-2(8), a moiety represented by eFormulain

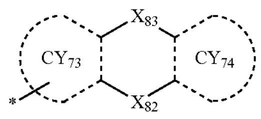

3-2 and 3-4 may be selected from groups represented by Formulae CY71-3(1) to CY71-3(32), a moiety represented by eFormulain

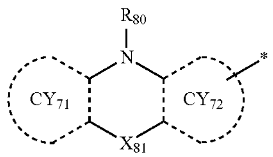

3-3 to 3-5 may be selected from groups represented by Formulae CY71-4(1) to CY71-4(32), a moiety represented by Formulain

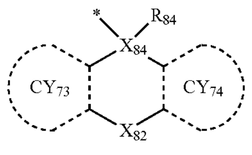

3-5 may be selected from groups represented by Formulae CY71-5(1) to CY71-5(8), but embodiments of the present disclosure are not limited thereto:

CY71-1(1)

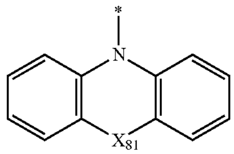

CY71-1(2)

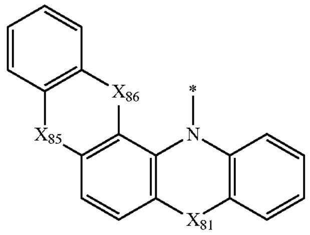

CY71-1(3)

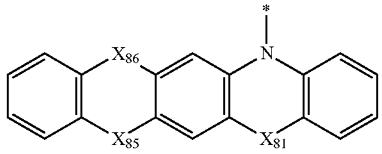

CY71-1(4)

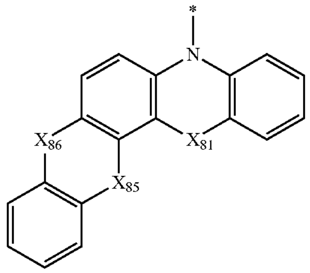

CY71-1(5)

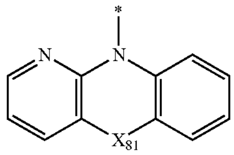

CY71-1(6)

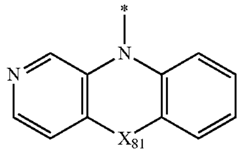

CY71-1(7)

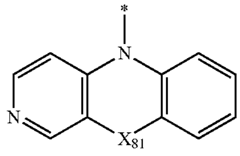

CY71-1(8)

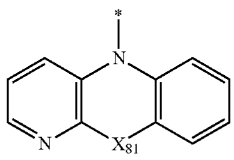

-continued
CY71-2(1)
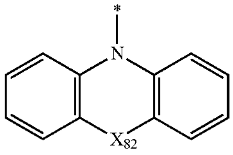
CY71-2(2)
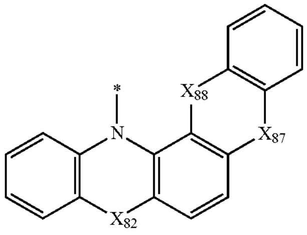
CY71-2(3)
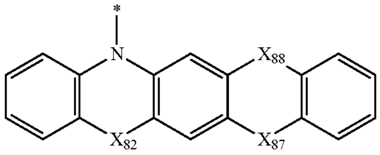
CY71-2(4)
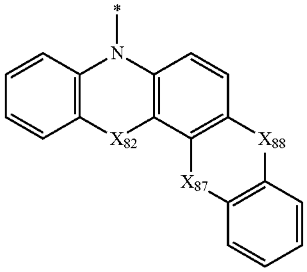
CY71-2(5)
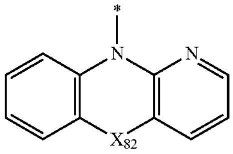
CY71-2(6)
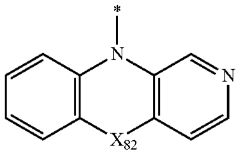
CY71-2(7)
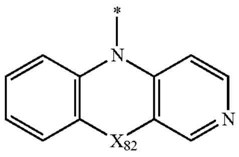
CY71-2(8)
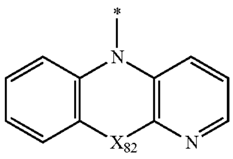
-continued
CY71-3(1)
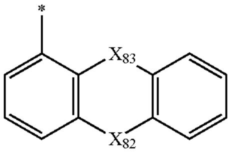
CY71-3(2)
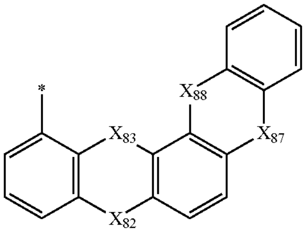
CY71-3(3)
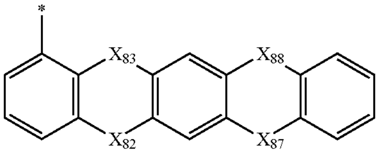
CY71-3(4)
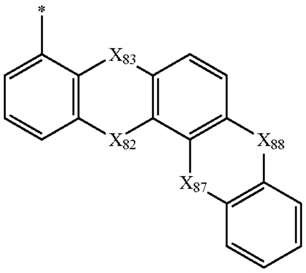
CY71-3(5)
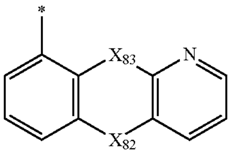
CY71-3(6)
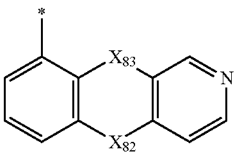
CY71-3(7)
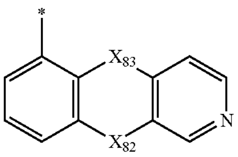
CY71-3(8)
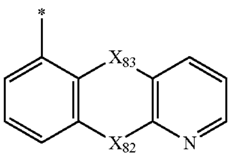

-continued
CY71-3(9)
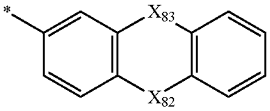
CY71-3(10)
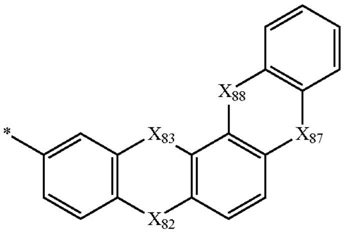
CY71-3(11)
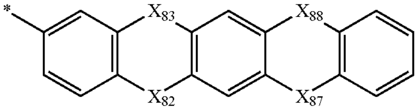
CY71-3(12)
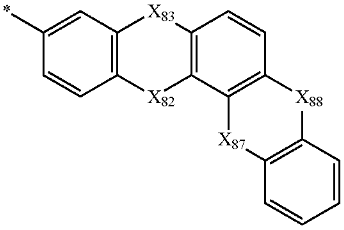
CY71-3(13)
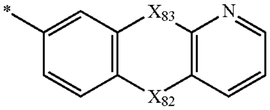
CY71-3(14)
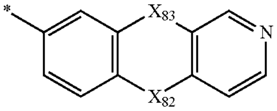
CY71-3(15)
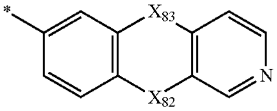
CY71-3(16)
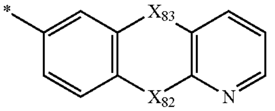
CY71-3(17)
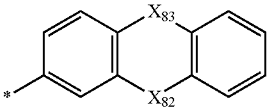
CY71-3(18)
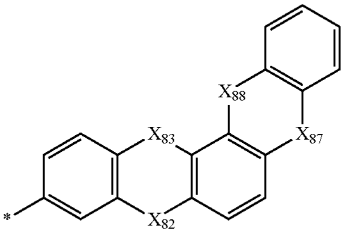
-continued
CY71-3(19)
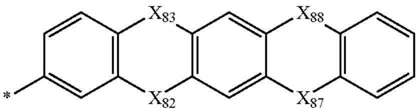
CY71-3(20)
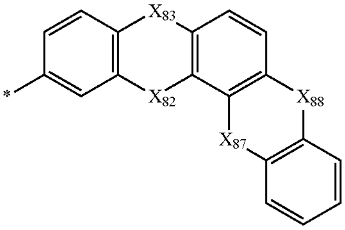
CY71-3(21)
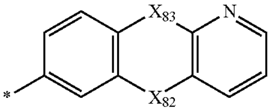
CY71-3(22)
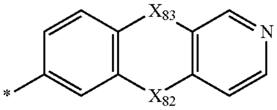
CY71-3(23)
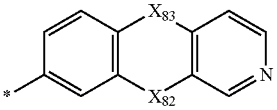
CY71-3(24)
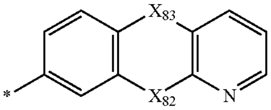
CY71-3(25)
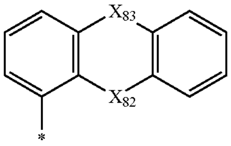
CY71-3(26)
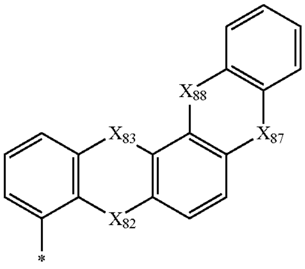
CY71-3(27)
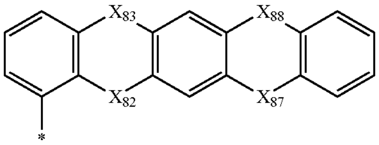

-continued
CY71-3(28)
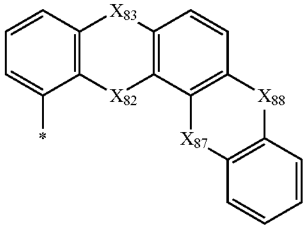
CY71-3(29)
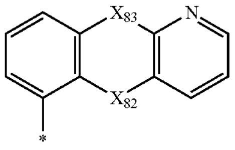
CY71-3(30)
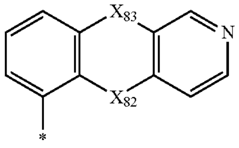
CY71-3(31)
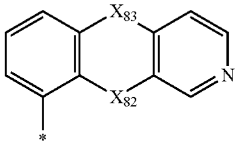
CY71-3(32)
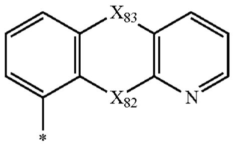
CY71-4(1)
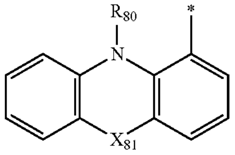
CY71-4(2)
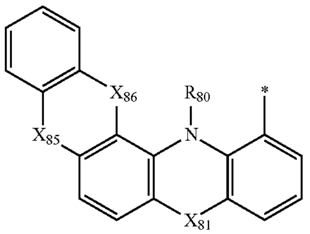
CY71-4(3)
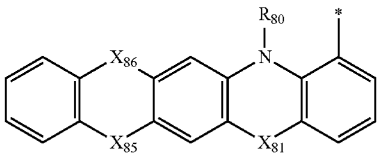
-continued
CY71-4(4)
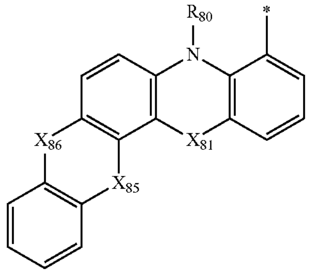
CY71-4(5)
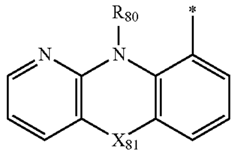
CY71-4(6)
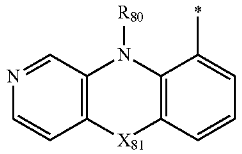
CY71-4(7)
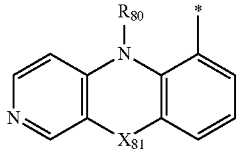
CY71-4(8)
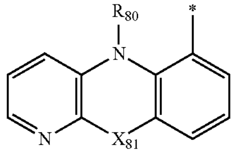
CY71-4(9)
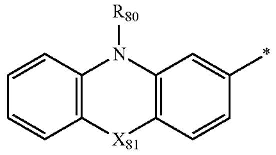
CY71-4(10)
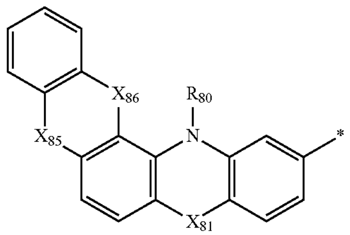
CY71-4(11)
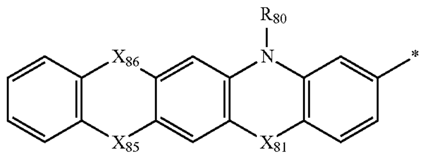

-continued
CY71-4(12)
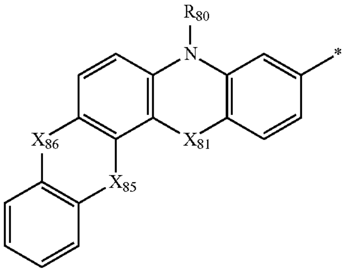
CY71-4(13)
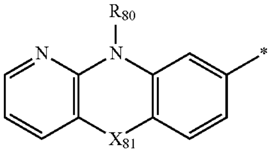
CY71-4(14)
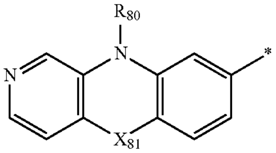
CY71-4(15)
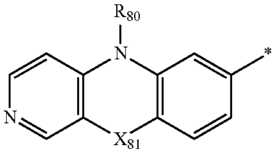
CY71-4(16)
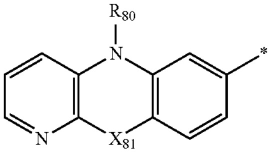
CY71-4(17)
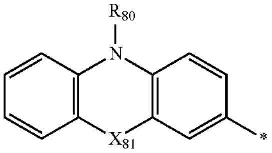
CY71-4(18)
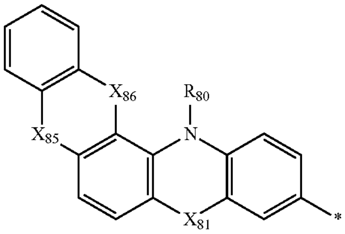
CY71-4(19)
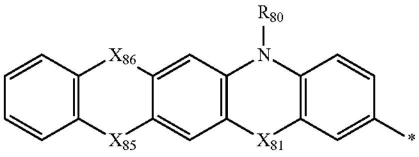
-continued
CY71-4(20)
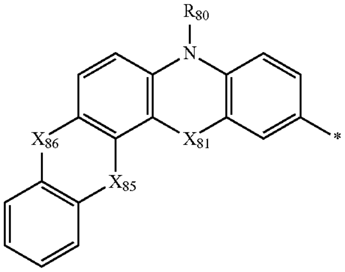
CY71-4(21)
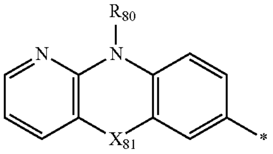
CY71-4(22)
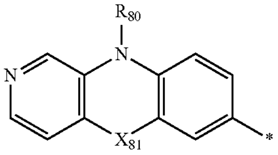
CY71-4(23)
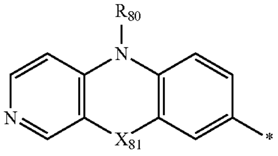
CY71-4(24)
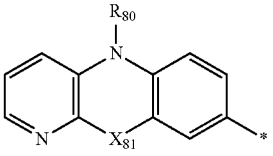
CY71-4(25)
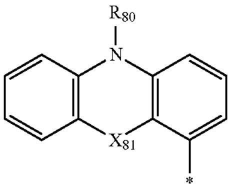
CY71-4(26)
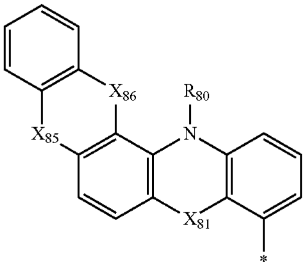
CY71-4(27)
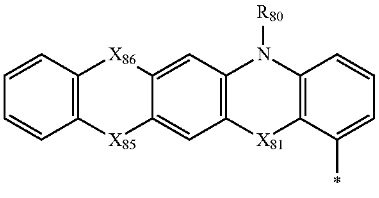

-continued

CY71-4(28)

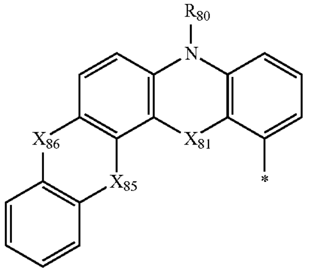

CY71-4(29)

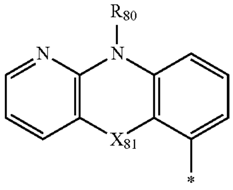

CY71-4(30)

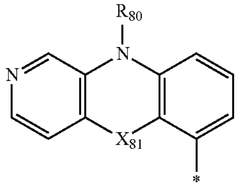

CY71-4(31)

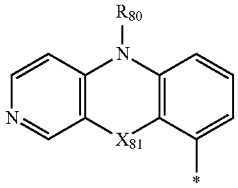

CY71-4(32)

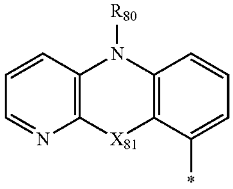

CY71-5(1)

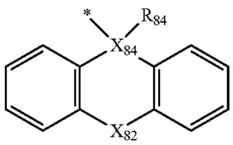

CY71-5(2)

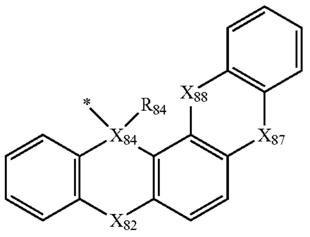

CY71-5(3)

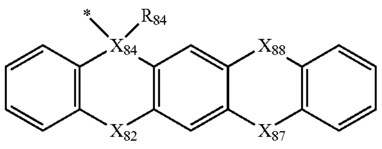

-continued

CY71-5(4)

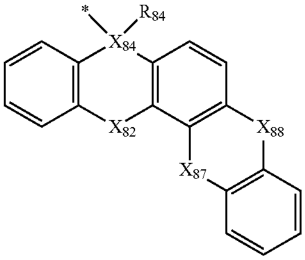

CY71-5(5)

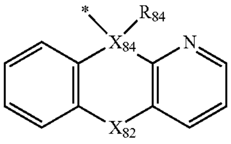

CY71-5(6)

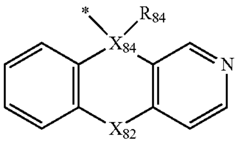

CY71-5(7)

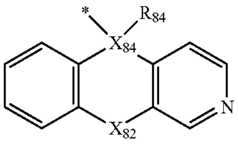

CY71-5(8)

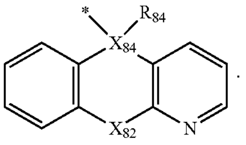

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{84}$, $R_{80}$, and $R_{84}$ may respectively be the same as defined herein, $X_{85}$ may be a single bond, O, S, N($R_{86}$), B($R_{86}$), C($R_{86a}$)($R_{86b}$), or Si($R_{86a}$)($R_{86b}$), $X_{86}$ may be a single bond, O, S, N($R_{86}$), B($R_{86}$), C($R_{88a}$)($R_{86b}$), or Si($R_{88a}$)($R_{86b}$), in Formulae CY71-1(1) to CY71-1(8) and CY71-4(1) to CY71-4(32), $X_{85}$ and $X_{86}$ may not both be a single bond (e.g., may not be a single bond concurrently or at the same time), $X_{87}$ may be a single bond, O, S, N($R_{87}$), B($R_{87}$), C($R_{87a}$)($R_{87b}$), or Si($R_{87a}$)($R_{87b}$), $X_{88}$ may be a single bond, O, S, N($R_{88}$), B($R_{88}$), C($R_{88a}$)($R_{88b}$), or Si($R_{88a}$)($R_{88b}$), in Formulae CY71-2(1) to CY71-2(8), CY71-3(1) to CY71-3(32), and CY71-5(1) to CY71-5(8), $X_{87}$ and $X_{88}$ may not both be a single bond (e.g., may not be a single bond concurrently or at the same time), $R_{85}$ to $R_{88}$, $R_{85a}$, $R_{85b}$, $R_{86a}$, $R_{86b}$, $R_{87a}$, $R_{87b}$, $R_{88a}$, and $R_{88b}$ may respectively be the same as defined in connection with $R_{81}$.

In one embodiment, the first compound may be selected from Compounds D1 to D100:

-continued
D1
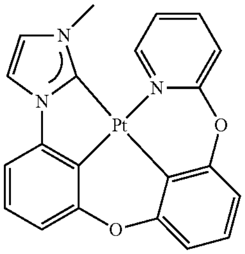
D2
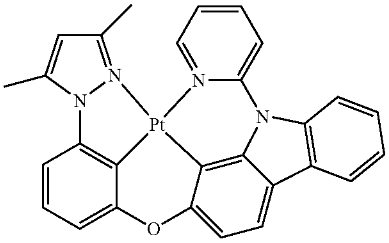
D3
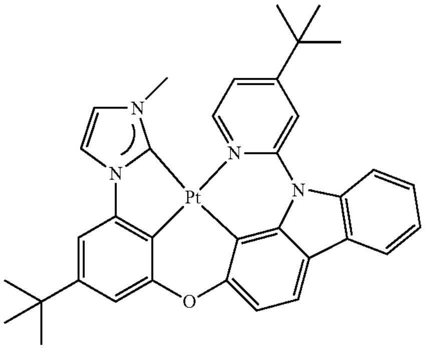
D4
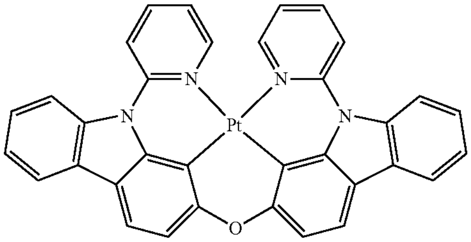
D5
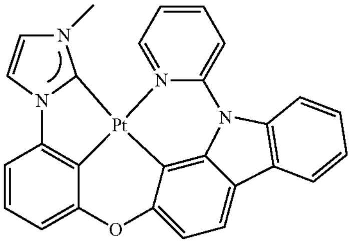
D6
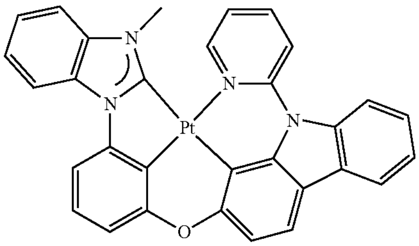
D7
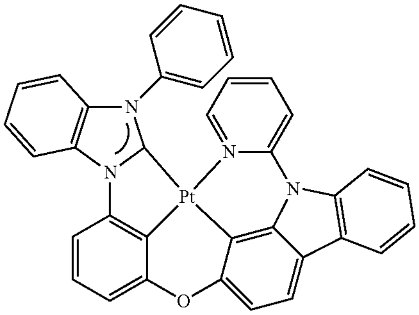
D8
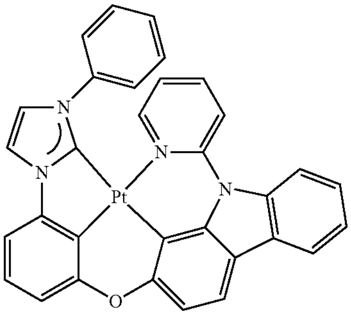
D9
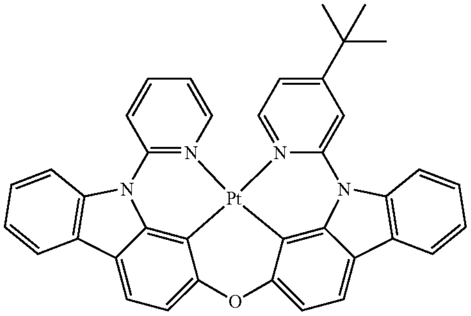
D10
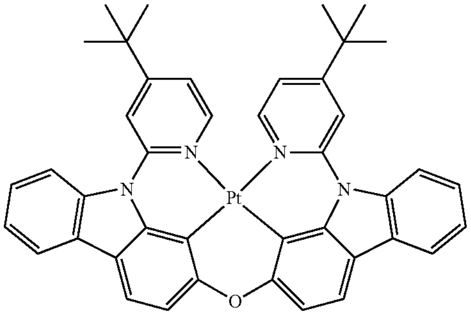
D11
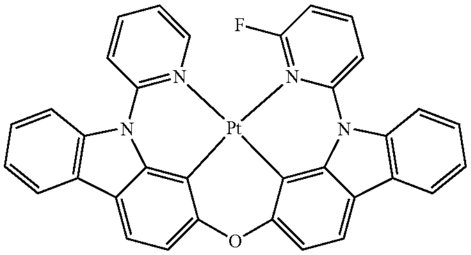

D12
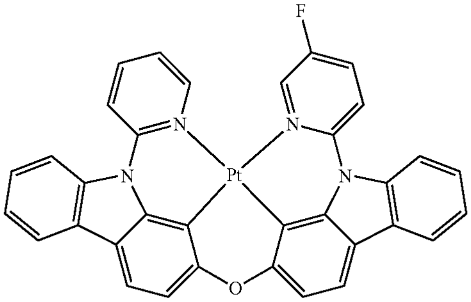
D13
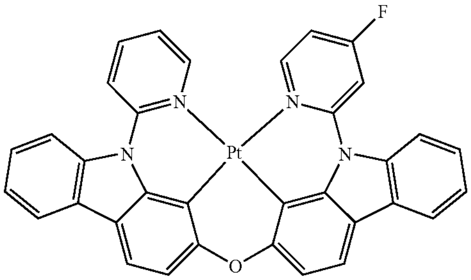
D14
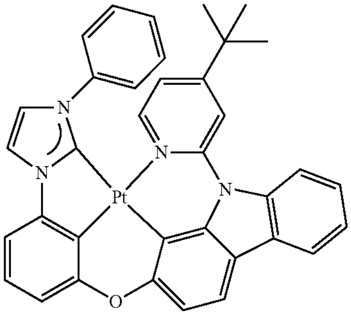
D15
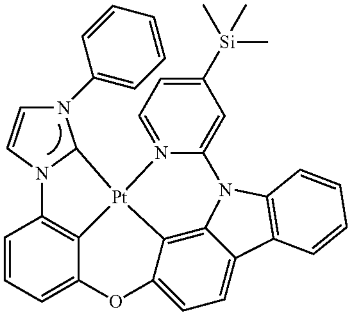
D16
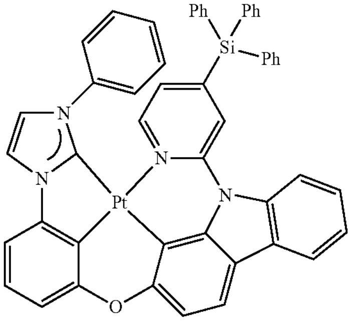
D17
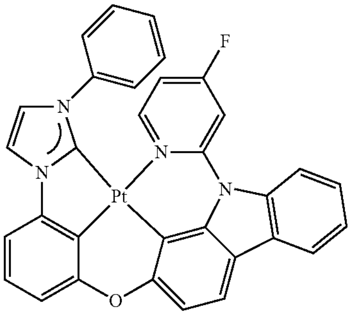
D18
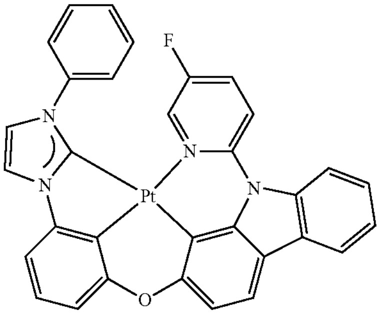
D19
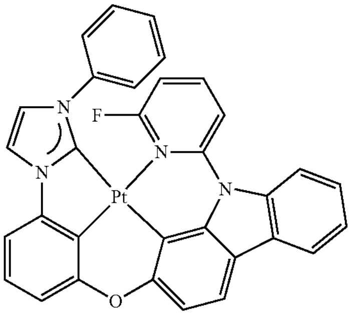
D20
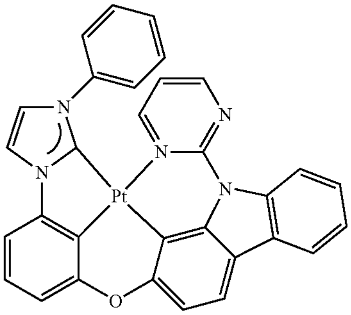
D21
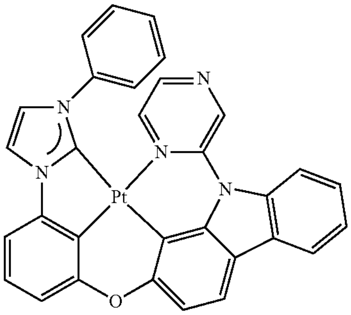

D22
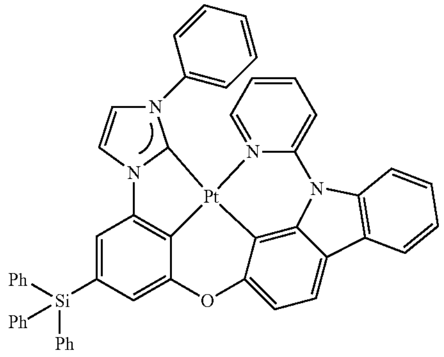
D23
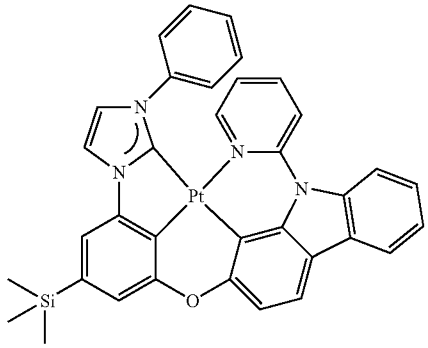
D24
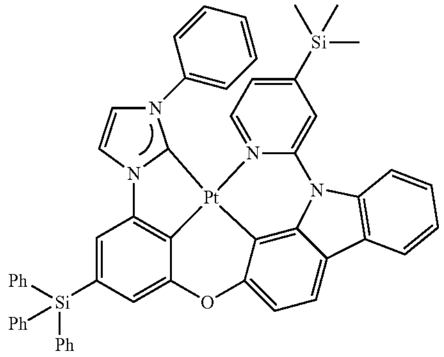
D25
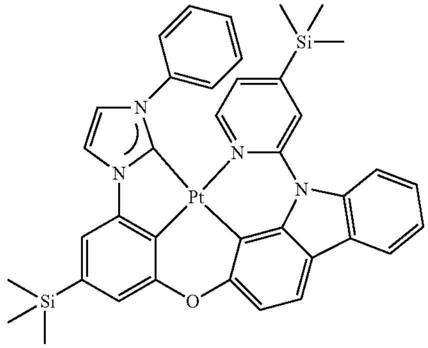
D26
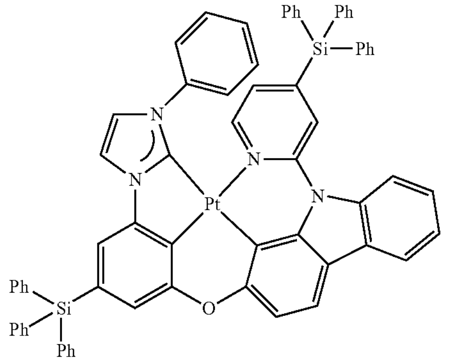
D27
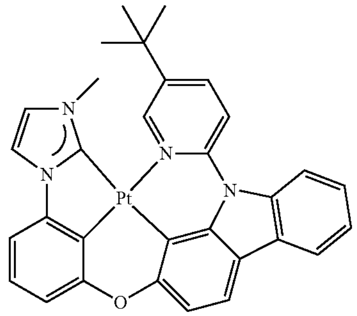
D28
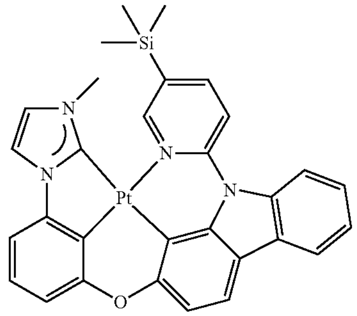
D29
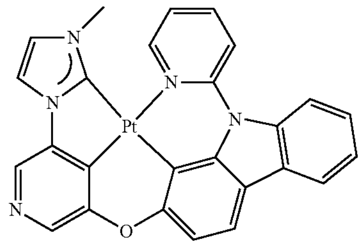
D30
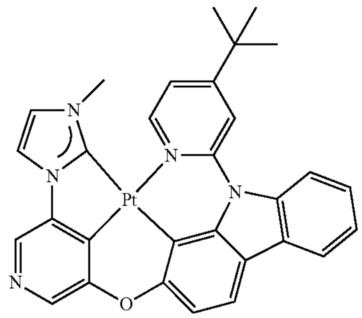

-continued
D31
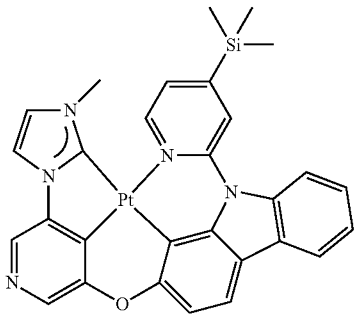
D32
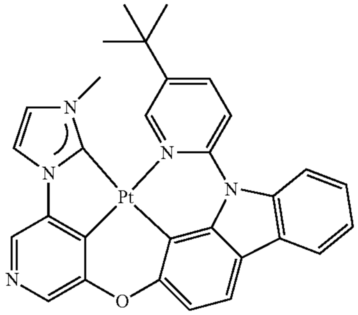
D33
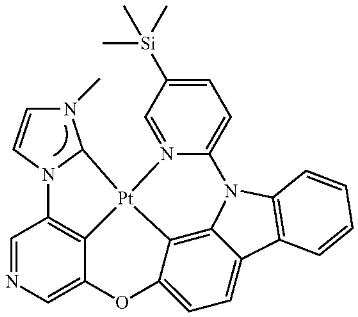
D34
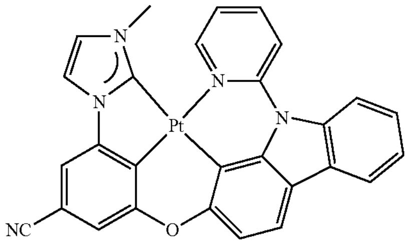
D35
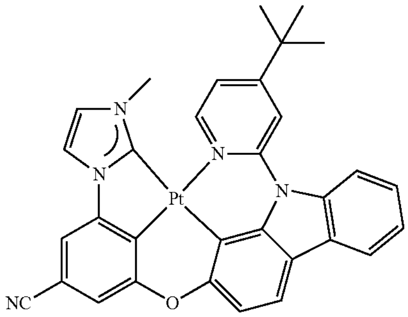
-continued
D36
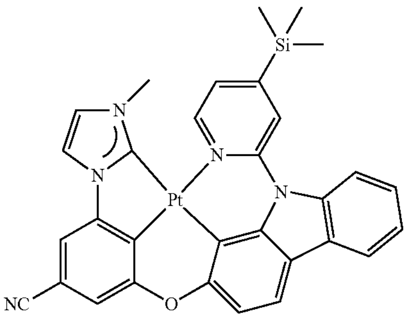
D37
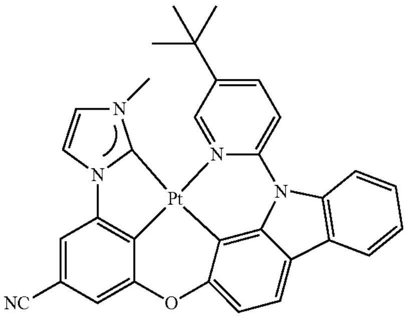
D38
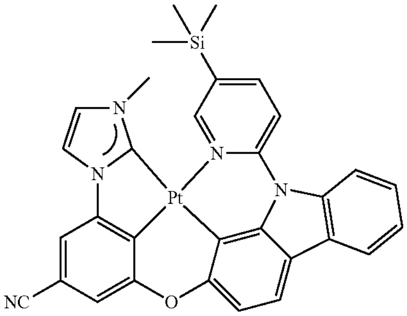
D39
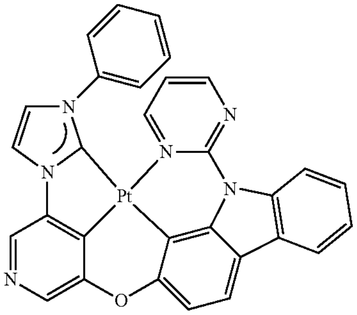
D40
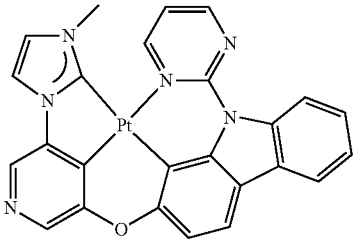

D41
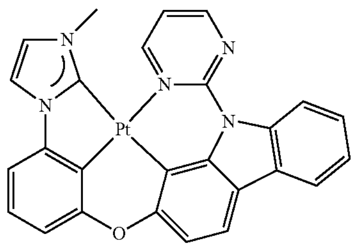
D42
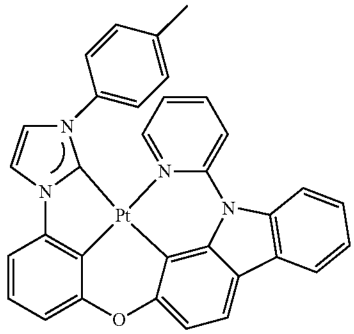
D43
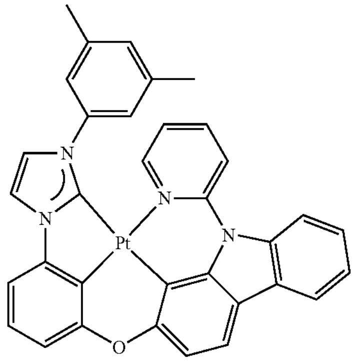
D44
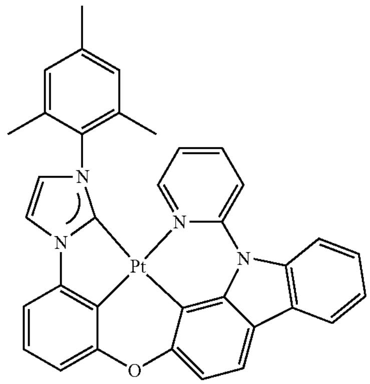
D45
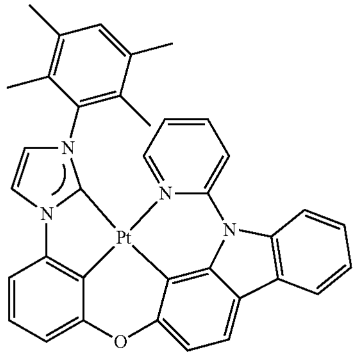
D46
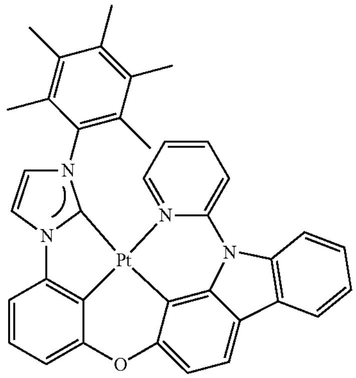
D47
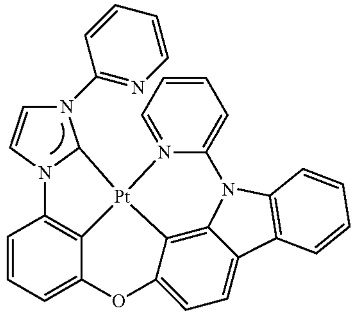
D48
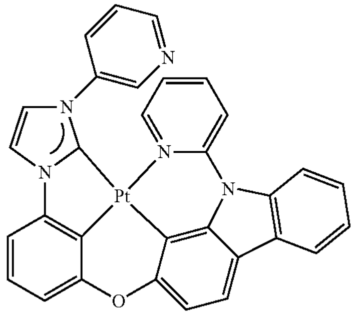

-continued
D49
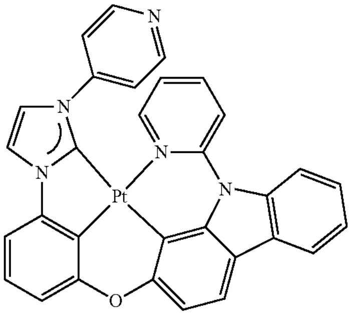
D50
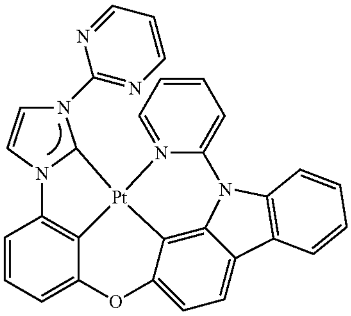
D51
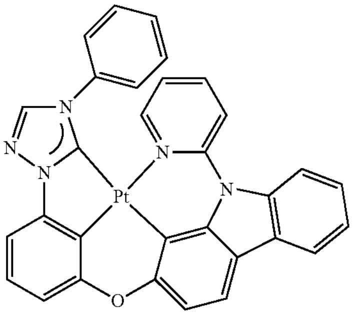
D52
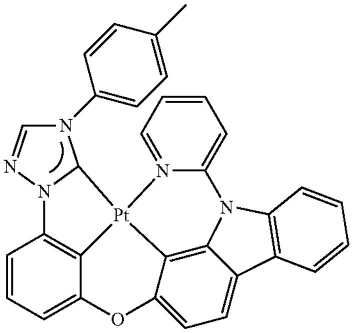
D53
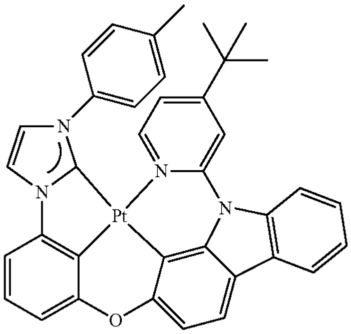
-continued
D54
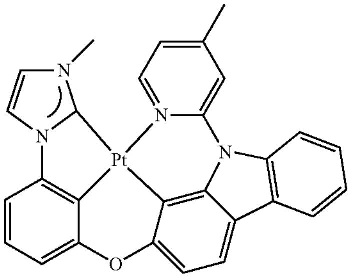
D55
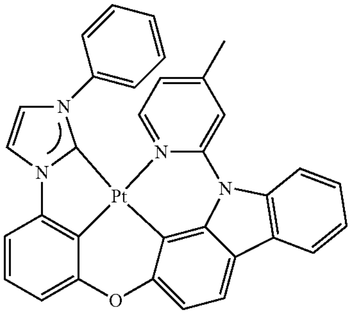
D56
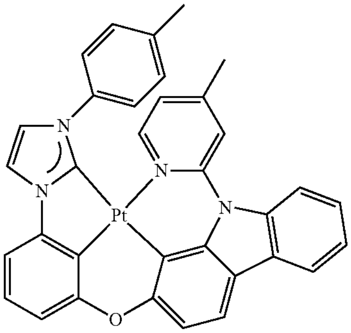
D57
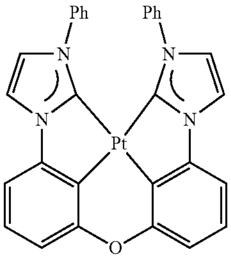
D58
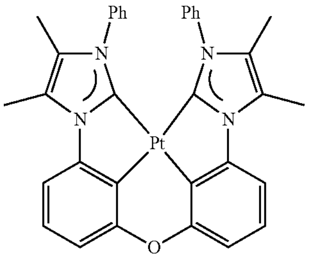

-continued
D59
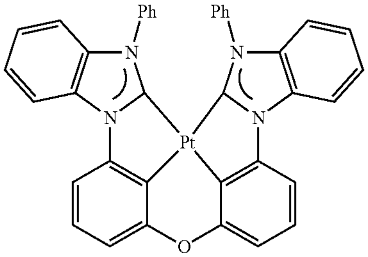
D60
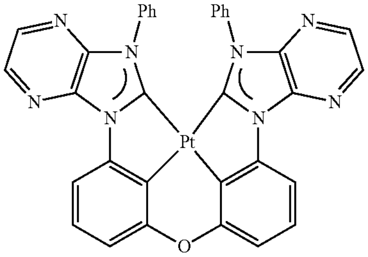
D61
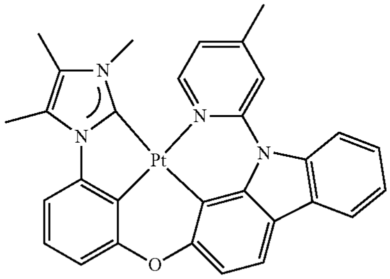
D62
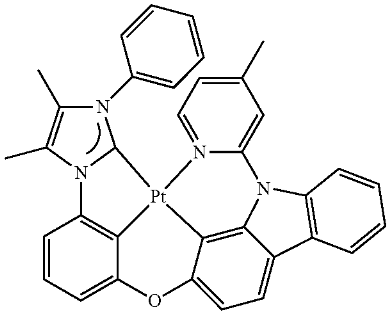
D63
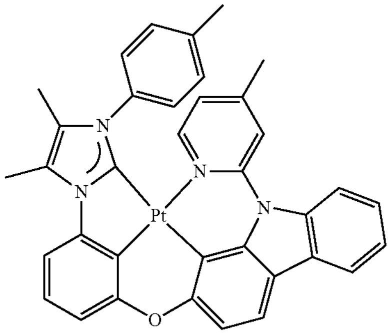
-continued
D64
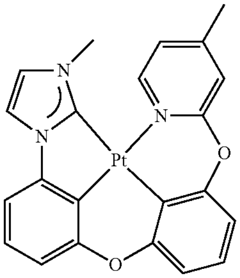
D65
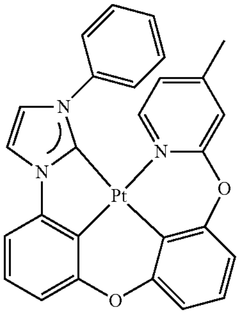
D66
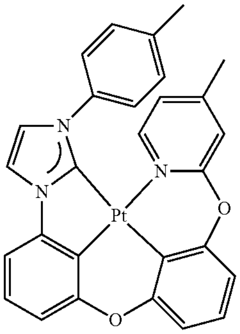
D67
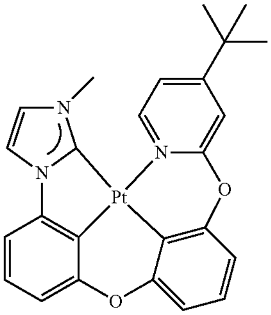
D68
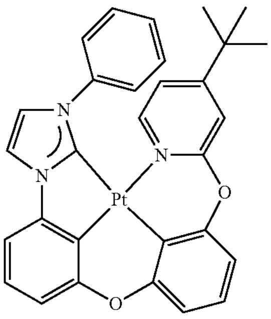

-continued
D69
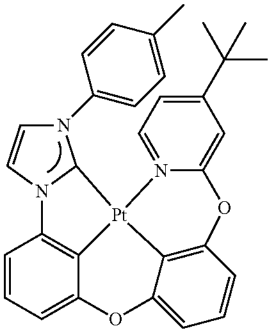
D70
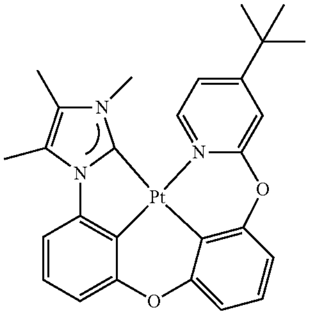
D71
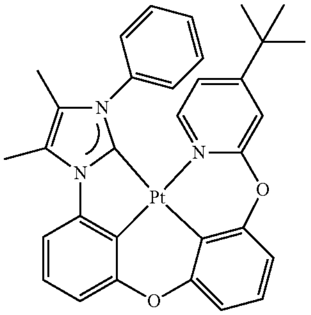
D72
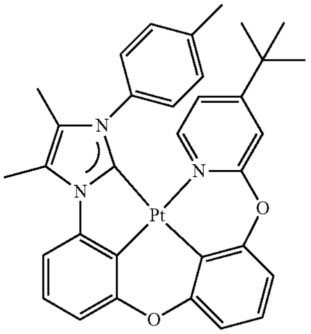
D73
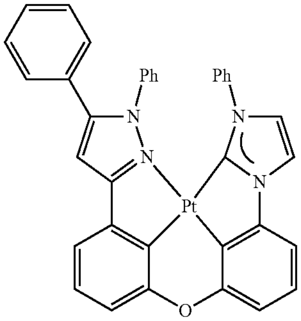
-continued
D74
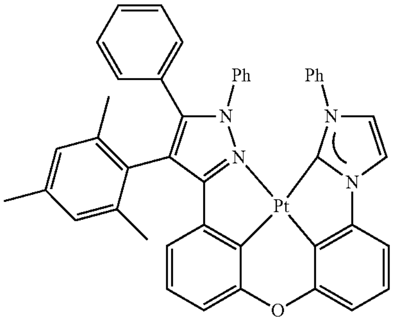
D75
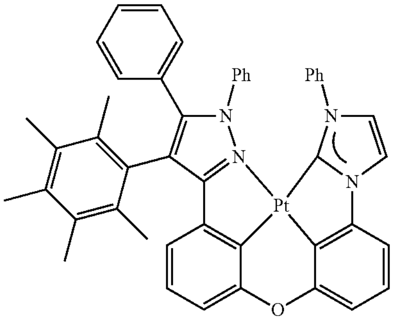
D76
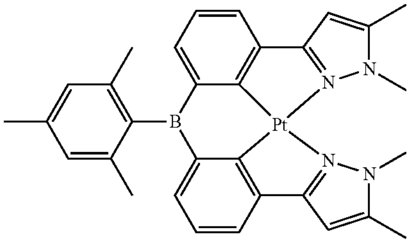
D77
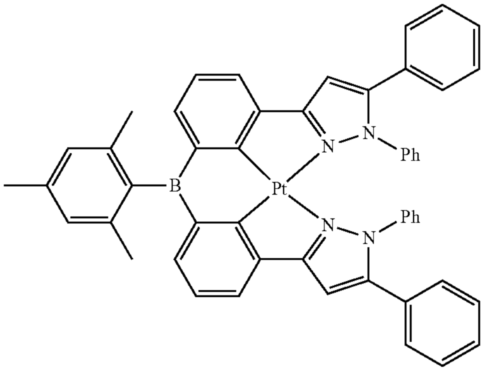
D78
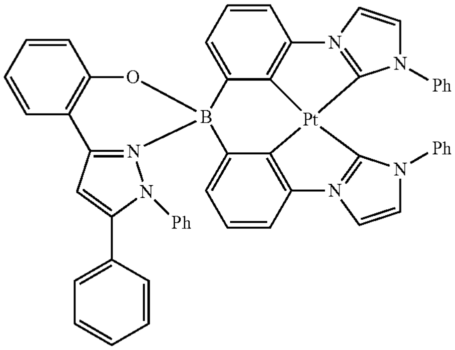

-continued
D79
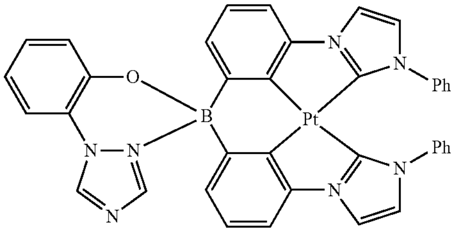
D80
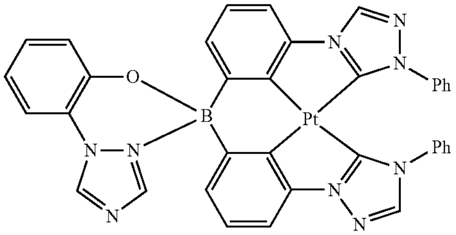
D81
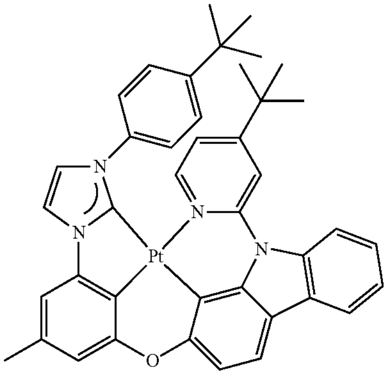
D82
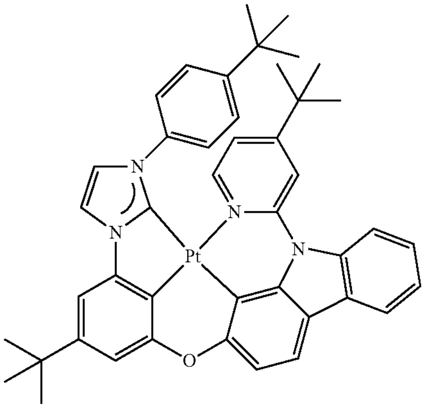
D83
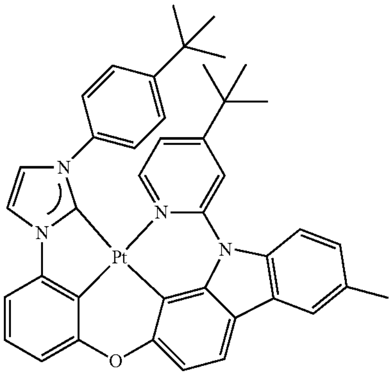
-continued
D84
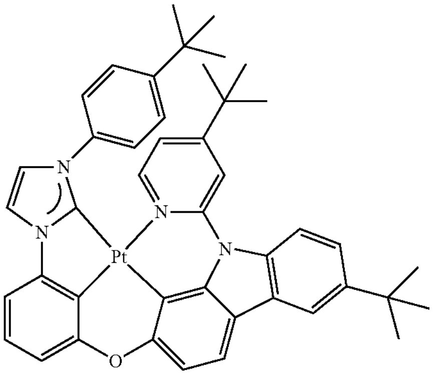
D85
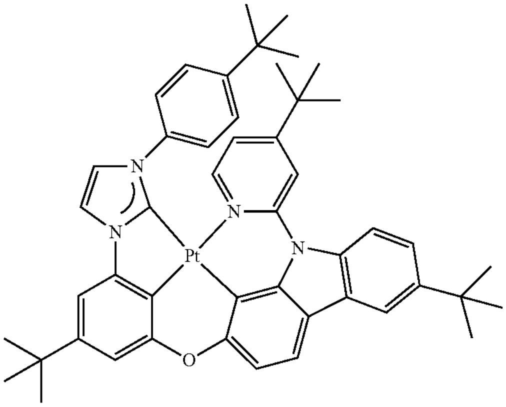
D86
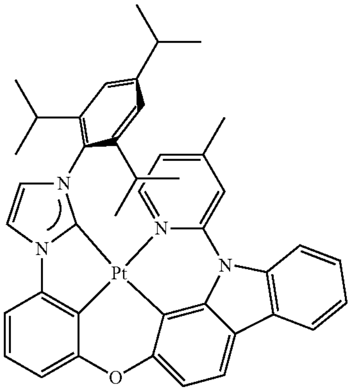
D87
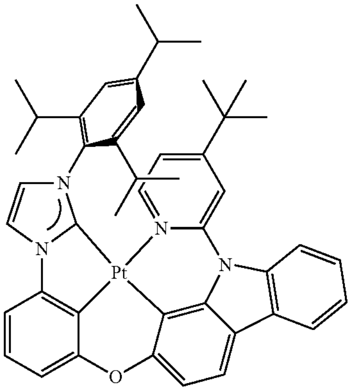

-continued
D88
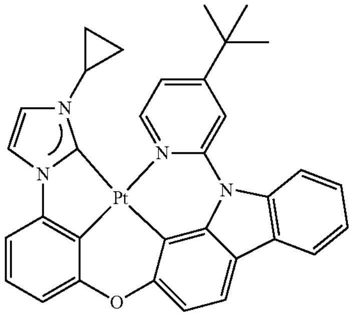
D89
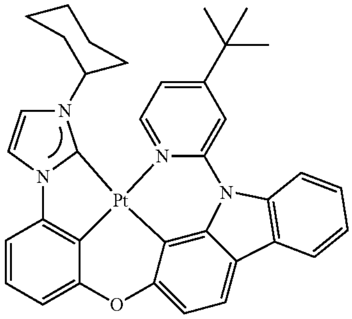
D90
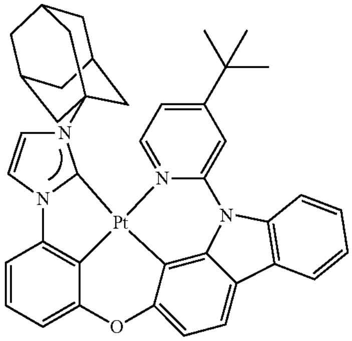
D91
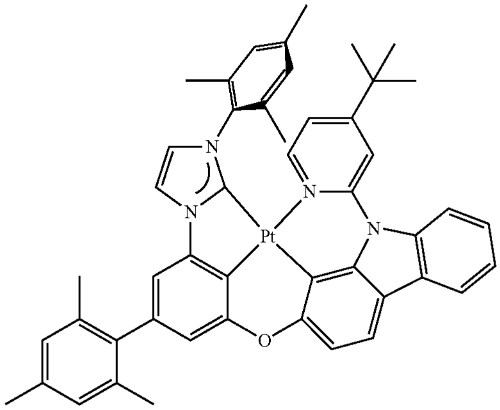
-continued
D92
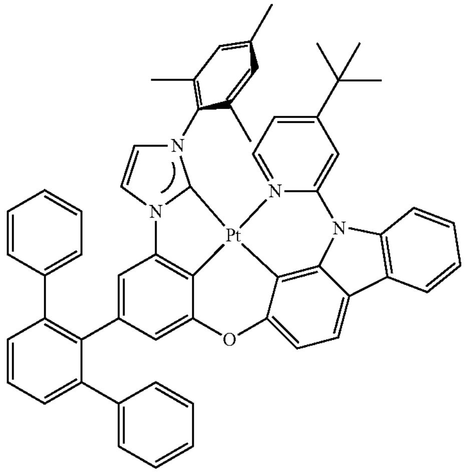
D93
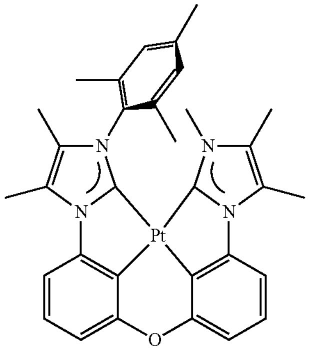
D94
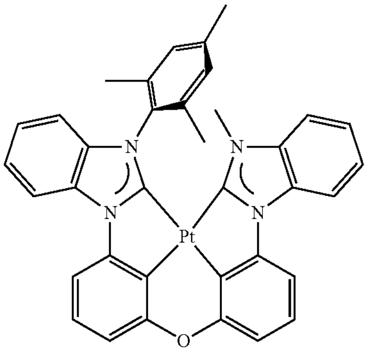
D95
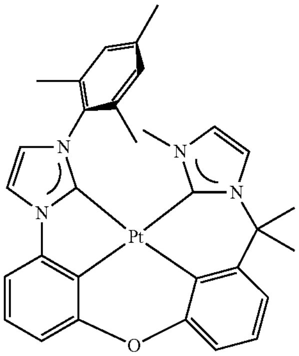

-continued
D96
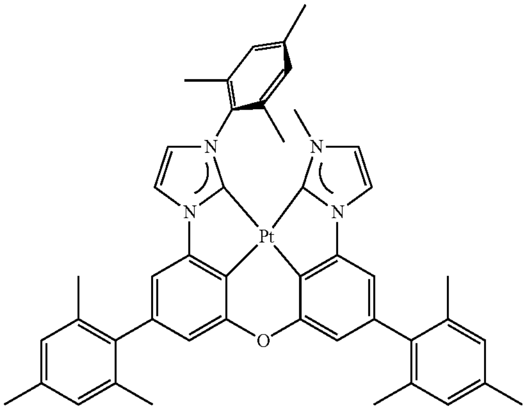
D97
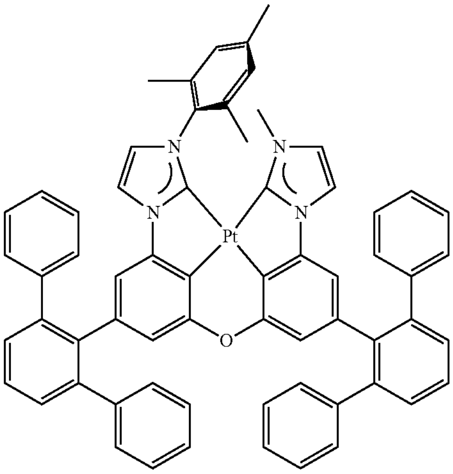
D98
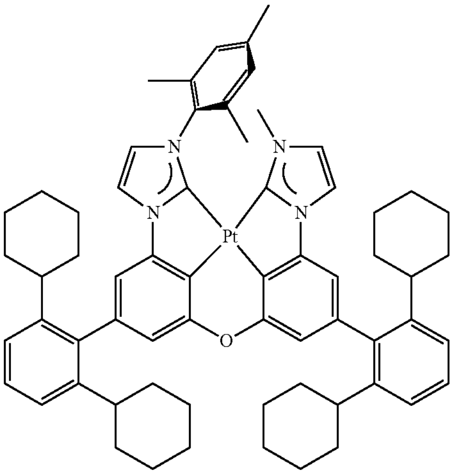
-continued
D99
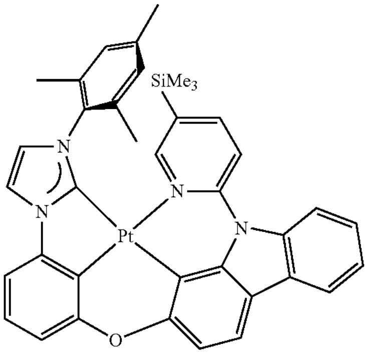
D100
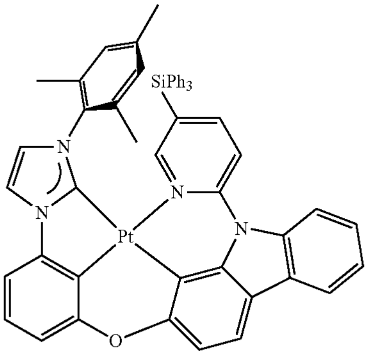
.
In one or more embodiments, the second compound may be selected from Compounds H2-1 to H2-64:
H2-1
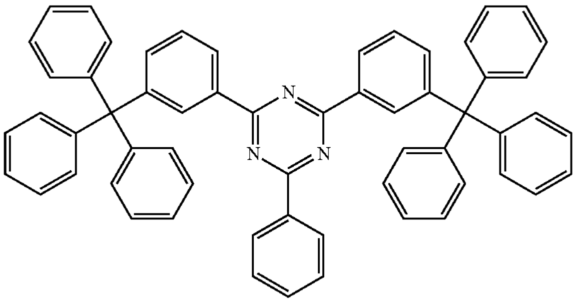
H2-2
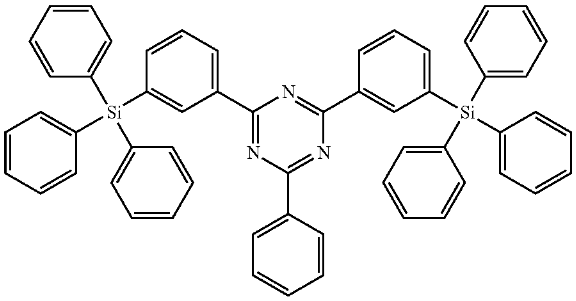

-continued
H2-3
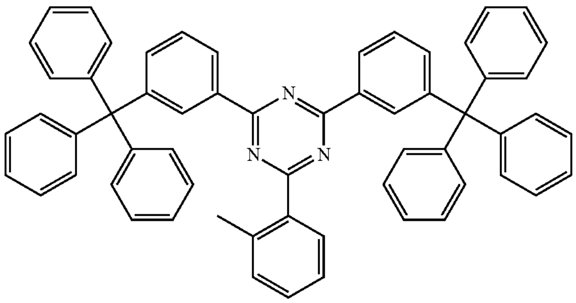
H2-4
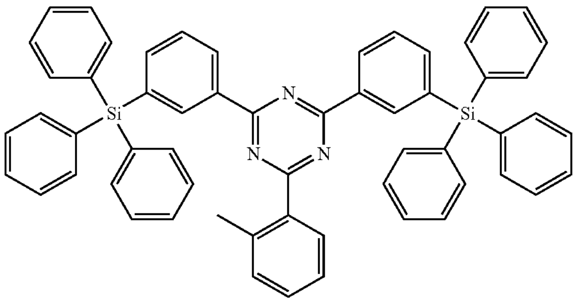
H2-5
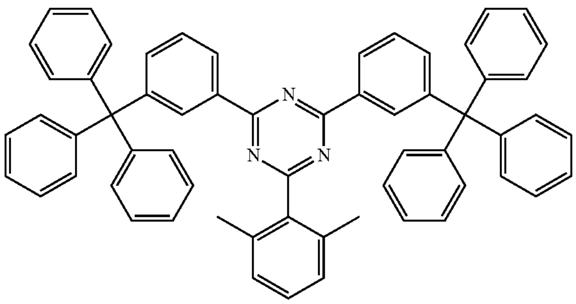
H2-6
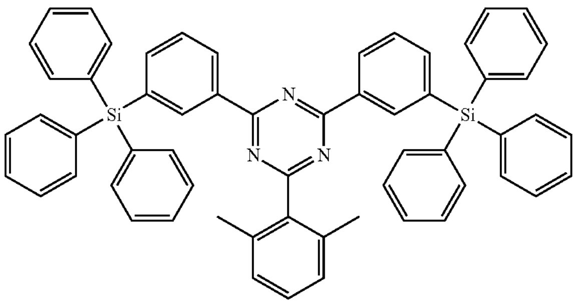
-continued
H2-7
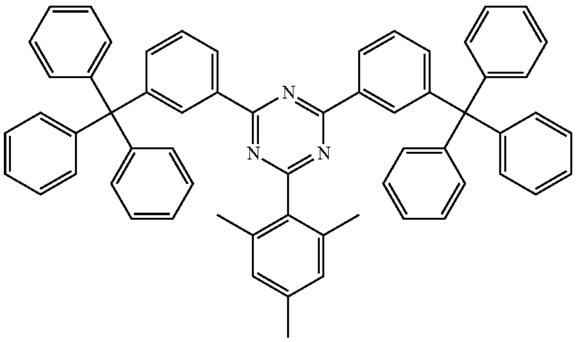
H2-8
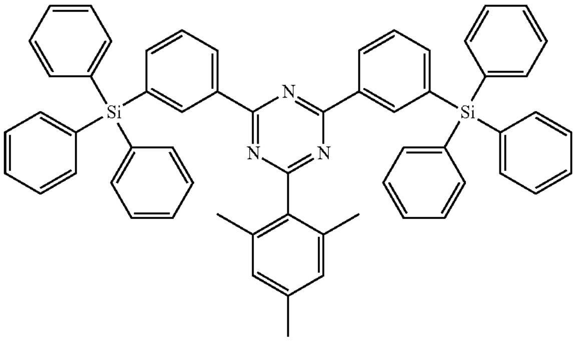
H2-9
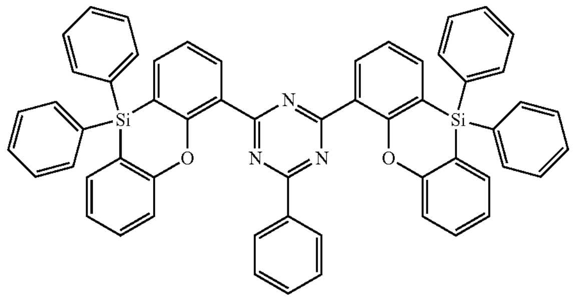
H2-10
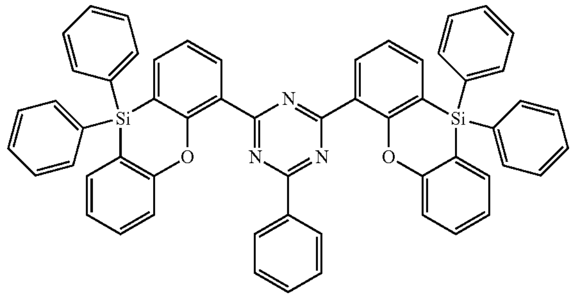

H2-11
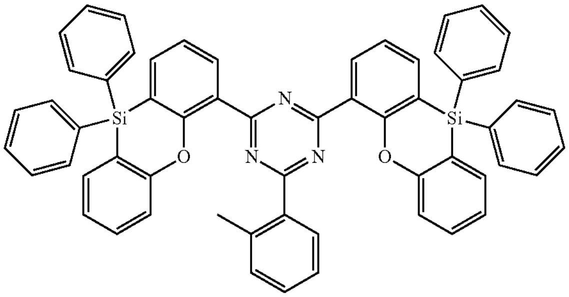
H2-12
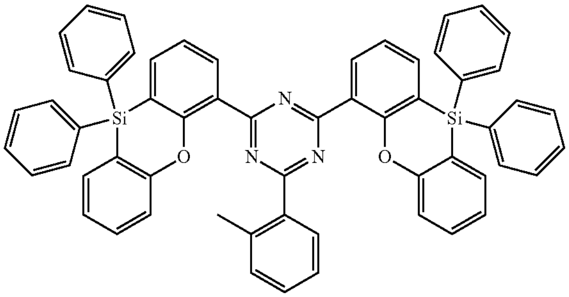
H2-13
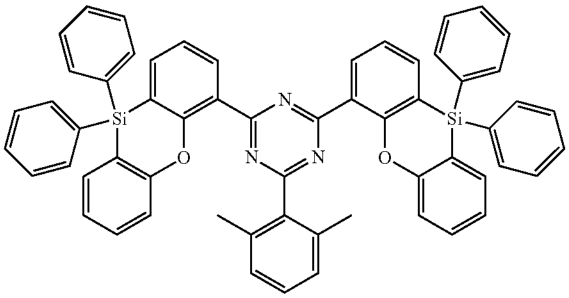
H2-14
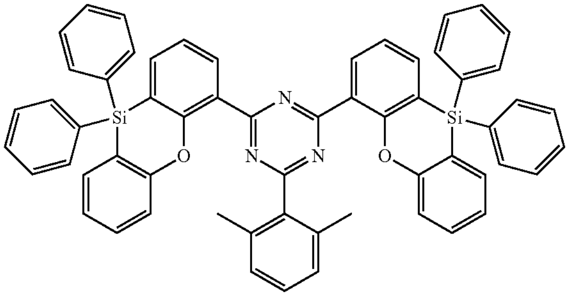
H2-15
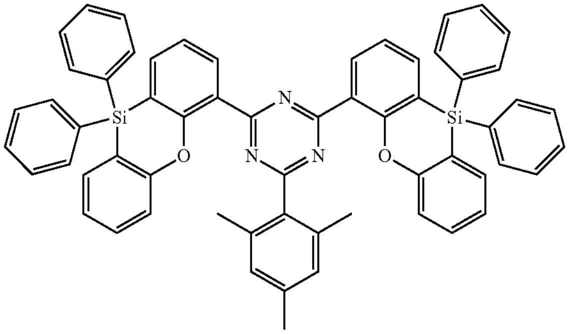
H2-16
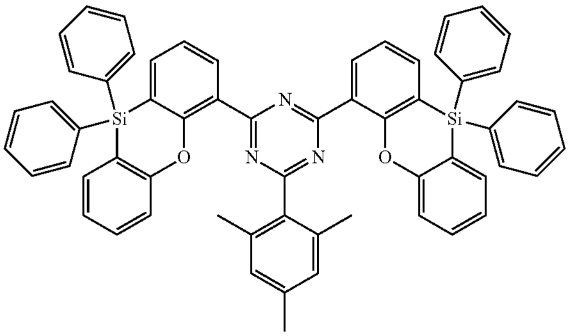
H2-17
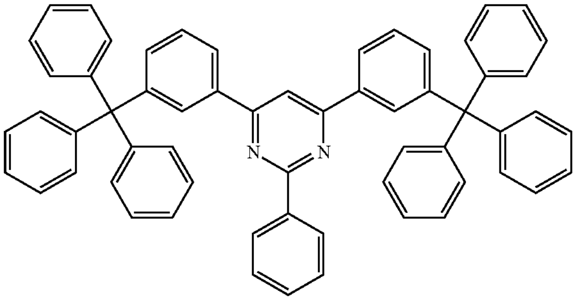
H2-18
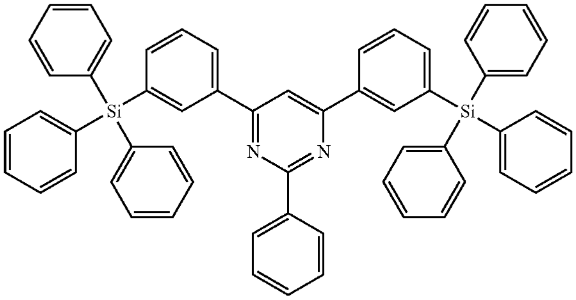
H2-19
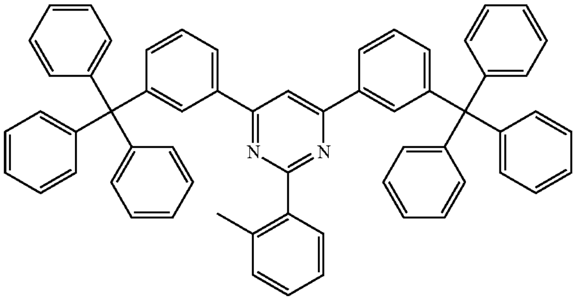

-continued
H2-20
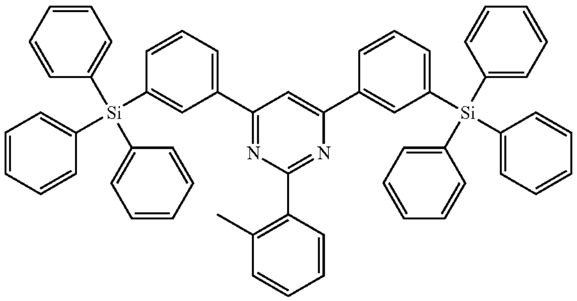
H2-21
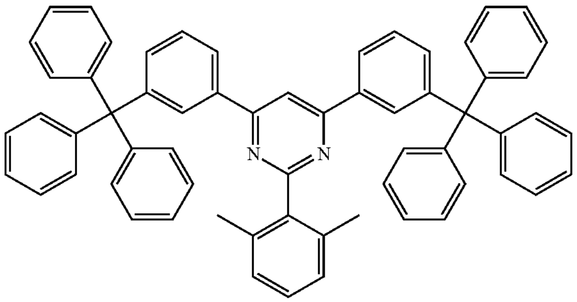
H2-22
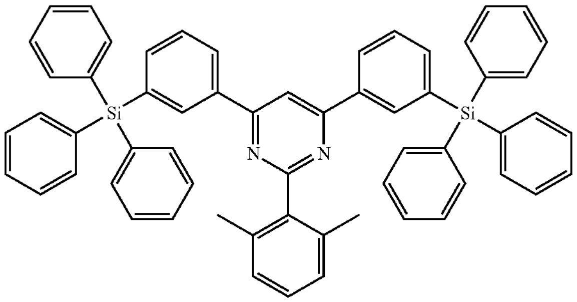
H2-23
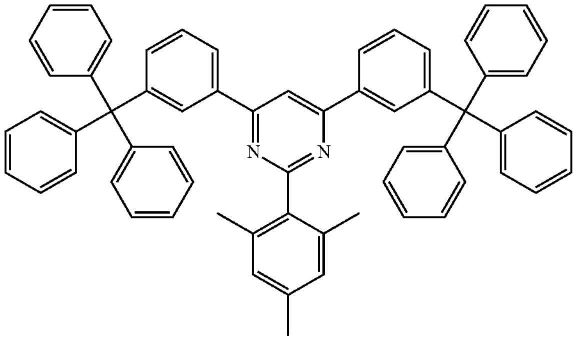
-continued
H2-24
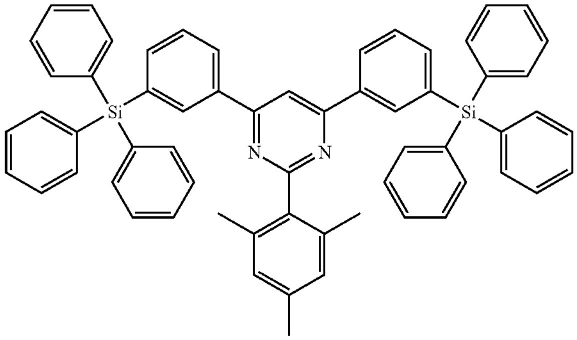
H2-25
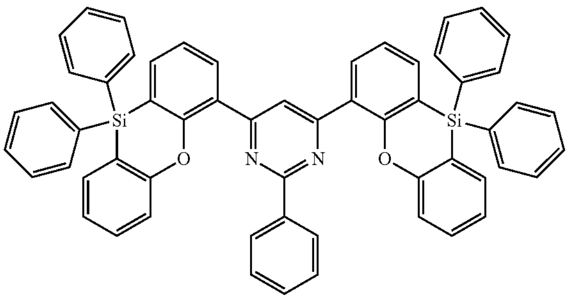
H2-26
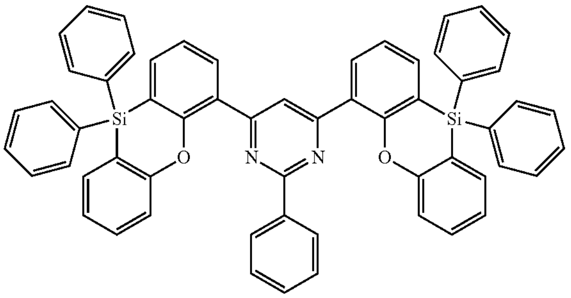
H2-27
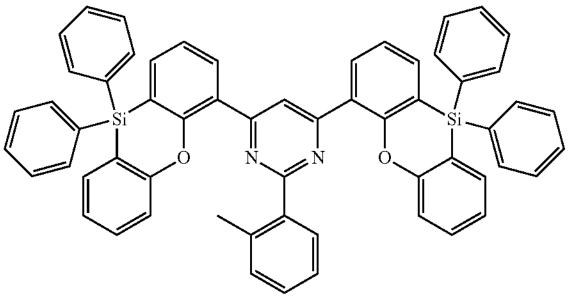
H2-28
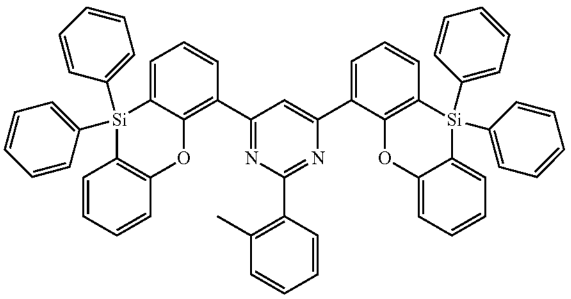

-continued
H2-29
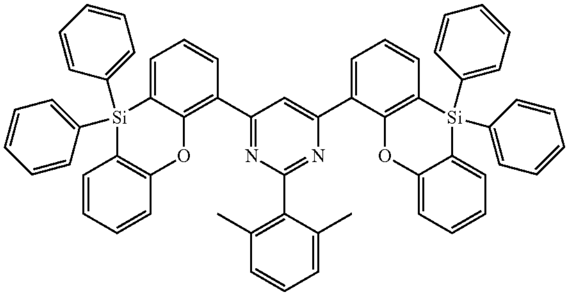
H2-30
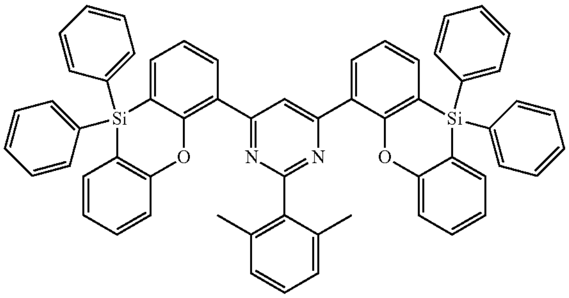
H2-31
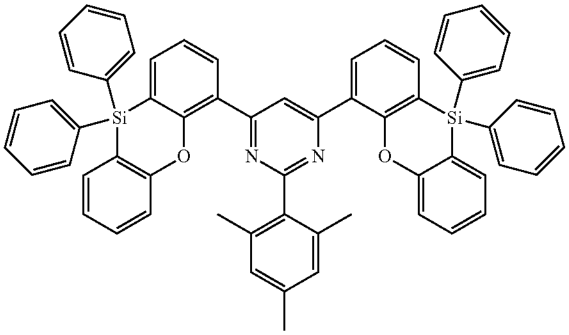
H2-32
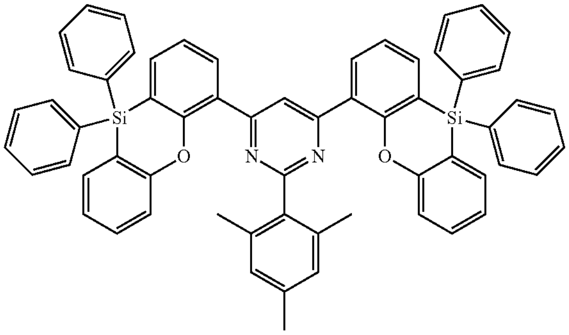
-continued
H2-33
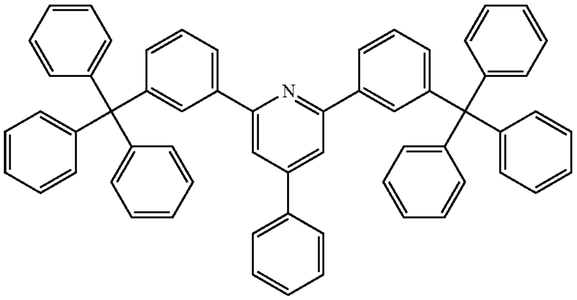
H2-34
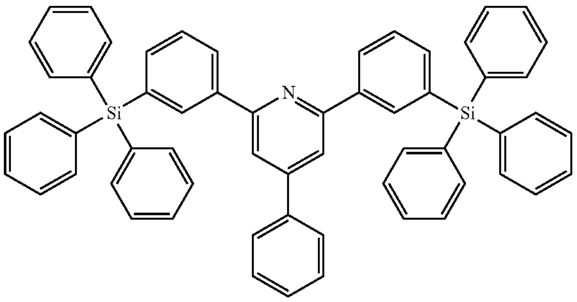
H2-35
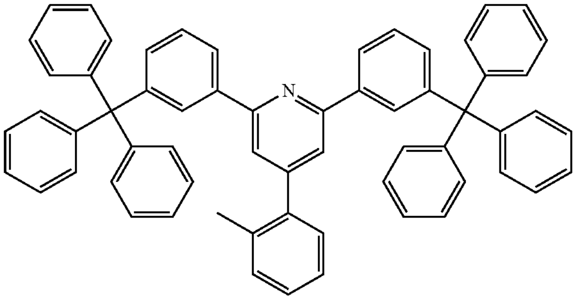
H2-36
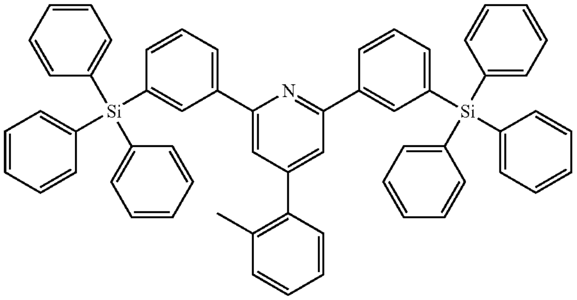
H2-37
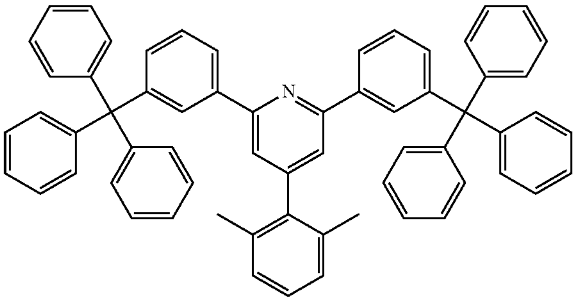

-continued
H2-38
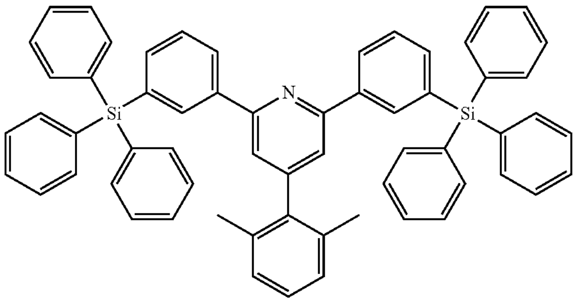
H2-39
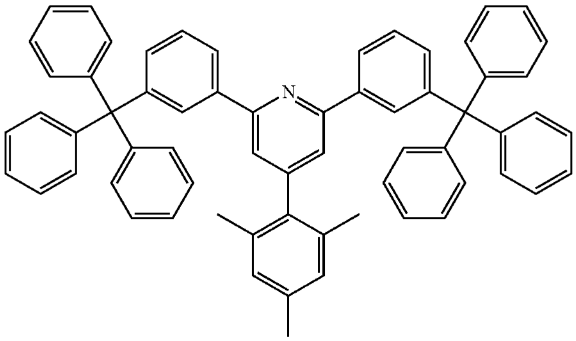
H2-40
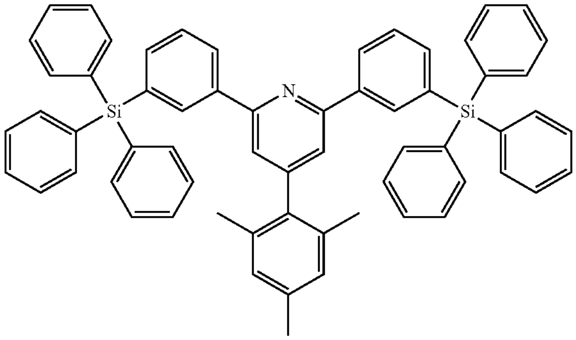
H2-41
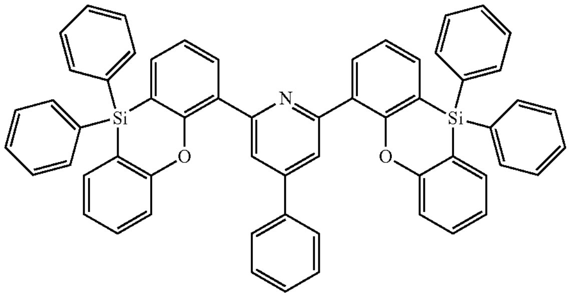
-continued
H2-42
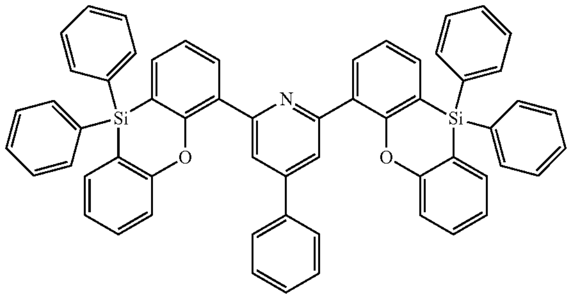
H2-43
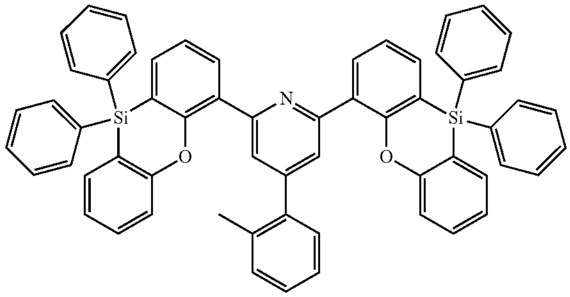
H2-44
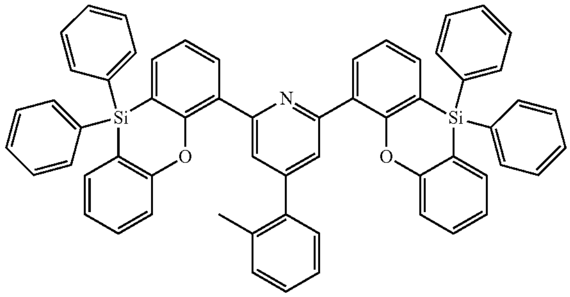
H2-45
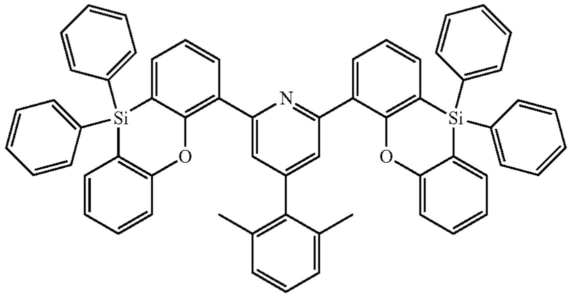
H2-46
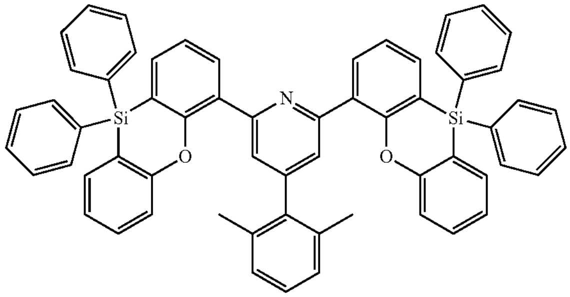

-continued
H2-47
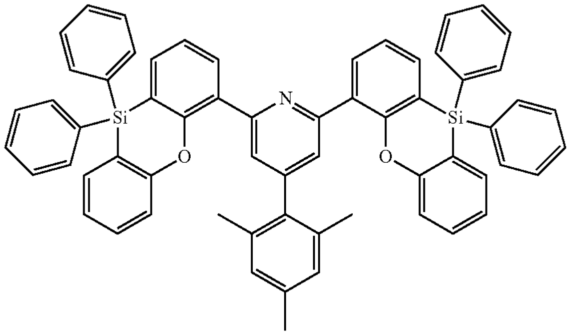
H2-48
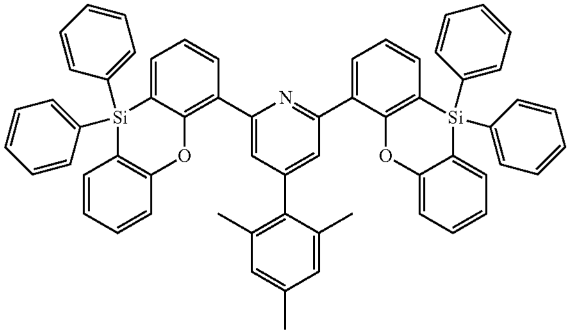
H2-49
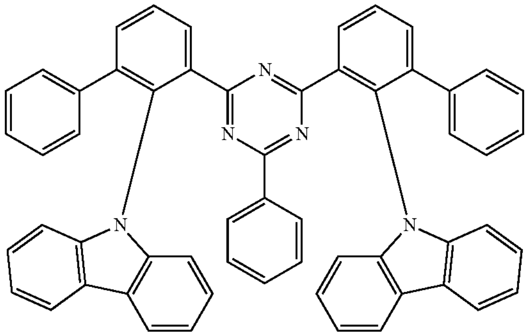
H2-50
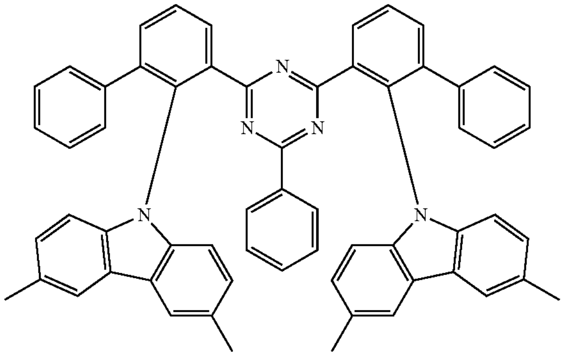
-continued
H2-51
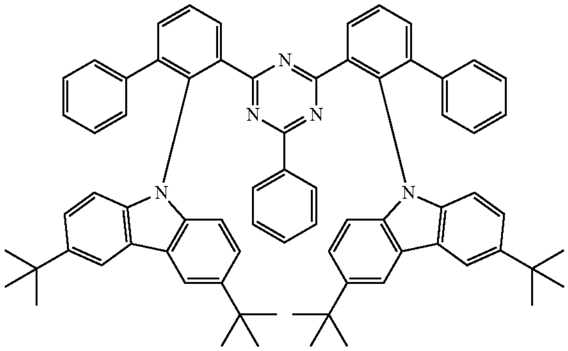
H2-52
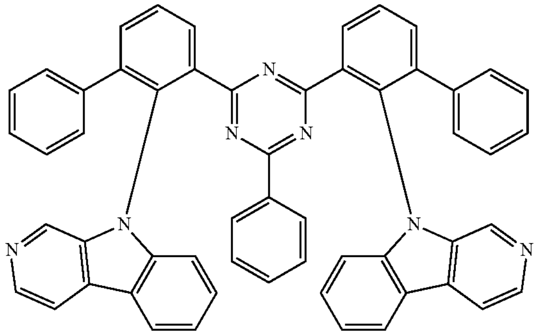
H2-53
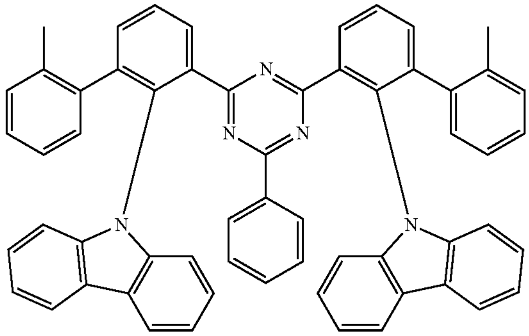
H2-54
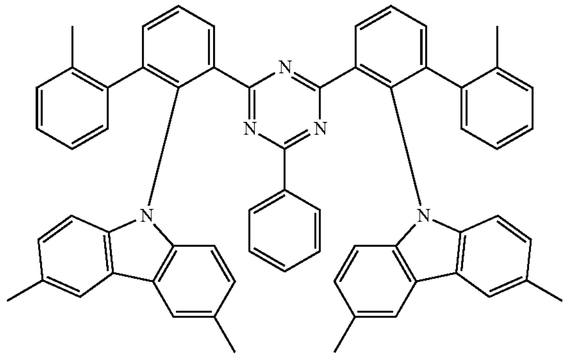

-continued
H2-55
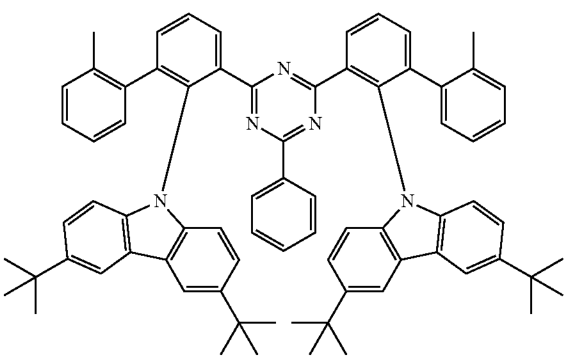
H2-56
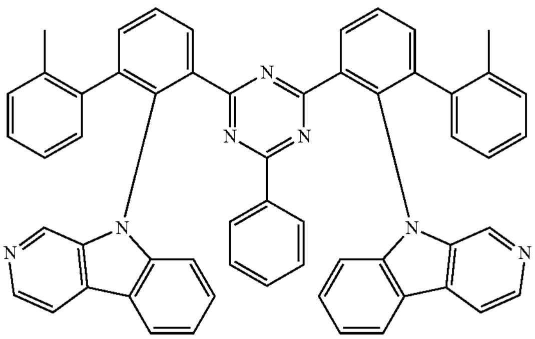
H2-57
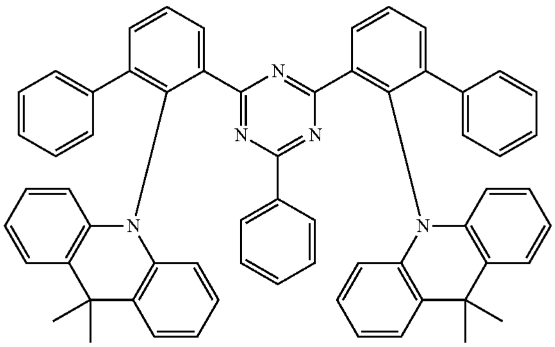
H2-58
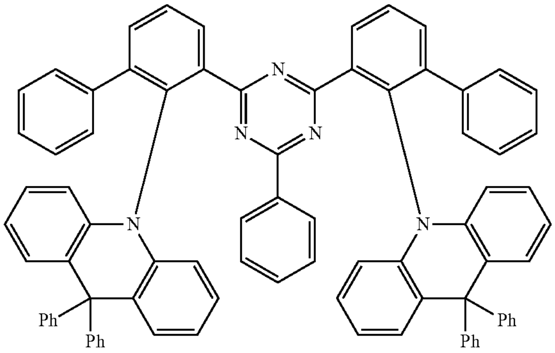
-continued
H2-59
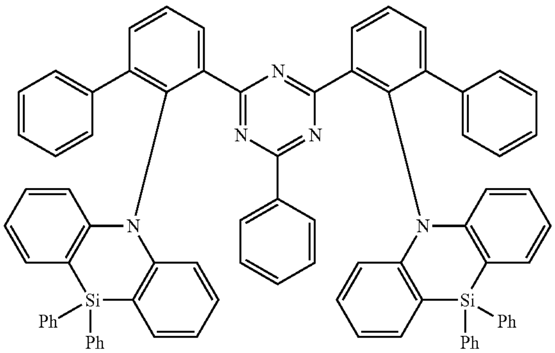
H2-60
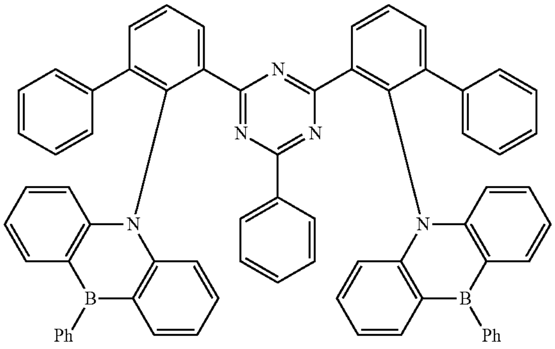
H2-61
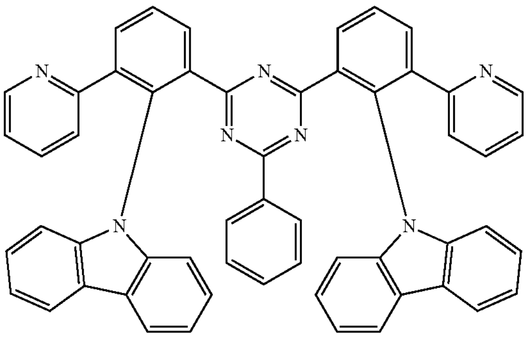
H2-62
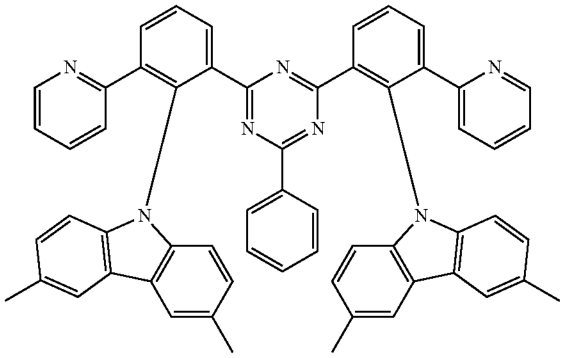

H2-63
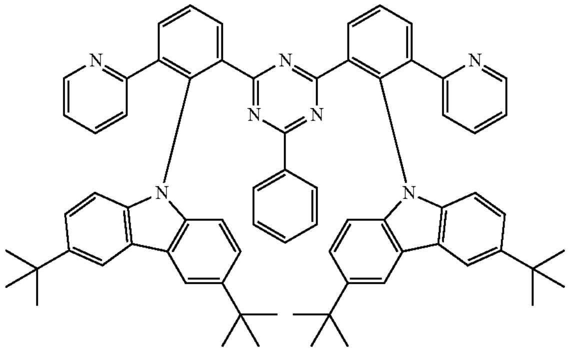
H2-64
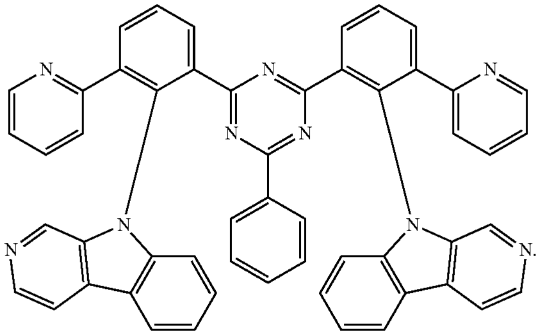
In one or more embodiments, the third compound may be selected from Compounds H3-1 to H3-28:
H3-1
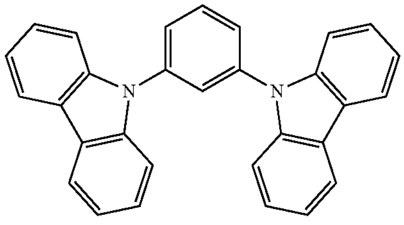
H3-2
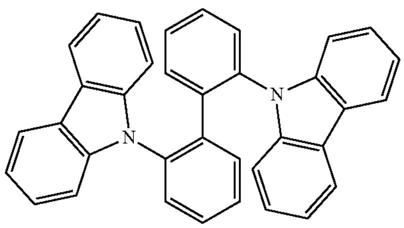
H3-3
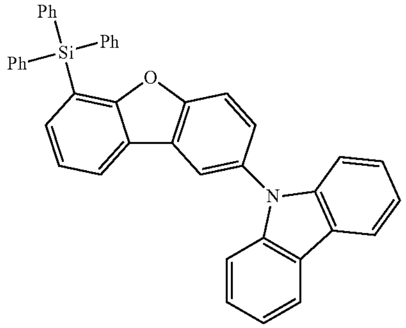
H3-4
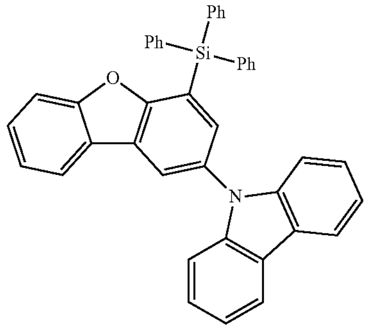
H3-5
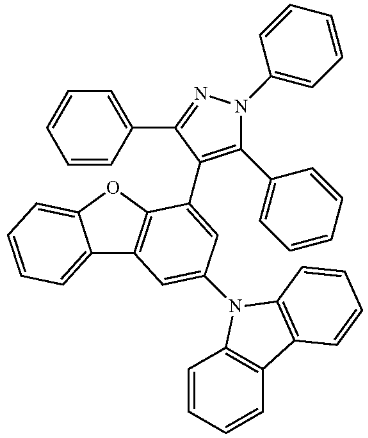
H3-6
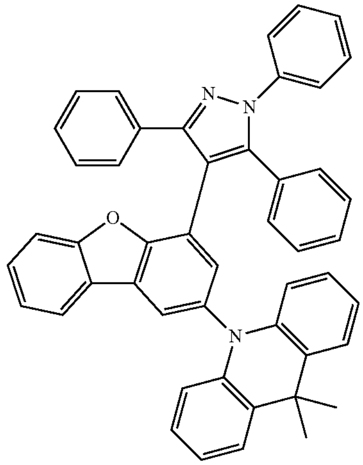

-continued
H3-7
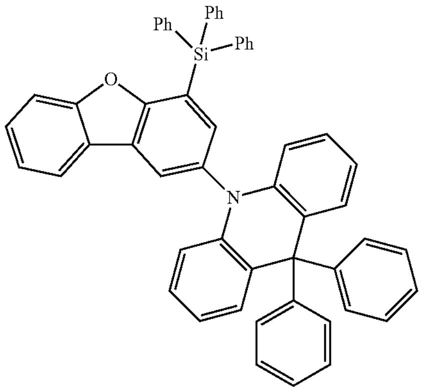
H3-8
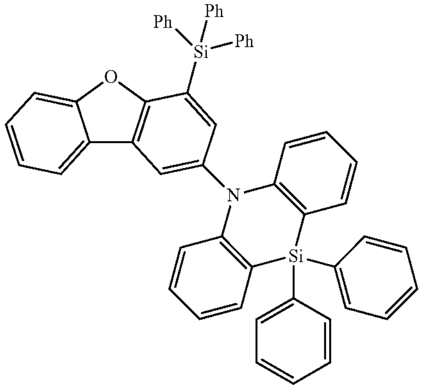
H3-9
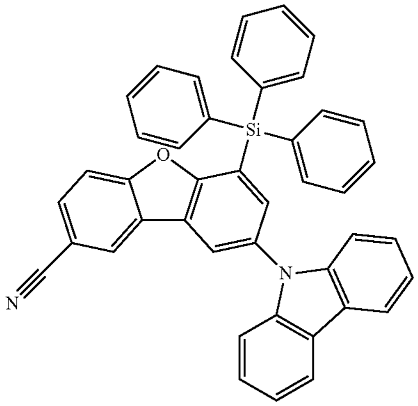
H3-10
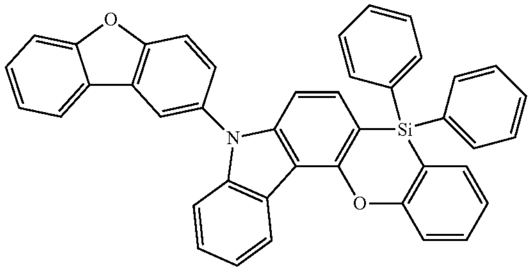
-continued
H3-11
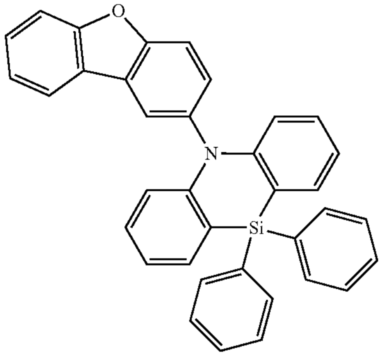
H3-12
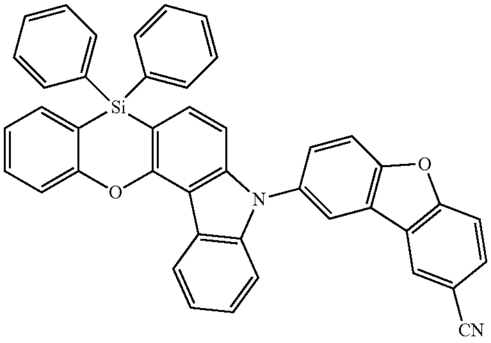
H3-13
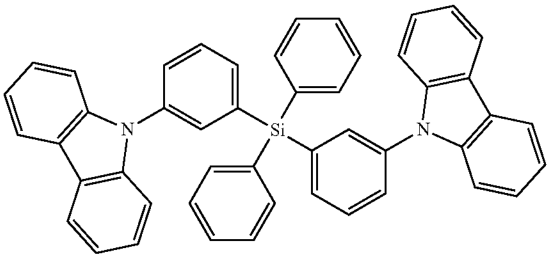
H3-14
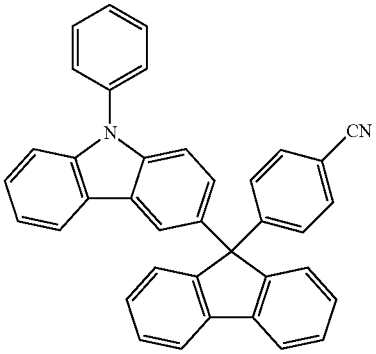

-continued
H3-15
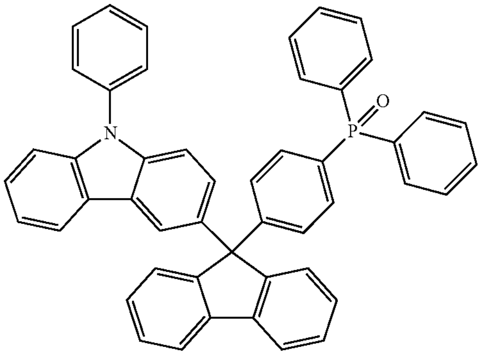
H3-16
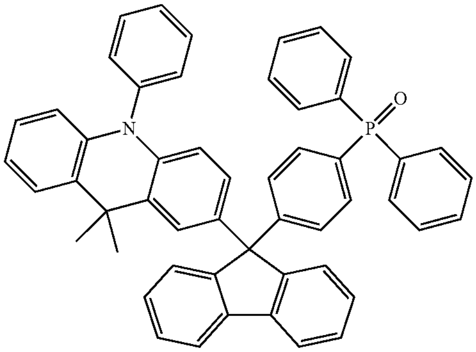
H3-17
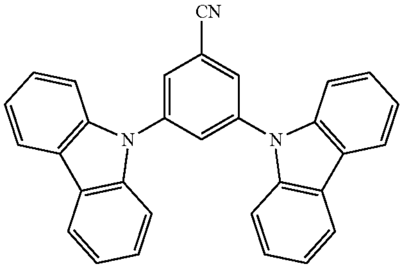
H3-18
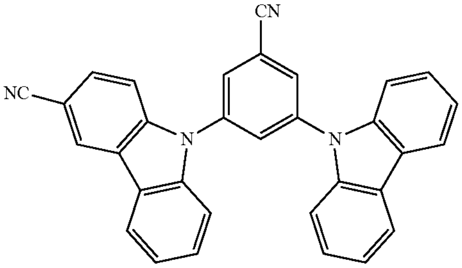
H3-19
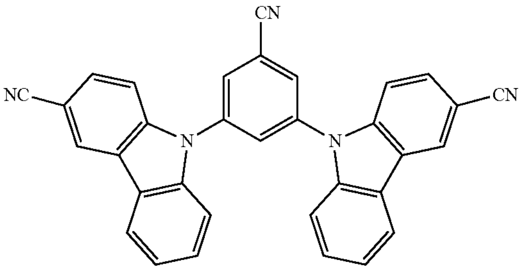
-continued
H3-20
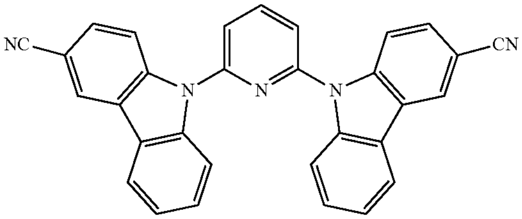
H3-21
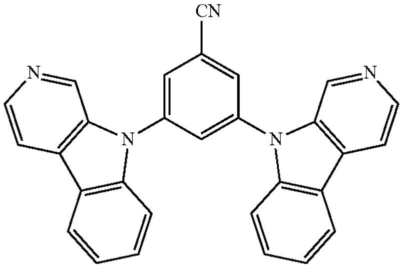
H3-22
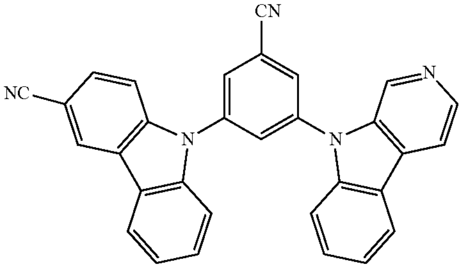
H3-23
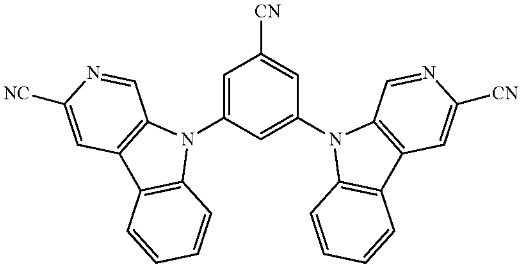
H3-24
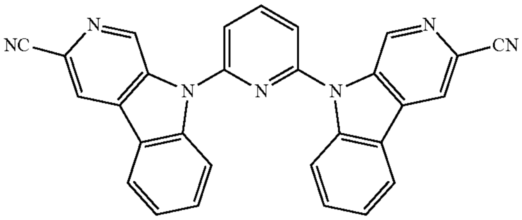
H3-25
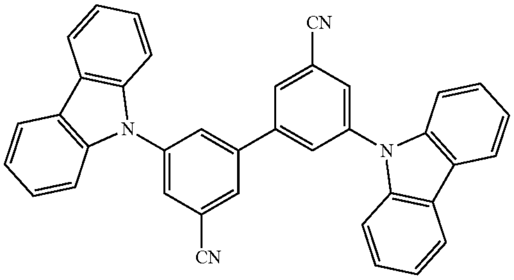

-continued

H3-26

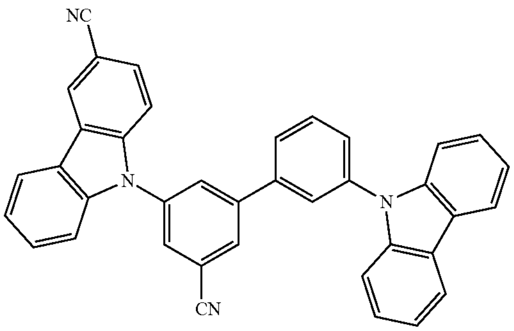

H3-27

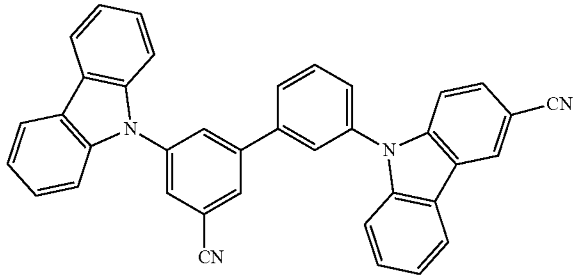

H3-28

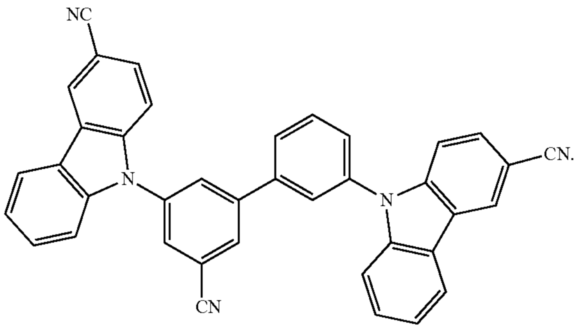

In one embodiment, a weight ratio of the second compound to the third compound may be in a range of 1:9 to 9:1, 2:8 to 8:2, 3:7 to 7:3 or 4:6 to 6:4, but embodiments of the present disclosure are not limited thereto.

In one embodiment, the organic light-emitting device may satisfy at least one of Condition 1 to Condition 4:

lowest unoccupied molecular orbital (LUMO) energy level (eV) of third compound>LUMO energy level (eV) of first compound  Condition 1

LUMO energy level (eV) of first compound>LUMO energy level (eV) of second compound  Condition 2 highest occupied molecular orbital (HOMO) energy level (eV) of first compound>HOMO energy level (eV) of third compound  Condition 3

HOMO energy level (eV) of third compound>HOMO energy level (eV) of second compound  Condition 4

The HOMO energy levels and the LUMO energy levels of the first compound, the second compound, and the third compound are negative values and may actually be measured by any suitable method available in the art, for example, a method described in Evaluation Example.

In one or more embodiments, an absolute value of a difference between the LUMO energy level of the first compound and the LUMO energy level of the second compound may be 0.1 eV to 1.0 eV, an absolute value of a difference between the LUMO energy level of the first compound and the LUMO energy level of the third compound may be 0.1 eV to 1.0 eV, an absolute value of a difference between the HOMO energy level of the first compound and the HOMO energy level of the second compound may be 1.25 eV or less (for example, 0.2 eV to 1.25 eV), and an absolute value of a difference between the HOMO energy level of the first compound and the HOMO energy level of the third compound may be 1.25 eV or less (for example, 0.2 eV to 1.25 eV).

As described above, when the relationship between the LUMO energy level and the HOMO energy level is satisfied, a suitable balance of hole and electron injections into the emission layer may be achieved.

The emission layer of the organic light-emitting device includes:

1) a first compound represented by Formula 1 (Formula 1 has a tetradentate ligand, and M in Formula 1 is a transition metal, but is not iridium);
2) a second compound represented by Formula 2 (in Formula 2, a bond between $L_{51}$ and ring $CY_{51}$, a bond between $L_{52}$ and ring $CY_{52}$, a bond between $L_{53}$ and ring CY53, a bond between two or more $L_{51}$(s), a bond between two or more $L_{52}$(s), a bond between two or more $L_{53}$(s), a bond between $L_{51}$ and carbon between $X_{54}$ and $X_{55}$ in Formula 2, a bond between $L_{52}$ and carbon between $X_{54}$ and $X_{56}$ in Formula 2, and a bond between $L_{53}$ and carbon between $X_{55}$ and $X_{56}$ in Formula 2 are each a "carbon-carbon" single bond); and
3) a third compound including a group represented by Formula 3 that is different from Formulae 1 and 2.

Therefore, it is possible to implement an organic light-emitting device having high luminescent efficiency and a long lifespan, since an exciplex is effectively formed between the first compound and the second compound.

A decay time of delayed fluorescence in a time-resolved electroluminescence (TREL) spectrum of the organic light-emitting device is about 50 ns or more, for example, 50 ns to 10 μs. In one embodiment, the decay time of the delayed fluorescence in the TREL spectrum of the organic light-emitting device may be 1.4 μs to 4 μs or 1.5 μs to 3 μs. When the decay time of the delayed fluorescence of the organic light-emitting device satisfies the above-described range, the time when the first compound exists in an excited state is relatively reduced so that the organic light-emitting device may have high luminescent efficiency and a long lifespan.

In one embodiment, the organic light-emitting device may have a non-resonance structure, the electroluminescence (EL) spectrum of the organic light-emitting device includes a first peak and a second peak, the maximum emission wavelength of the second peak is greater than the maximum emission wavelength of the first peak, a difference between the maximum emission wavelength of the second peak and the maximum emission wavelength of the first peak may be in a range of about 5 nm to about 30 nm (for example, in a range of about 5 nm to about 20 nm or about 5 nm to about 10 nm), and the intensity of the second peak may be smaller than the intensity of the first peak. When the difference between the maximum emission wavelength of the second peak and the maximum emission wavelength of the first peak satisfies the above-described range, it is possible to implement an organic light-emitting device having excellent color purity (for example, a blue organic light-emitting device having excellent color purity).

The maximum emission wavelength of the first peak may be in a range of about 390 nm to about 500 nm (for example, 430 nm to 470 nm). Therefore, the organic light-emitting device may emit blue light having excellent color purity (for example, deep blue light).

The first peak may be an emission peak of phosphorescence emitted from the first compound, and the second peak may be an emission peak of an exciplex formed from the first compound and the second compound.

The intensity of the second peak may be in a range of about 20% to about 90% of the intensity of the first peak. When the intensity of the second peak and the intensity of the first peak satisfy the above-described ranges, the emission efficiency of phosphorescence emitted from the first compound is not reduced, and the time when the first compound exists in the excited state is effectively controlled by the exciplex emitting the light of the second peak, thereby implementing an organic light-emitting device having high luminescent efficiency and a long lifespan.

Another aspect of an embodiment provides an organic light-emitting device including:

a first electrode;

a second electrode facing the first electrode; and an emission layer disposed between the first electrode and the second electrode, wherein the emission layer includes a first compound, a second compound, and a third compound, the first compound, the second compound, and the third compound may be different from one another, an amount of the first compound may be smaller than a total amount of the second compound and the third compound, the first compound may be an iridium-free organometallic compound (e.g., the organometallic compound may contain no iridium), the second compound may include at least one group selected from a pyridine group, a pyrimidine group, a pyridazine group, a pyrazine group, a triazine group, and a tetrazine group, the first compound and the second compound may form an exciplex, and a decay time of delayed fluorescence in a TREL spectrum may be about 50 ns or more (for example, 50 ns to 10 μs, 1.4 μs to 4 μs, or 1.5 μs to 3 μs). When the decay time of the delayed fluorescence of the organic light-emitting device satisfies the above-described range, the time when the first compound exists in the excited state is relatively reduced so that the organic light-emitting device may have high luminescent efficiency and a long lifespan.

In the organic light-emitting device, the first compound may be an organometallic compound having a tetradentate ligand and Pt, Pd, or Au as a core metal.

The organic light-emitting device may have a non-resonance structure, and

An EL spectrum of the organic light-emitting device may include a first peak and a second peak, the maximum emission wavelength of the second peak may be greater than the maximum emission wavelength of the first peak, a difference between the maximum emission wavelength of the second peak and the maximum emission wavelength of the first peak may be in a range of about 5 nm to about 30 nm, and the intensity of the second peak may be smaller than the intensity of the first peak. The first peak and the second peak are the same as described above.

The first compound, the second compound, and the third compound are the same as described above.

Another aspect of an embodiment provides an electronic apparatus including the organic light-emitting device. The electronic apparatus may further include a thin film transistor. For example, the electronic apparatus may further include a thin film transistor including a source electrode and a drain electrode, and the first electrode of the organic light-emitting device may be electrically coupled to (e.g., electrically connected to) the source electrode or the drain electrode.

Description of FIG. 1

FIG. 1 is a schematic view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

First Electrode 110

In FIG. 1, a substrate may be additionally disposed under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode 110 may be selected from indium tin oxide (ITO), indium zinc oxide (IZO), tin oxide ($SnO_2$), zinc oxide (ZnO), and any combinations thereof, but embodiments of the present disclosure are not limited thereto. When the first electrode 110 is a semi-transmissive electrode or a reflective electrode, as a material for forming the first electrode 110, magnesium (Mg), silver (Ag), aluminum (Al), aluminum-lithium (Al—Li), calcium (Ca), magnesium-indium (Mg—In), magnesium-silver (Mg—Ag), or any combination thereof may be used. However, the material for forming the first electrode 110 is not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 is disposed on the first electrode 110. The organic layer 150 may include an emission layer.

The organic layer 150 may include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in this stated order, but the structure of the hole transport region is not limited thereto.

The hole transport region may include at least one selected from m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

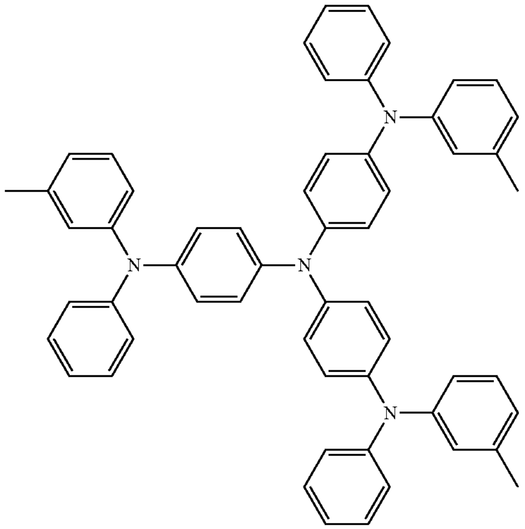

m-MTDATA

-continued

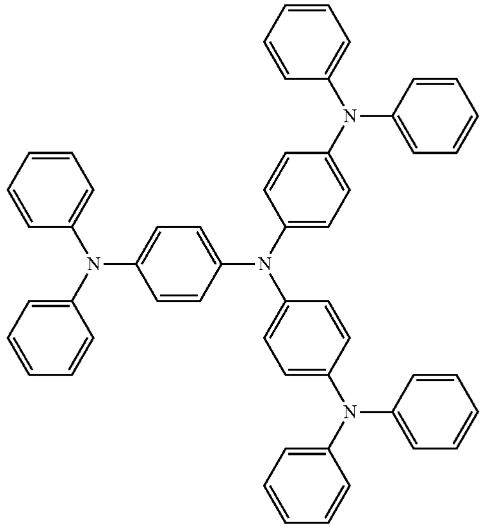

TDATA

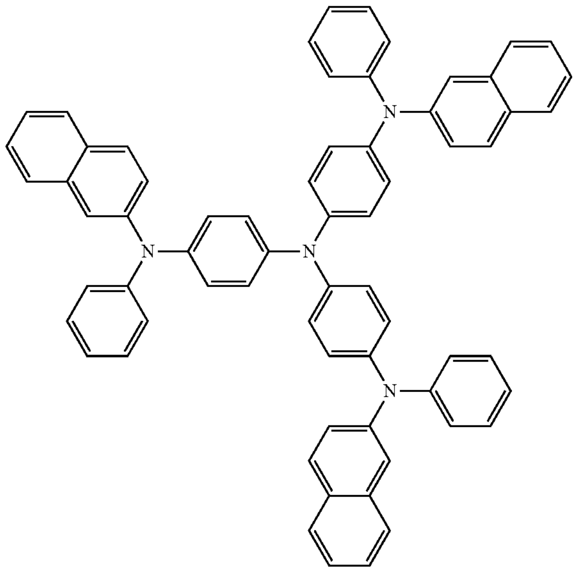

2-TNATA

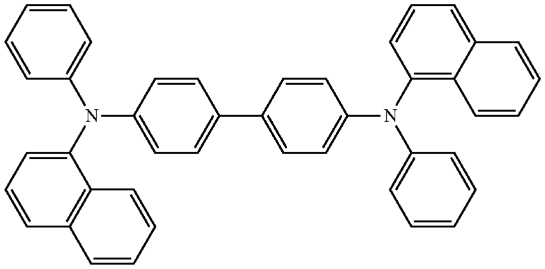

NPB

-continued

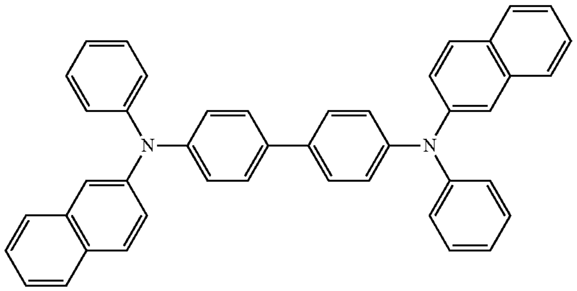

β-NPB

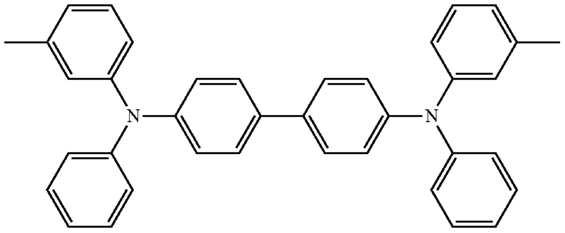

TPD

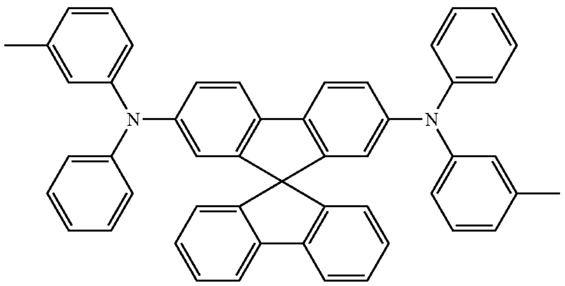

Spiro-TPD

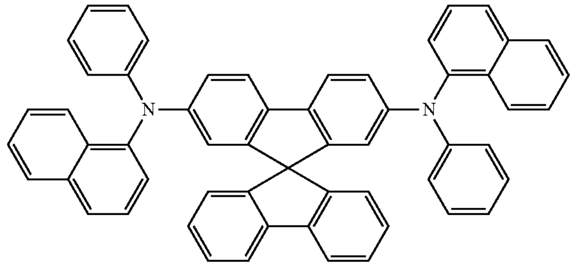

Spiro-NPB

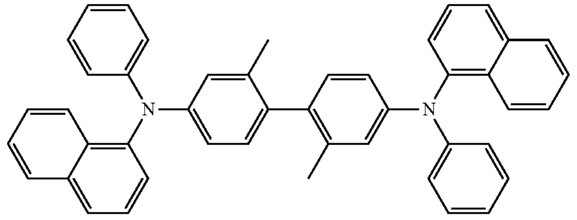

methylated NPB

-continued

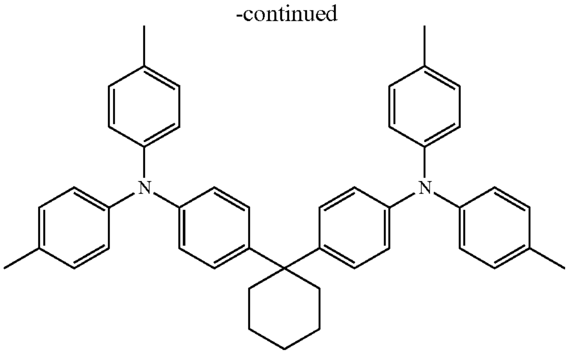

TAPC

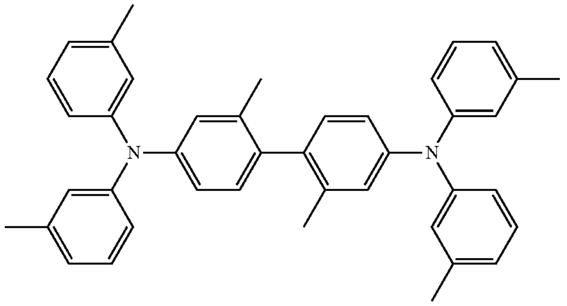

HMTPD

Formula 201

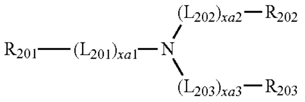

Formula 202

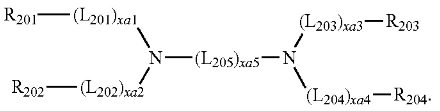

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*, *—N($Q_{201}$)-*, a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer of 0 to 3, xa5 may be an integer of 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked via a single bond, a dimethyl-methylene group, or a diphenyl-methylene group, $R_{203}$ and $R_{204}$ may optionally be linked via a single bond, a dimethyl-methylene group, or a diphenyl-methylene group.

In one or more embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, -a phenyl group substituted with a $C_1$Calkyl group$_{10}$, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a —$C_1$C alkyl$_{10}$ group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$, to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, -a phenyl group substituted with a $C_1$Calkyl$_{10}$ group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may respective be the same as defined above.

In one or more embodiments, in Formula 201, at least one selected from $R_{201}$ to $R_{203}$ may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, -a phenyl group substituted with a $C_1$Calkyl group$_{10}$, a phenyl group substituted with —F, a naphthyl group, a fluorenyl group, a spiro-bifluorenyl group, a carbazolyl group, a dibenzofuranyl group, and a dibenzothiophenyl group;

but embodiments of the present disclosure are not limited thereto.

In one or more embodiments, in Formula 202, i) $R_{201}$ and $R_{202}$ may be linked via a single bond, and/or ii) $R_{203}$ and $R_{204}$ may be linked via a single bond.

In one or more embodiments, in Formula 202, at least one selected from $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl-group substituted with a $C_1$Calkyl group$_{10}$, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

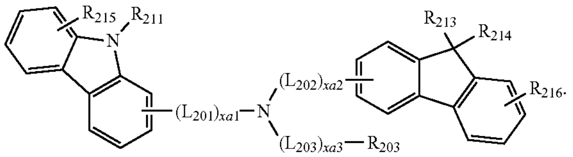

In one embodiment, the compound represented by Formula 201 may be represented by Formula 201A(1) below, but embodiments of the present disclosure are not limited thereto:

Formula 201A(1)

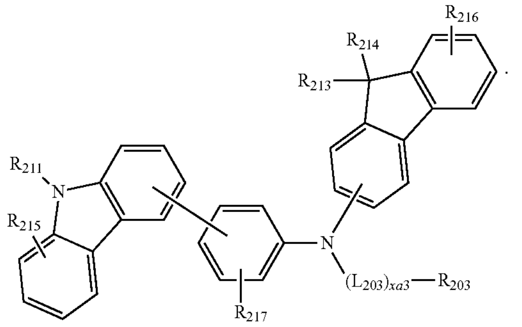

In one embodiment, the compound represented by Formula 201 may be represented by Formula 201A-1 below, but embodiments of the present disclosure are not limited thereto:

Formula 201A-1

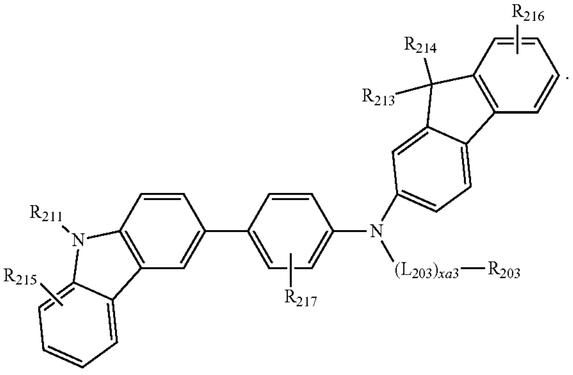

In one embodiment, the compound represented by Formula 202 may be represented by Formula 202A:

Formula 202A

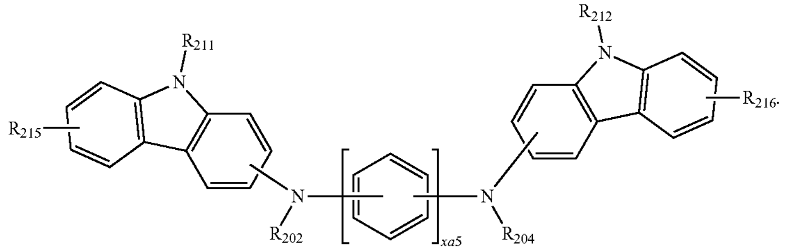

In one embodiment, the compound represented by Formula 202 may be represented by Formula 202A-1:

Formula 202A-1

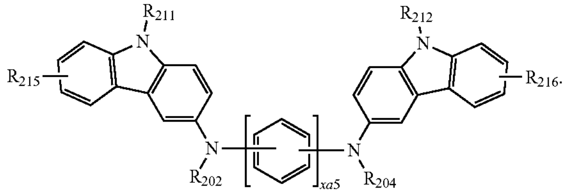

In Formulae 201A, 201A(1), 201A-1, 202A, and 202A-1, $L_{201}$ to $L_{203}$, xa1 to xa3, xa5, and $R_{202}$ to $R_{204}$ may respectively be the same as defined above, $R_{211}$ and $R_{212}$ may respectively be the same as defined in connection with $R_{203}$.

$R_{213}$ to $R_{217}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl-group substituted with a $C_1$Calkyl $group_{10}$, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 9,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) energy level of about −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNO) and 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN); and a compound represented by Formula 221, but embodiments of the present disclosure are not limited thereto:

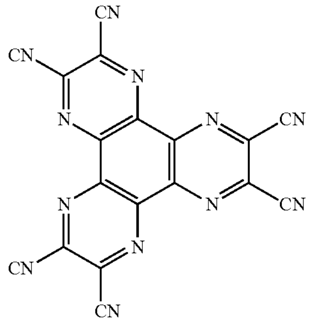

HAT-CN

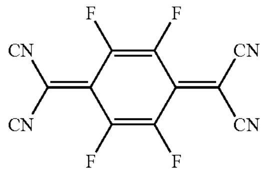

F4-TCNQ

Formula 221

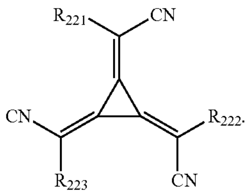

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$alkyl group substituted with —F, a $C_1$-$C_{20}$ alkyl group substituted with —$C_1$, a $C_1$-$C_{20}$alkyl group substituted with —Br, and a $C_1$-$C_{20}$ alkyl group substituted with —I.

[Emission Layer in Organic Layer 150]

The emission layer may include a host and a dopant. The host and the dopant may be the same as described above.

In the emission layer, an amount of the dopant may be in a range of about 0.01 parts to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The hole transport region may include the second compound as described above.

In one embodiment, the hole transport region may include a buffer layer. The buffer layer may directly contact the emission layer, and may include the second compound.

In one or more embodiments, the electron transport region may include a buffer layer, an electron transport layer, and an electron injection layer, which are stacked in this stated order on the emission layer, and the buffer layer may include the second compound as described above.

The electron transport region (for example, a hole blocking layer, an electron control layer, or an electron transport layer in the electron transport region) may include a metal-free compound containing at least one π electron-depleted nitrogen-containing ring.

The term "π electron-depleted nitrogen-containing ring," as used herein, indicates a $C_1$-$C_{60}$ heterocyclic group having at least one *—N=* moiety as a ring-forming moiety.

For example, the "π electron-depleted nitrogen-containing ring" may be i) a 5-membered to 7-membered heteromonocyclic group having at least one *—N=* moiety, ii) a heteropolycyclic group in which two or more 5-membered to 7-membered heteromonocyclic groups each having at least one *—N=*' moiety are condensed with each other (e.g., combined with each other), or iii) a heteropolycyclic group in which at least one of 5-membered to 7-membered heteromonocyclic groups, each having at least one *—N=* moiety, is condensed with (e.g., combined with) at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazol, an imidazopyridine, an imidazopyrmidine, and an azacarbazole, but are not limited thereto.

For example, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, $Q_{601}$ to $Q_{603}$ may each independently be a —$C_1C$ alkyl$_{10}$ group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and/or at least one of $R_{601}$(s) in the number of xe21 may include the Tr electron-depleted nitrogen-containing ring.

In one embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrmidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrmidine group, and an azacarbazole group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, and —$P(=O)(Q_{31})(Q_{32})$, and $Q_{31}$ to $Q_{33}$ may each independently be selected from a —$C_1C$ alkyl$_{10}$ group, a $C_1$-$C_1$ alkoxy group, a phenyl group, a biphenyl group, a terphenyl group, and a naphthyl group.

When xe11 in Formula 601 is two or more, two or more $Ar_{601}$(s) may be linked via a single bond.

In one or more embodiments, $Ar_{601}$ in Formula 601 may be an anthracene group.

In one or more embodiments, a compound represented by Formula 601 may be represented by Formula 601-1:

Formula 601-1

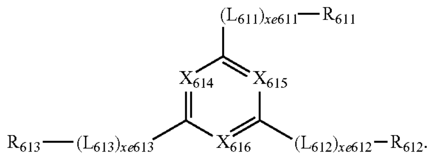

In Formula 601-1, $X_{614}$ may be N or $C(R_{614})$, $X_{615}$ may be N or $C(R_{615})$, and $X_{616}$ may be N or $C(R_{616})$, wherein at least one selected from $X_{614}$ to $X_{616}$ may be N, $L_{611}$ to $L_{613}$ may respectively be the same as defined in connection with $L_{601}$, xe611 to xe613 may respectively be the same as defined in connection with xe1, $R_{611}$ to $R_{613}$ may respectively be the same as defined in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formula 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a trazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —$S(=O)_2(Q_{601})$ and —$P(=O)(Q_{601})(Q_{602})$, and $Q_{601}$ and $Q_{602}$ may respectively be the same as defined above.

The electron transport region may include at least one compound selected from Compounds ET1 to ET36, but embodiments of the present disclosure are not limited thereto:

ET1

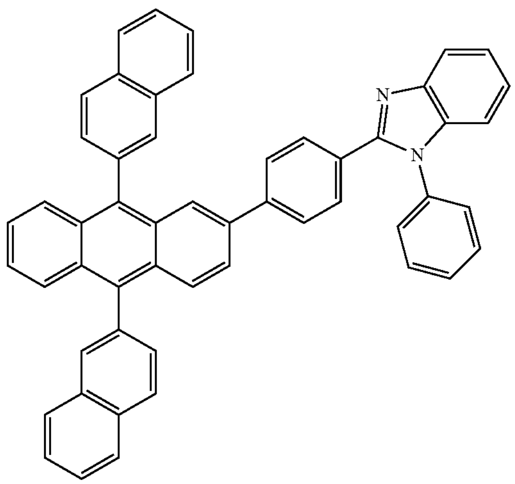

ET2

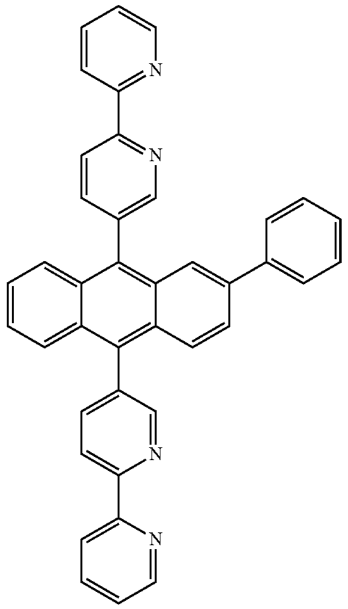

ET3

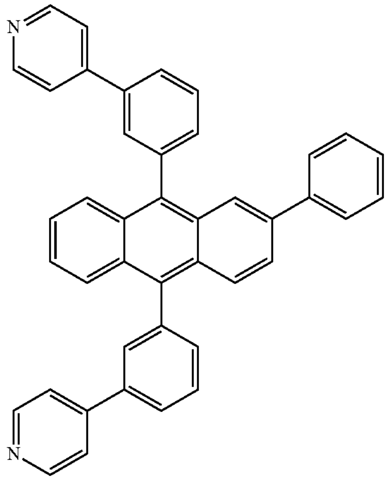

-continued
ET4
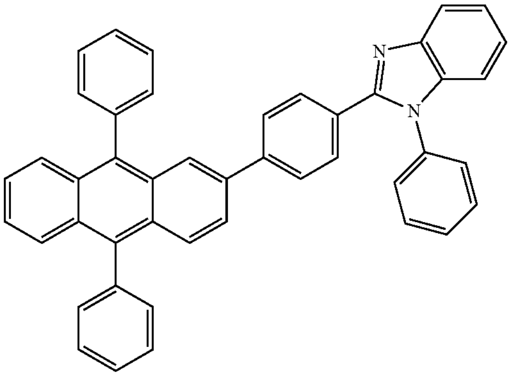
ET5
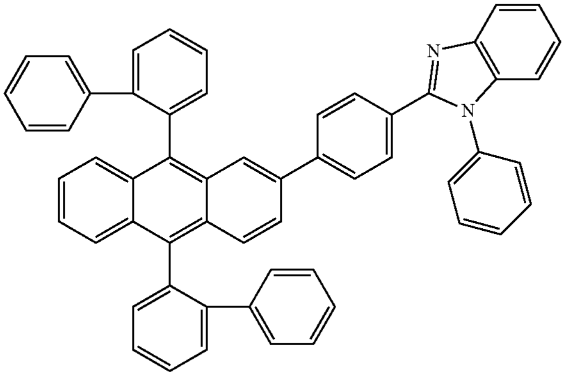
ET6
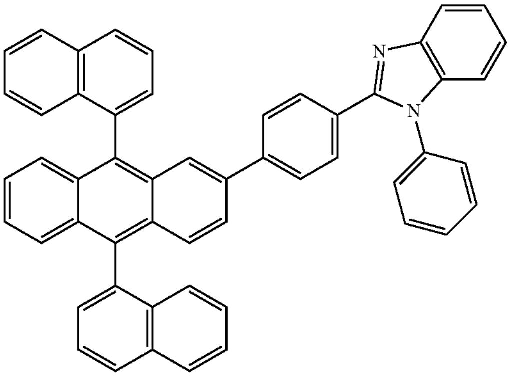
-continued
ET7
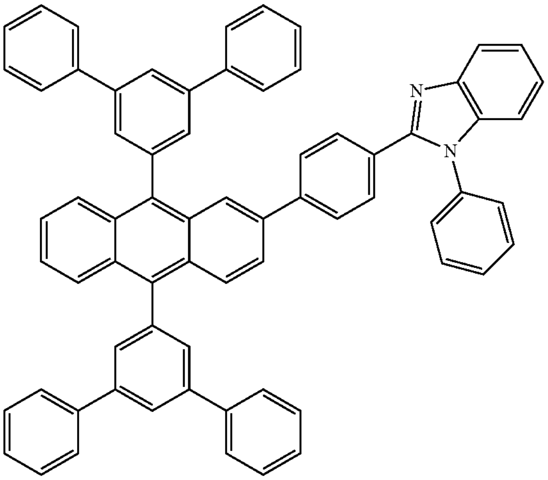
ET8
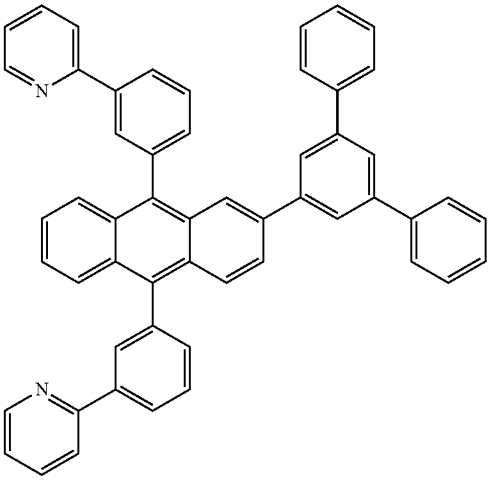
ET9
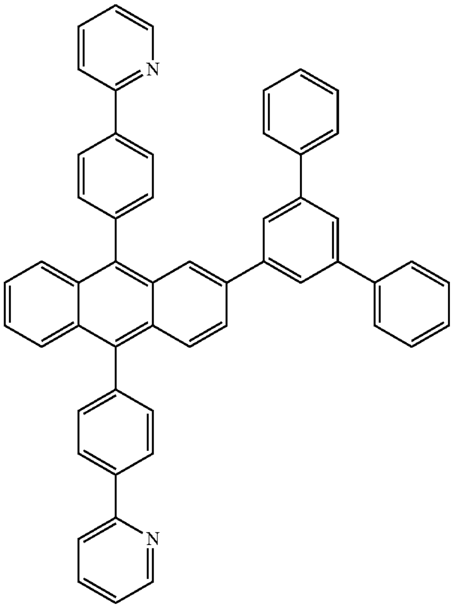

-continued
ET10
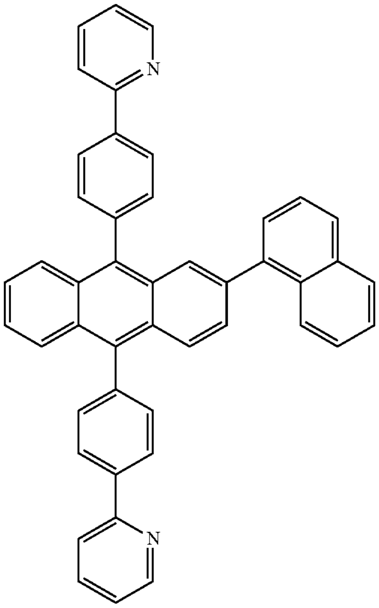
ET11
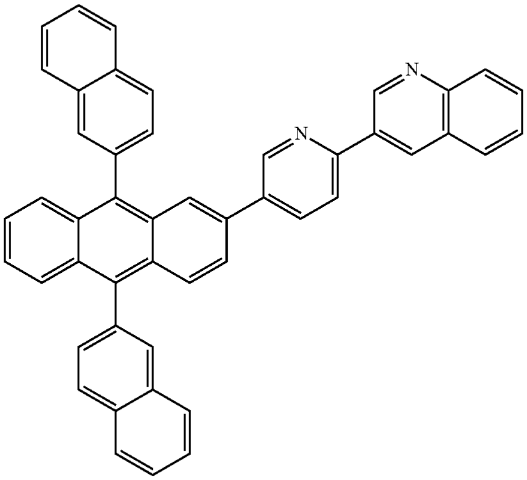
ET12
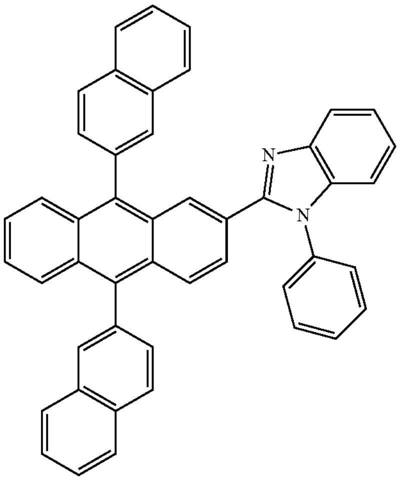
-continued
ET13
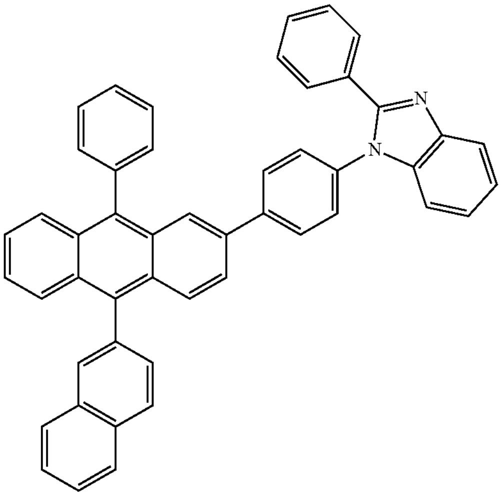
ET14
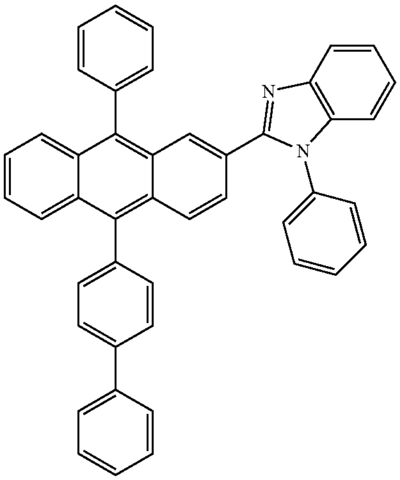
ET15
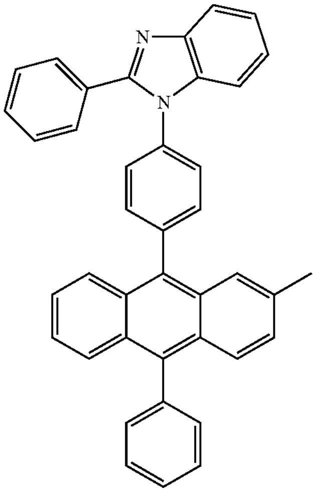

-continued
ET16
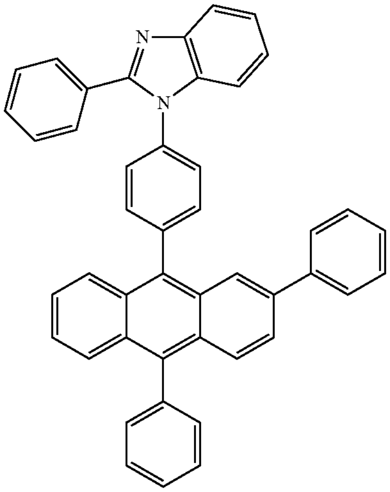
ET17
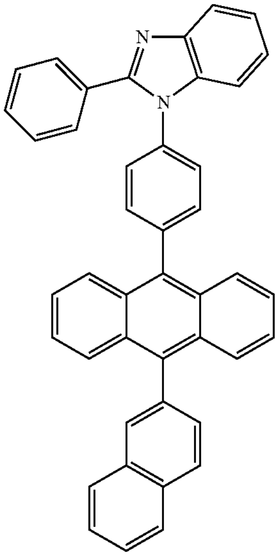
ET18
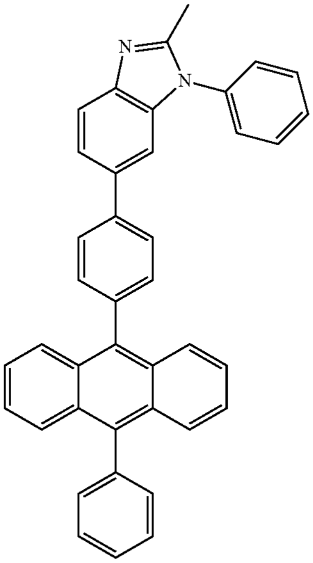
-continued
ET19
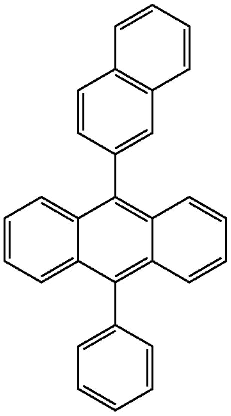
ET20
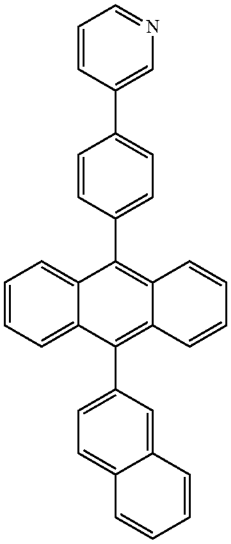
ET21
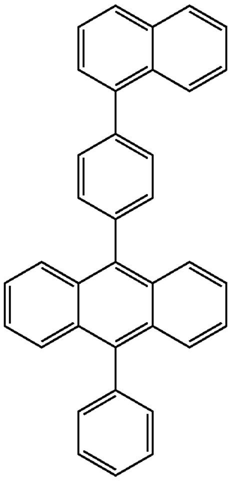

-continued
ET22
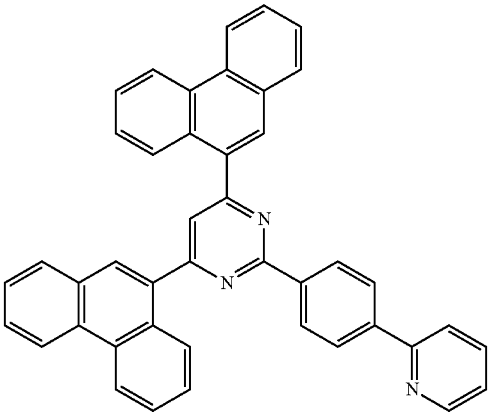
ET23
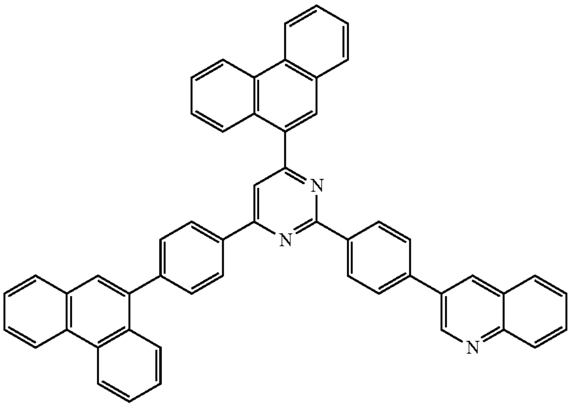
ET24
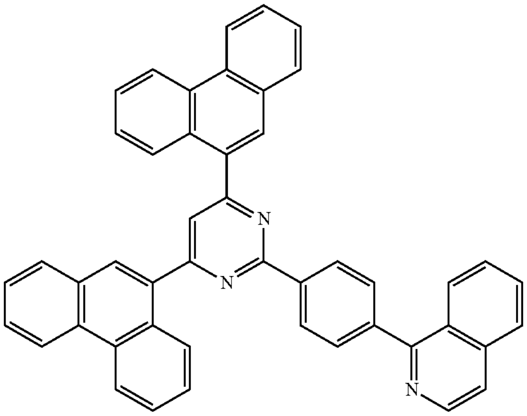
-continued
ET25
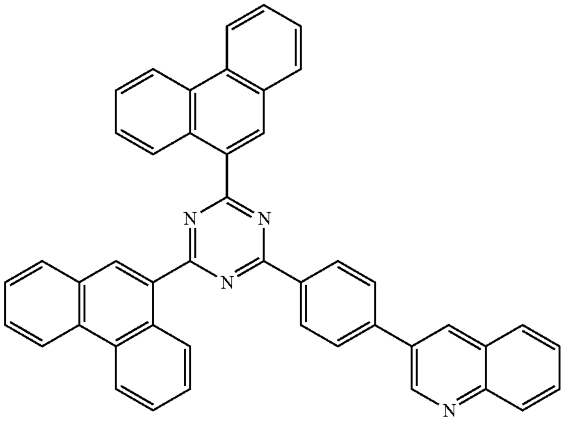
ET26
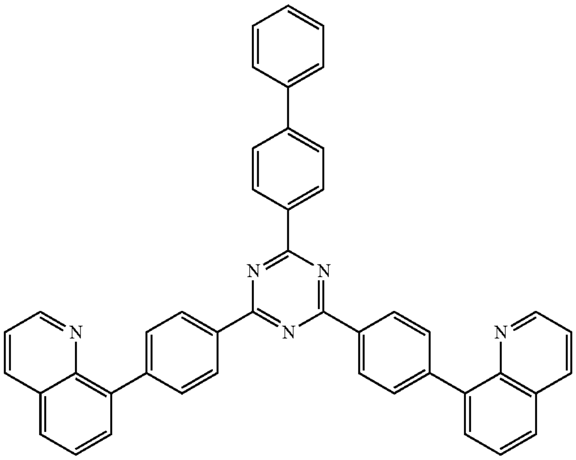
ET27
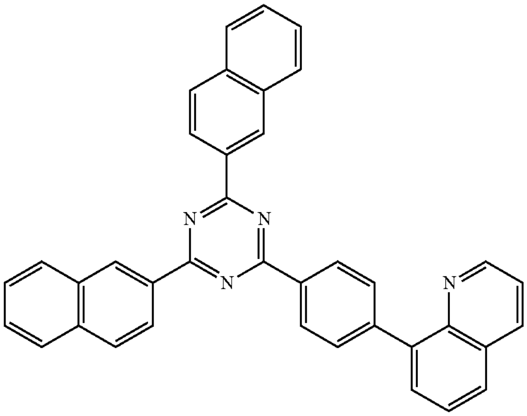

-continued
ET28
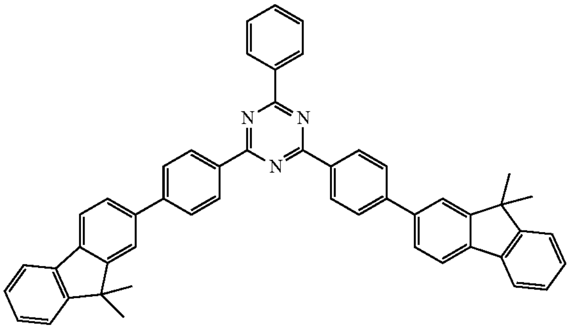
ET29
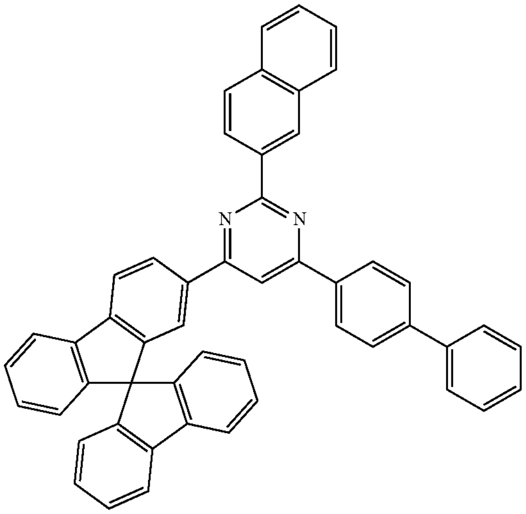
ET30
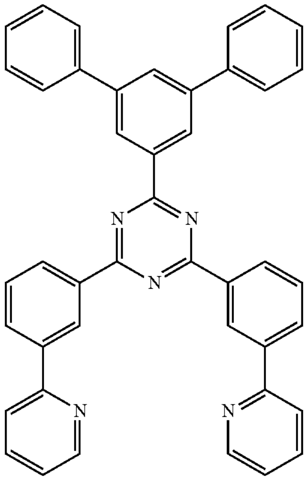
-continued
ET31
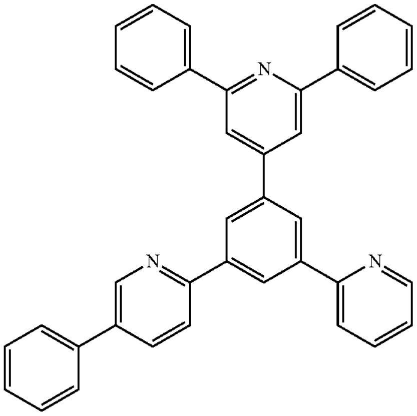
ET32
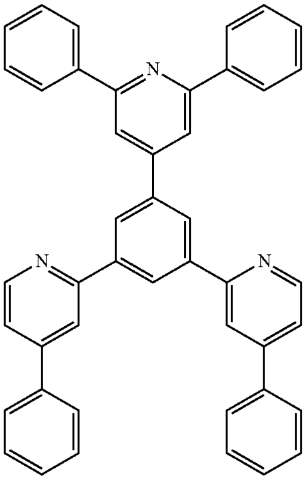
ET33
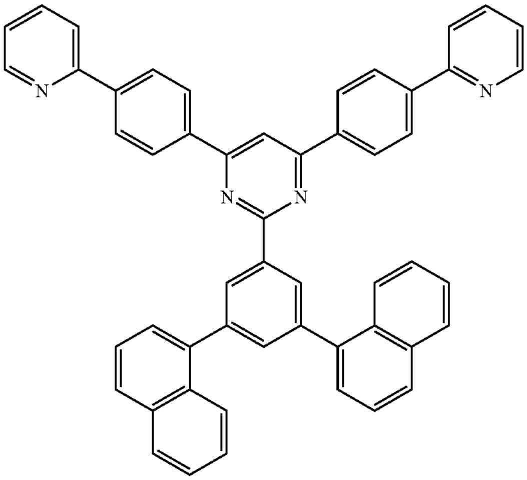

-continued

ET34

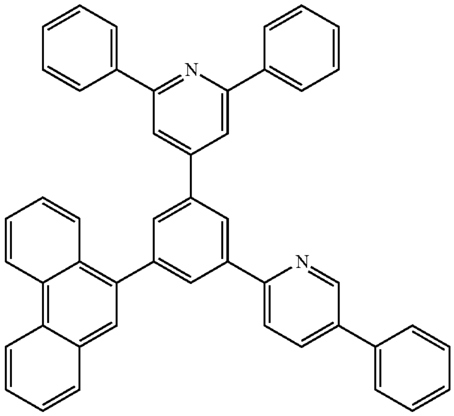

ET35

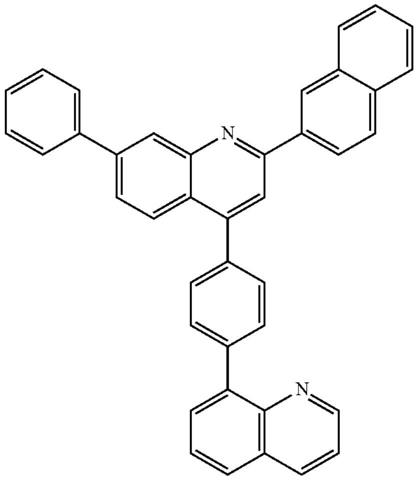

ET36

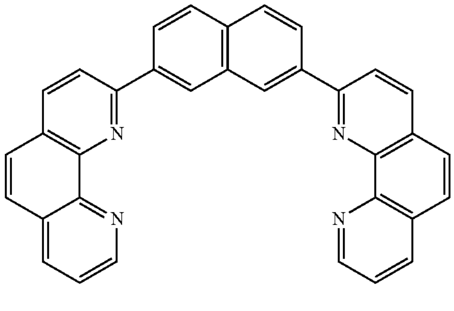

In one or more embodiments, the electron transport region may include at least one selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ.

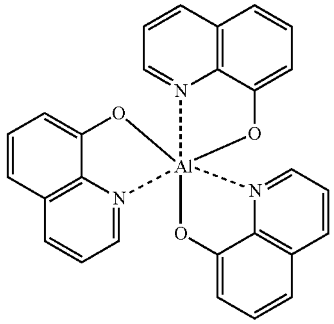

$Alq_3$

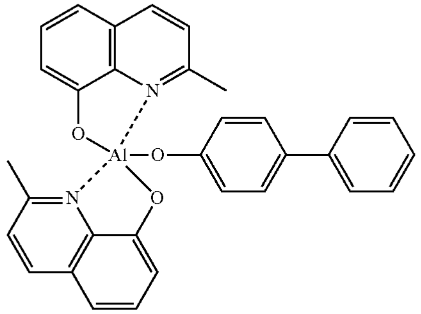

BAlq

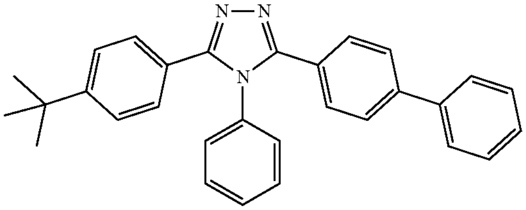

TAZ

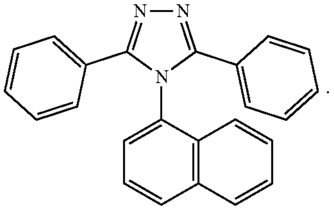

NTAZ

The thickness of the buffer layer, the hole blocking layer, or the electron controlling layer may each independently be in a range of about 20 Å to about 1,000 Å, for example, about 30 Å to about 300 Å. When the thicknesses of the buffer layer, the hole blocking layer, and the electron control layer are within these ranges, the hole blocking layer may have excellent hole blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have suitable or satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (8-hydroxyquinolinolato-lithium, LiQ) or ET-D2.

ET-D1

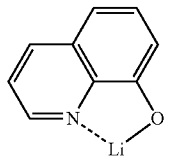

ET-D2

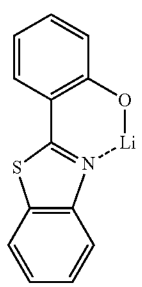

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

In one or more embodiments, the electron injection layer may include Li, Na, K, Rb, Cs, Mg, Ca, Er, Tm, Yb or any combination thereof. However, a material included in the electron injection layer is not limited thereto.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tm, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In one embodiment, the alkali metal compound may be selected from LiF, LiO, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), or $Ba_xCa_{1-x}O$ ($0<x<1$). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $SCl_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy phenyloxadiazole, hydroxy phenylthiadiazol, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have suitable or satisfactory electron injection characteristics without a substantial increase in driving voltage.

In one embodiment, the electron transport region of the organic light-emitting device 10 may include a buffer layer, an electron transport layer, and an electron injection layer, at least one layer selected from the electron transport layer and the electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

Second Electrode 190

The second electrode 190 may be disposed on the organic layer 150 having such a structure. The second electrode 190 may be a cathode that is an electron injection electrode, and in this regard, a material for forming the second electrode 190 may be a material having a low work function, and such a material may be metal, alloy, an electrically conductive compound, or a mixture thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
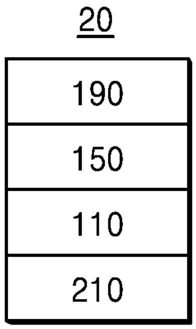
Figure 3:
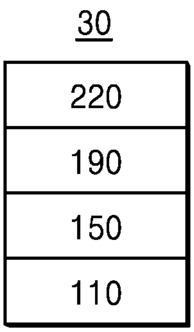
Figure 4:
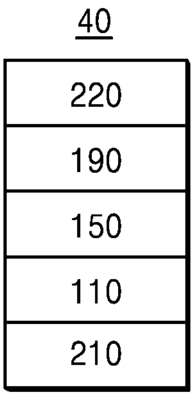

Description of FIGS. 2-4

An organic light-emitting device 20 of FIG. 2 includes a first capping layer 210, a first electrode 110, an organic layer 150, and a second electrode 190 which are sequentially stacked in this stated order, an organic light-emitting device 30 of FIG. 3 includes a first electrode 110, an organic layer 150, a second electrode 190, and a second capping layer 220 which are sequentially stacked in this stated order, and an organic light-emitting device 40 of FIG. 4 includes a first capping layer 210, a first electrode 110, an organic layer 150, a second electrode 190, and a second capping layer 220 which are sequentially stacked in this stated order.

In FIGS. 2-4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, a naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

Hereinbefore, the organic light-emitting device according to an embodiment has been described in connection with FIGS. 1-4. However, embodiments of the present disclosure are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^3$ torr, and a deposition speed of about 0.01 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C., depending on a compound to be included in a layer and the structure of each layer to be formed.

General Definition of Some of the Substituents

The term "$C_1$-$C_{60}$ alkyl group," as used herein, refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group formed by substituting at least one carbon-carbon double bond at a main chain (e.g., in the middle) or at a terminus of the $C_2$-$C_{60}$ alkyl group, and non-limiting examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group formed by substituting at least one carbon-carbon triple bond at a main chain (e.g., in the middle) or at a terminus of the $C_2$-$C_{60}$ alkyl group, and non-limiting examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent saturated monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, a tetrahydrothiophenyl group. The term "$C_1$-$C_{10}$ heterocycloalkylene group," as used herein refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., the ring, group, and/or entire molecule is not aromatic), and non-limiting examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group are a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together). The term "$C_7$-$C_{60}$ alkylaryl group," as used herein refers to a $C_6$-$C_{60}$ aryl group substituted with at least one $C_6$-$C_{60}$ alkyl group.

The term "$C_1$-$C_{60}$ heteroaryl group," as used herein, refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group," as used herein, refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other (e.g., combined together). The term "$C_2$-$C_{60}$ alkyl heteroaryl group," as used herein, refers to a $C_1$-$C_{60}$ heteroaryl group substituted with at least one $C_1$-$C_{60}$ alkyl group.

The term "$C_6$-$C_{60}$ aryloxy group," as used herein refers to —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure (e.g., the entire group and/or molecule is not aromatic). An example of the monovalent non-aromatic condensed polycyclic group is a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together), at least one heteroatom selected from N, O, Si, P, and S, other than carbon atoms, as a ring-forming atom, and no aromaticity in its entire molecular structure (e.g., the entire group and/or molecule is not aromatic). An example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_1$-$C_{60}$ carbocyclic group, except that as a ring-forming atom, at least one heteroatom selected from N, O, Si, P, and S is used in addition to carbon (the number of carbon atoms may be in a range of 1 to 60).

At least one substituent selected from the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$—$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —$C_1$, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$O(Q_{11})$, —$S(Q_{11})$, —$Si(Q_{11})(Q_{12})(Q_{13})$, —$N(Q_{11})(Q_{12})$, —$B(Q_{11})(Q_{12})$, —$P(Q_{11})(Q_{12})$, —$C(=O)(Q_{11})$, —$S(=O)_2(Q_{11})$, and —$P(=O)(Q_{11})(O_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_1$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$O(Q_{21})$, —$S(Q_{21})$, —$Si(Q_{21})(Q_{22})(Q_{23})$, —$N(Q_{21})(Q_{22})$, —$B(Q_{21})(Q_{22})$, —$P(Q_{21})(Q_{22})$, —$C(=O)(Q_{21})$, —$S(=O)_2(Q_{21})$, and —$P(=O)(Q_{21})(Q_{22})$; and —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, and —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_1$a heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, a cyano group, a $C_1$-$C_{60}$ alkyl group, a phenyl group, and a biphenyl group, and a $C_6$-$C_{60}$ aryl group substituted with at least one selected from deuterium, —F, a cyano group, a —$C_1$ C $alkyl_{10}$ group, a phenyl group, and a biphenyl group.

The term "Ph," as used herein, may refer to a phenyl group; the term "Me," as used herein, may refer to a methyl group; the term "Et," as used herein, may refer to an ethyl group; the terms "ter-Bu" or "$Bu^t$," as used herein, may refer to a tert-butyl group; and the term "OMe," as used herein, may refer to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples refers to that an identical (e.g., a substantially identical) molar equivalent of B was used in place of A.

EXAMPLES

Synthesis Example

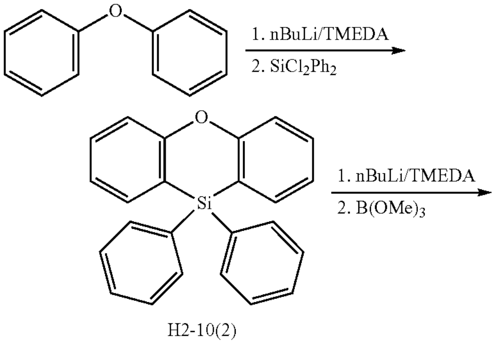

H2-10(2)

-continued

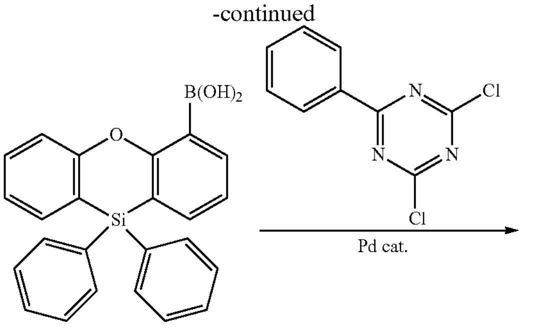

H2-10(1)

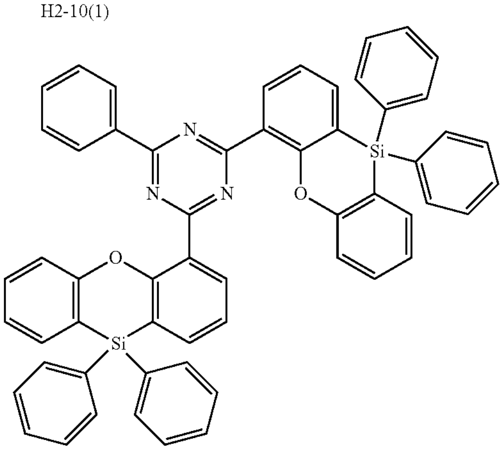

H2-10

Synthesis of Intermediate H2-10(2)

Diphenylether in tetrahydrofuran (THF) was reacted with tetramethylethylenediamine (TMEDA) and nBuLi, and the reaction product therefrom was reacted with dichlodiphenylsilane to obtain Intermediate H2-10(2). Intermediate H2-10(2) was identified by LC-MS.

$C_{24}H_{18}OSi$: M+1 351.3.

Synthesis of Intermediate H2-10(1)

Intermediate H2-10(2) in THF was reacted with TMEDA and nBuLi, and the reaction product therefrom was reacted with trimethylboron to obtain Intermediate H2-10(1). Intermediate H2-10(1) was identified by LC-MS.

$C_{24}H_{19}BO_3Si$: M+1 395.2.

Synthesis of Compound H2-10

1.8 g of 2,4-dichloro-6-phenyltriazine (CAS number=1700-02-3), 3.0 g of Intermediate H2-10(1), 0.33 g of tetrakis(triphenylphosphine)palladium, and 2.5 g of potassium carbonate were added to a reaction container, and 30 mL of toluene, 10 mL of ethanol, and 10 mL of distilled water were added thereto and refluxed for 24 hours. After the reaction was completed, an organic layer obtained by extracting the reaction solution by using ethyl acetate was dried by using magnesium sulfate, and a residual obtained by evaporating the solvent was purified by silica gel column chromatography to synthesize 3.4 g (yield: 55%) of Compound H2-10. Compound H2-10 was identified by MS/FAB and $^1$H-NMR.

$^1$H NMR ($CDCl_3$, 400 MHz) 8.36 (d, 2H), 8.05 (d, 2H), 7.52-7.41 (m, 15H), 7.37-7.35 (m, 14H), 7.11-7.05 (m, 4H).

MS/FAB found: 854.4, calc.: 853.26.

Evaluation Example 1

HOMO and LUMO energy levels of Compounds D5, D8, H2-2, H2-10, H3-2, and H3-4 were evaluated by methods described in Table 1, and results thereof are shown in Table 2.

TABLE 1

| | |
|---|---|
| HOMO energy level evaluation method | A voltage-current (V-A) graph of each Compound was obtained by using a cyclic voltammetry (CV) (electrolyte: 0.1M $Bu_4NPF_6$/ solvent: DMF (dimethylforamide)/electrode: 3-electrode system (working electrode: GC, reference electrode: Ag/AgCl, auxiliary electrode: Pt)), and then the HOMO energy level of each Compound was calculated from an oxidation onset. |
| LUMO energy level evaluation method | A V-A graph of each Compound was obtained by using a cyclic voltammetry (CV) (electrolyte: 0.1M $Bu_4NPF_6$/solvent: DMF (dimethylforamide)/electrode: 3-electrode system (working electrode: GC, reference electrode: Ag/AgCl, auxiliary electrode: Pt)), and then, the LUMO energy level of each Compound was calculated from a reduction onset. |

TABLE 2

| Compound No. | HOMO (eV) | LUMO (eV) |
|---|---|---|
| D5 | −5.24 | −2.25 |
| D8 | −5.25 | −2.16 |
| H2-2 | −6.50 | −2.72 |
| H2-10 | −6.20 | −2.45 |
| H3-2 | −5.51 | −1.91 |
| H3-4 | −5.64 | −2.13 |

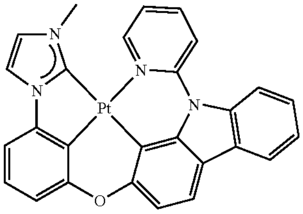

D5

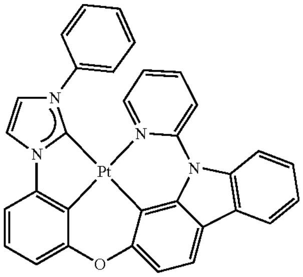

D8

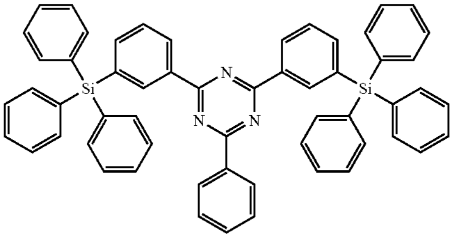

H2-2

TABLE 2-continued

| Compound No. | HOMO (eV) | LUMO (eV) |
|---|---|---|
| 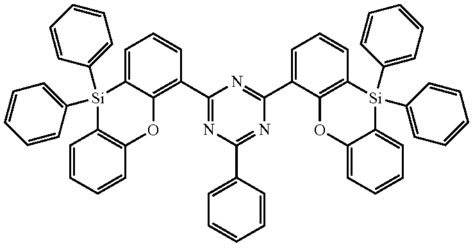 H2-10 | | |
| 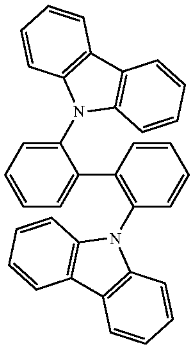 H3-2 | | |
| 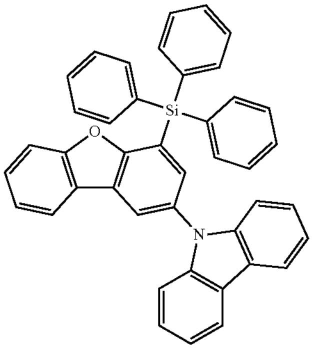 H3-4 | | |

Referring to Table 2, it is confirmed that Compounds D5, D8, H2-2, H2-10, H3-2, and H3-4 have HOMO and LUMO energy levels suitable for manufacturing the organic light-emitting device.

Example 1 (Bottom Emission)

As an anode, a Corning 15 Ω/cm2 (1,200 Å) ITO glass substrate was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

2-TNATA was vacuum-deposited on the anode to form a hole injection layer having a thickness of 600 Å, and 4,4'-bis[N-(1-naphthyl)-N-phenyl] aminobiphenyl (NPB) was vacuum-deposited on the hole injection layer to form a hole transport layer having a thickness of 300 Å.

Compound D8 as a first compound, Compound H2-2 as a second compound, and Compound H3-2 as a third compound were vacuum-deposited on the hole transport layer to form an emission layer having a thickness of 300 Å. An amount of Compound D8 was 10 wt % based on a total amount (100 wt %) of the emission layer, and a weight ratio of Compound H2-2 to Compound H3-2 was adjusted to 2:8.

Compound H2-2 was vacuum-deposited on the emission layer to form a hole blocking layer having a thickness of 50 Å, $Alq_3$ was vacuum-deposited on the hole blocking layer to form an electron transport layer having a thickness of 300 Å, LiF was vacuum-deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

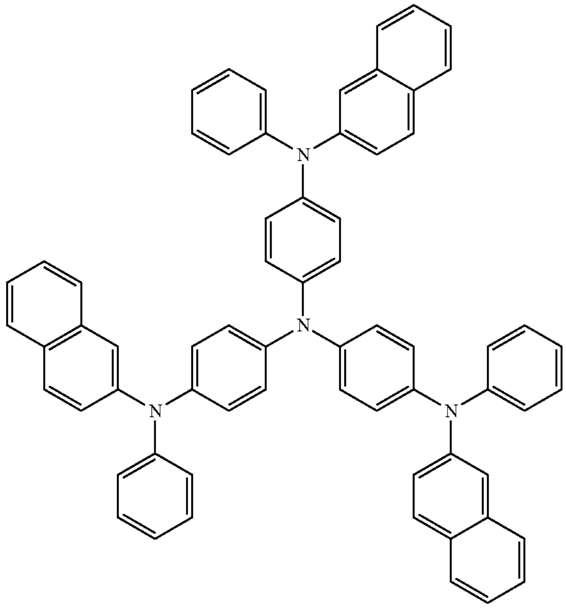

2-TNATA

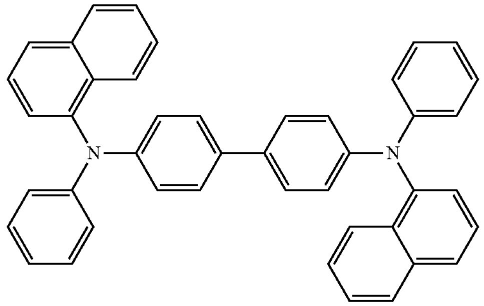

NPB

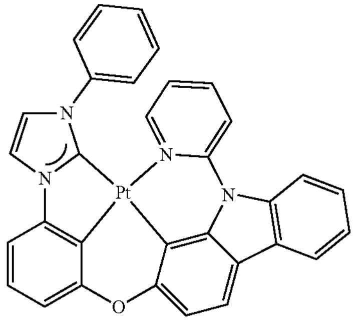

D8

-continued

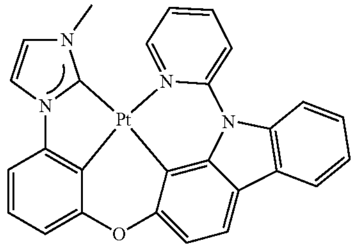

D5

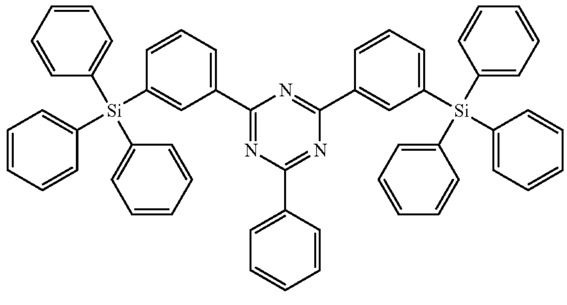

H2-2

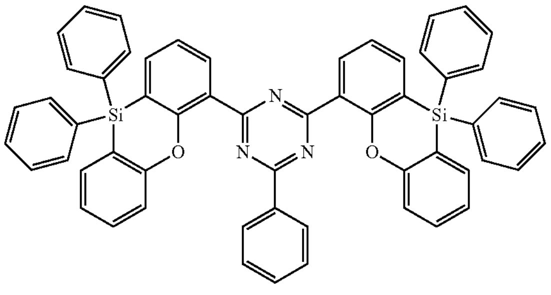

H2-10

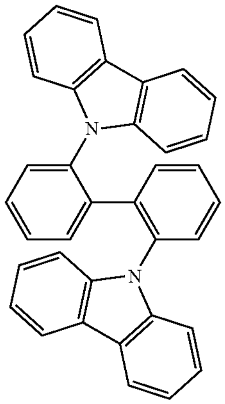

H3-2

-continued

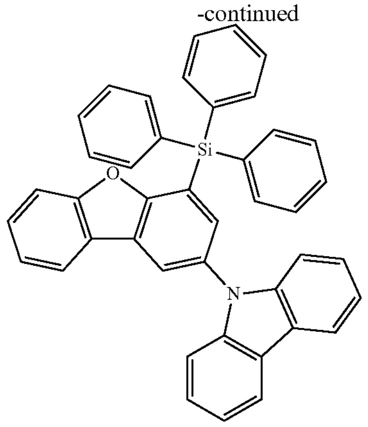

H3-4

Examples 2 to 4 and Comparative Examples 1 to 5 (Bottom Emission)

Organic light-emitting devices were manufactured in substantially the same manner as in Example 1, except that Compounds shown in Table 3 were each respectively used as a first compound, a second compound, and a third compound in forming an emission layer.

Example 5 (Top Emission)

An organic light-emitting device was manufactured in substantially the same manner as in Example 4, except that a thickness of a hole transport layer was changed to 1,150 Å.

Evaluation Example 2

Figure 5:
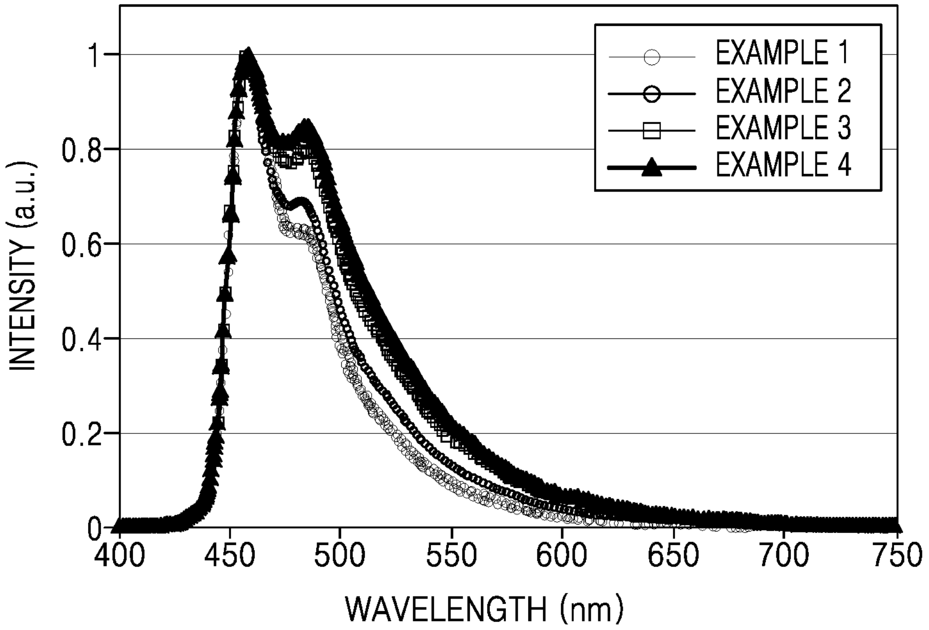
FIG. 5 is a graph illustrating electroluminescence (EL) spectra of organic light-emitting devices manufactured according to Examples 1 to 4.
Figure 6:
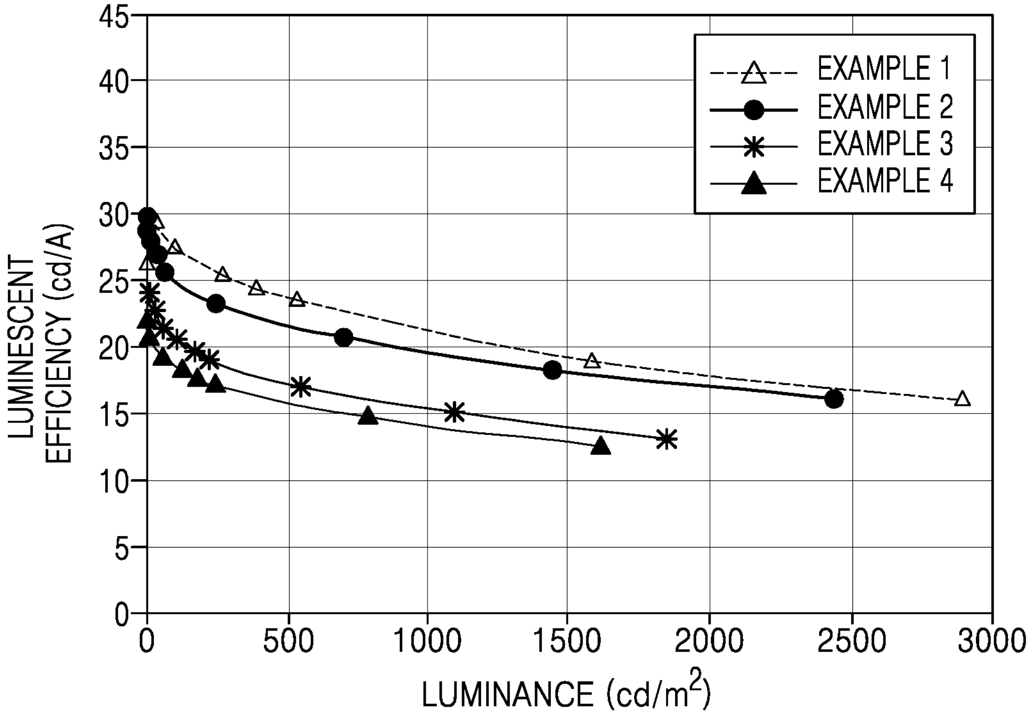
FIG. 6 is a graph illustrating luminance-luminescent efficiency graphs of the organic light-emitting devices manufactured according to Examples 1 to 4.
Figure 7:
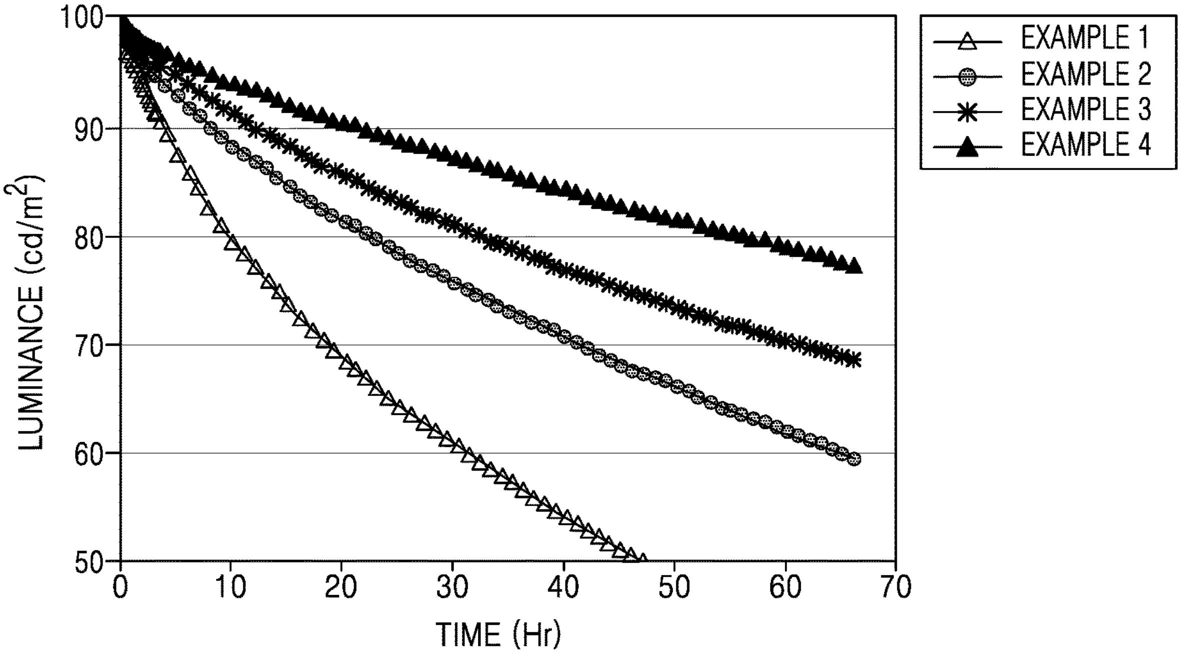
FIG. 7 is a graph illustrating time-luminance graphs of the organic light-emitting devices manufactured according to Examples 1 to 4.
Figure 8:
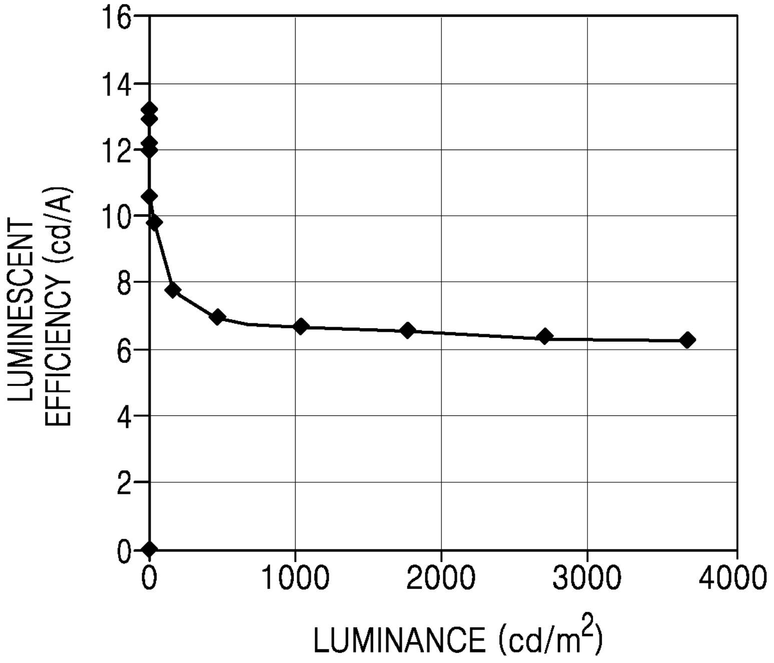
FIG. 8 is a graph illustrating a luminance-luminescent efficiency graph of an organic light-emitting device manufactured according to Comparative Example 1.
Figure 9:
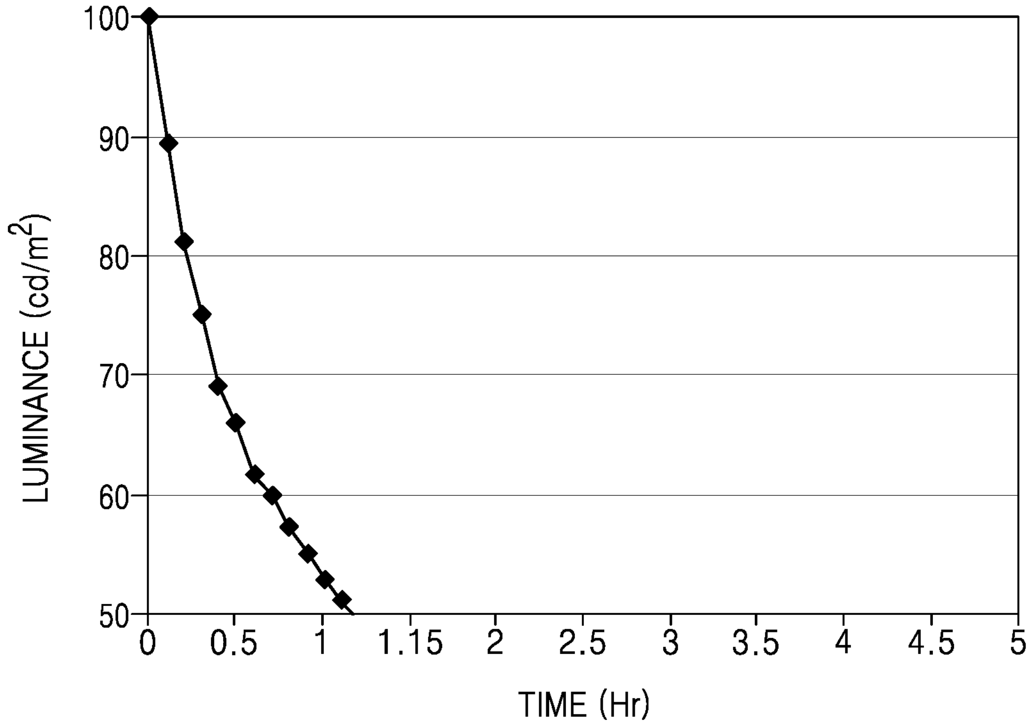
FIG. 9 is a graph illustrating a time-luminance graph of the organic light-emitting device manufactured according to Comparative Example 1.

The driving voltage (V), current density ($mA/cm^2$), luminescent efficiency (cd/A), maximum emission wavelength (nm), and lifespan ($T_{90}$) of the organic light-emitting devices manufactured according to Examples 1 to 5 and Comparative Examples 1 to 5 (at 1,000 $cd/m^2$) were measured by using Keithley MU 236 and a luminance meter PR650, and results thereof are shown in Table 3. The lifespan ($T_{90}$) in Table 3 indicates an amount of time that lapsed from initial use until when luminance was 90% of initial luminance (100%). EL spectra of the organic light-emitting devices manufactured according to Examples 1 to 4 are shown in FIG. 5. Luminance-luminescent efficiency graphs of the organic light-emitting devices manufactured according to Examples 1 to 4 are shown in FIG. 6. Time-luminance graphs of the organic light-emitting devices manufactured according to Examples 1 to 4 are shown in FIG. 7. A luminance-luminescent efficiency graph of the organic light-emitting device manufactured according to Comparative Example 1 is shown in FIG. 8. A time-luminance graph of the organic light-emitting device manufactured according to Comparative Example 1 is shown in FIG. 9.

TABLE 3

| | Dopant | Host (weight ratio) | | | Luminescent | Maximum emission | Lifespan ($T_{90}$, h) |
|---|---|---|---|---|---|---|---|
| | First compound | Second compound | Third compound | Luminance (cd/$m^2$) | efficiency (cd/A) | wavelength (nm) | (at 1000 cd/$m^2$) |
| Example 1 | D8 | H2-2 2:8 | H3-2 | 1000 | 14.20 | 457 | 3.0 |
| Example 2 | D8 | H2-2 3:7 | H3-2 | 1000 | 19.80 | 457 | 7.0 |
| Example 3 | D8 | H2-2 4:6 | H3-2 | 1000 | 20.10 | 457 | 11.0 |
| Example 4 | D8 | H2-10 4:6 | H3-2 | 1000 | 28.30 | 457 | 21.0 |
| Example 5 | D8 | H2-10 4:6 | H3-2 | 1062 | 28.80 | 453 | 10.0 |
| Comparative Example 1 | D5 | H3-4 | | 1000 | 6.9 | 458 | 0.1 |
| Comparative Example 2 | D5 | H3-2 | | 1000 | 10.7 | 456 | 0.1 |
| Comparative Example 3 | D5 | H2-2 | | 1000 | 3.8 | 485 | 0.5 |
| Comparative Example 4 | D5 | H-A | | 1000 | 3.0 | 485 | 0.5 |
| Comparative Example 5 | Ir-D | H2-2 4:6 | H3-2 | 1000 | 24.2 | 465 | 2.0 |

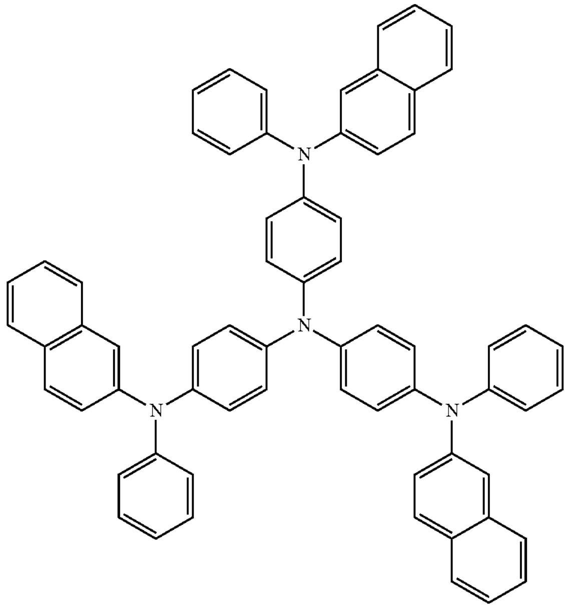

2-TNATA

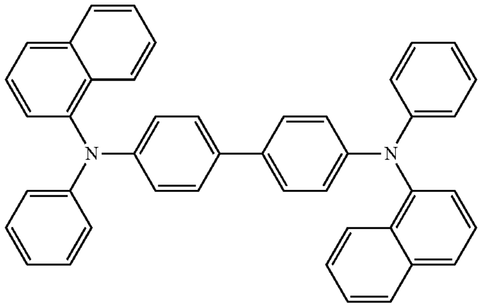

NPB

-continued

D8

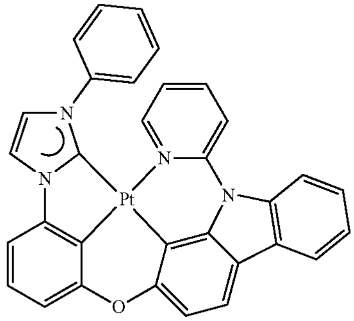

D5

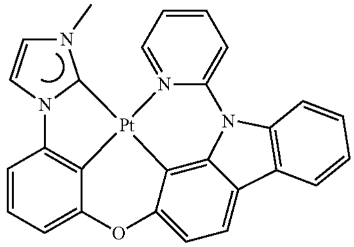

H2-2

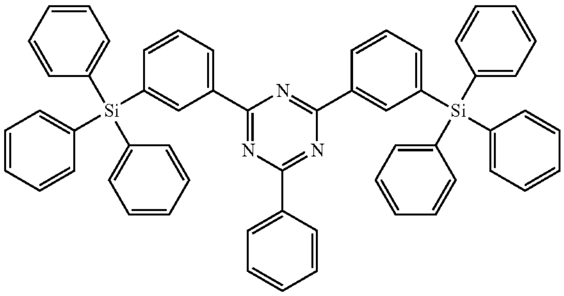

-continued

H2-10

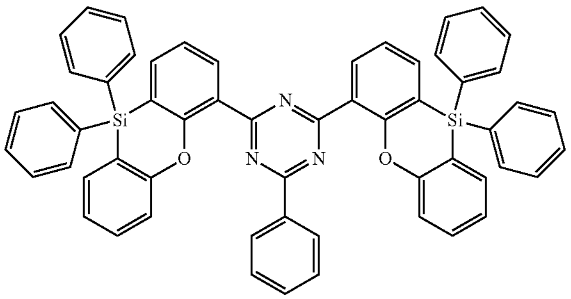

H3-2

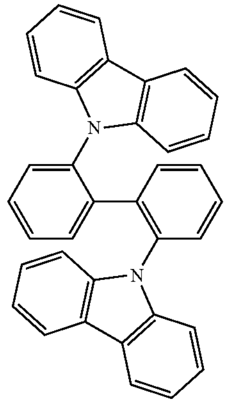

H3-4

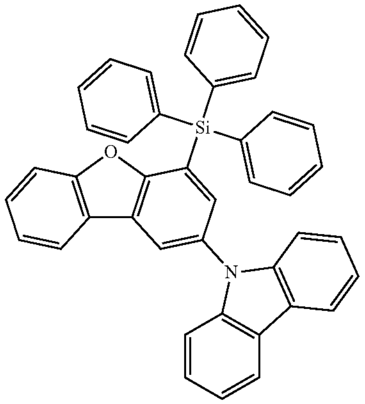

H-A

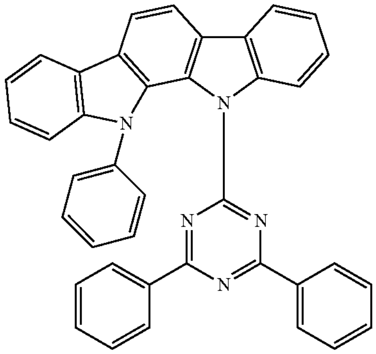

-continued

Ir-D

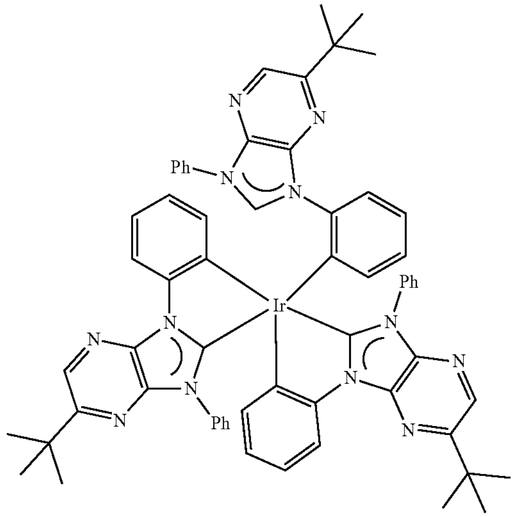

Referring to FIG. 5, it is confirmed that the organic light-emitting devices manufactured according to Examples 1 to 4 have, in addition to a main emission peak having a maximum emission wavelength of about 455 nm, an auxiliary emission peak derived from an exciplex formed by a first compound and a second compound having a maximum emission wavelength of about 470 nm.

Referring to FIGS. 6-9 and Table 3, it is confirmed that the organic light-emitting devices manufactured according to Examples 1 to 5 may emit blue light, may have luminescent efficiency higher than or equivalent to that of the organic light-emitting devices manufactured according to Comparative Examples 1 to 5, and may have improved lifespan characteristics.

Evaluation Example 3

Regarding the organic light-emitting device of Example 4, while a voltage pulse (pulse width was in a range of 10 ns to 1 ms) was applied by using an AVTECCH AV-1011-B pulse generator, the TREL spectrum of the organic light-emitting device of Example 4 was measured by using Tektronix TDS 460 Four Channel Digitizing Oscilloscope. From the TREL spectrum, the decay time of the delayed fluorescence emitted from the organic light-emitting device of Example 4 was confirmed to be 2.95 μs.

The organic light-emitting device according to embodiments of the present disclosure may have high luminescent efficiency and a long lifespan and may be used to manufacture high-quality electronic apparatuses.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as “beneath,” “below,” “lower,” “under,” “above,” “upper,” and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting device comprising:

a first electrode;

a second electrode facing the first electrode; and an emission layer disposed between the first electrode and the second electrode;

the emission layer comprises a first compound, a second compound, and a third compound, the first compound, the second compound, and the third compound are different from one another, an amount of the first compound is smaller than a total amount of the second compound and the third compound, the first compound is a compound represented by Formula 1, the second compound comprises at least one group selected from a pyrimidine group, and a triazine group and at least one Si, the third compound comprises at least one of a compound represented by Formula 3-1, a compound represented by Formula 3-2, a compound represented by Formula 3-3, a compound represented by Formula 3-4, and a compound represented by Formula 3-5, the first compound and the second compound form an exciplex, and a decay time of delayed fluorescence in a time-resolved electroluminescence (TREL) spectrum of the organic light-emitting device is 50 ns or more:

Formula 1

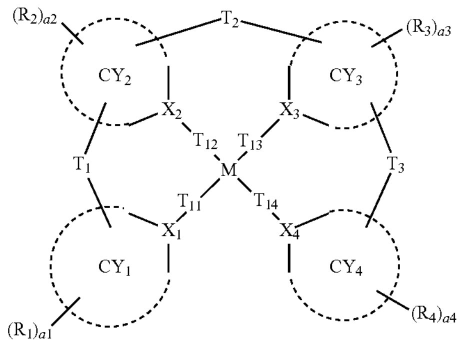

wherein, in Formula 1,

M is Pt, $X_1$ is N, $X_2$ to $X_4$ are C, $T_{11}$ to $T_{14}$ are a chemical bond, $T_1$ and $T_3$ are a single bond, $T_2$ are *—N($R_6$)—**, *—C($R_{6a}$)($R_{6b}$)—**, *—Si($R_{6a}$)($R_{6b}$)—**, *—S—**, or *—O—**, a moiety represented by

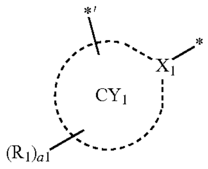

is a group represented by Formula A1-1(1), a moiety represented by

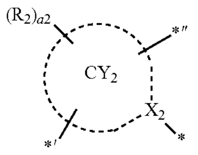

is a group represented by Formula A2-2(1), a moiety represented by

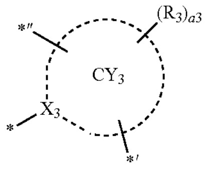

is a group represented by Formula A3-1(1), a moiety represented by

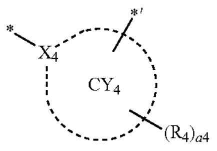

is represented by Formula A4-1(27),

A1-1(1)

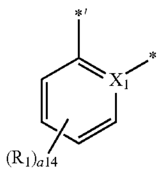

A2-2(1)

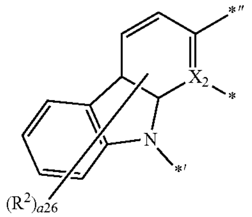

-continued

A3-1(1)

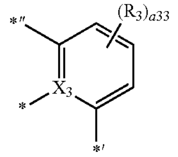

A4-1(27)

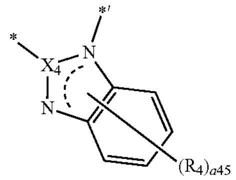

$R_1$ to $R_4$, $R_6$, $R_{6a}$, and $R_{6b}$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, and $—S(=O)_2(Q_1)$, a14 is an integer of 0 to 4, a26 is an integer of 0 to 6, a33 is an integer of 0 to 3, a45 is an integer of 1 to 5, provided that, at least one of $R_4$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, and a substituted or unsubstituted monovalent non-aromatic condensed heteropolycyclic group,

* in Formula A1-1(1) indicates a binding site to M in Formula 1,

*' in Formula A1-1(1) indicates a binding site to $T_1$ in Formula 1,

* in Formula A2-2(1) indicates a binding site to M in Formula 1,

*' in Formula A2-2(1) indicates a binding site to $T_1$ in Formula 1,

*" in Formula A2-2(1) indicates a binding site to $T_2$ in Formula 1,

* in Formula A3-1(1) indicates a binding site to M in Formula 1,

*' in Formula A3-1(1) indicates a binding site to $T_3$ in Formula 1,

*" in Formula A3-1(1) indicates a binding site to $T_2$ in Formula 1,

* in A4-1(27) indicates a binding site to M in Formula 1,

*' in A4-1(27) indicates a binding site to $T_3$ in Formula 1, i) two groups selected from $R_1$ (s) in the number of a14, ii) two groups selected from $R_2$ (s) in the number of a26, iii) two groups selected from $R_3$ (s) in the number of a33, iv) two groups selected from $R_4$ (s) in the number of a45, and v) $R_{6a}$ and $R_{6b}$, are optionally linked via a single bond, a double bond, or a first linking group to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, provided that $R_3$ and $R_4$ are not linked, 3-1

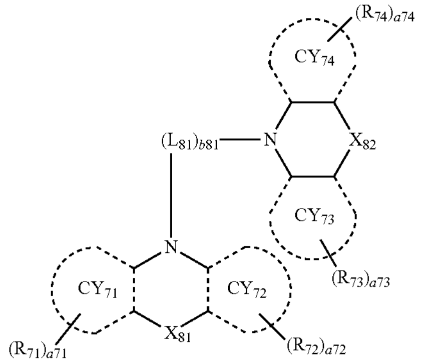

3-2

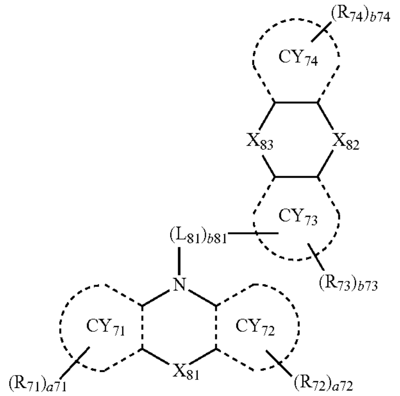

3-3

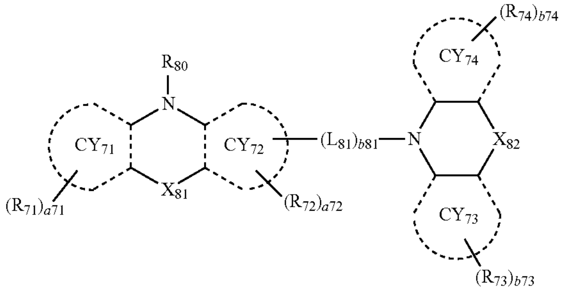

-continued 3-4

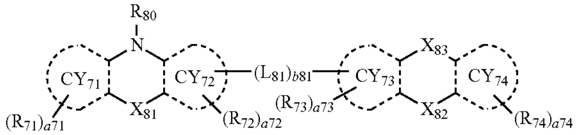

3-5

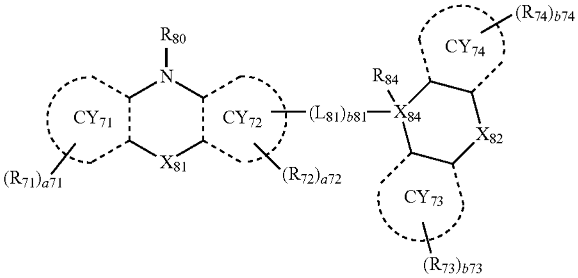

wherein in Formula 3-1 to 3-5, ring $CY_{71}$ to ring $CY_{74}$ are each independently selected from a benzene group, a naphthalene group, an anthracene group, a phenanthrene group, a cyclopentadiene group, a 1,2,3,4-tetrahydronaphthalene group, a thiophene group, a furan group, an indole group, an indene group, a benzosilole group, a benzothiophene group, a benzofuran group, a carbazole group, a fluorene group, a dibenzosilole group, a dibenzothiophene group, a dibenzofuran group, an azaindole group, an azaindene group, an azabenzosilole group, an azabenzothiophene group, an azabenzofuran group, an azacarbazole group, an azafluorene group, an azadibenzosilole group, an azadibenzothiophene group, an azadibenzofuran group, and a pyridine group, $L_{81}$ is selected from *—$C(Q_4)(Q_5)$-**, *—$Si(Q_4)(Q_5)$-**, a substituted or unsubstituted $C_5$-$C_{30}$ carbocyclic group, and a substituted or unsubstituted $C_1$-$C_{30}$ heterocyclic group, b81 is an integer of 0 to 5, $X_{81}$ is a single bond, O, S, $N(R_{81})$, $B(R_{81})$, $C(R_{81a})(R_{81b})$, or $Si(R_{81a})(R_{81b})$, $X_{82}$ is a single bond, O, S, $N(R_{82})$, $B(R_{82})$, $C(R_{82a})(R_{82b})$, or $Si(R_{82a})(R_{82b})$, $X_{83}$ is a single bond, O, S, $N(R_{83})$, $B(R_{83})$, $C(R_{83a})(R_{83b})$, or $Si(R_{83a})(R_{83b})$, $X_{84}$ is C or Si, $R_{71}$ to $R_{74}$, $R_{80}$ to $R_{83}$, $R_{81a}$, $R_{81b}$, $R_{82a}$, $R_{82b}$, $R_{83a}$, $R_{83b}$, and $R_{84}$ are each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(=O)($Q_1$)($Q_2$), a71 to a74 are each independently an integer of 0 to 10, two groups selected from $R_{71}$ to $R_{74}$, $R_{80}$ to $R_{83}$, $R_{81a}$, $R_{81b}$, $R_{82a}$, $R_{82b}$, $R_{83a}$, $R_{83b}$, and $R_{84}$ are optionally linked via a single bond, a double bond, or a first linking group to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, wherein in Formulae 1 and 3-1 to 3-5, $R_{10a}$ is the same as defined in connection with $R_1$, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —O($Q_{11}$), —S($Q_{11}$), —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(═O)($Q_{11}$), and —S(=O)$_2$($Q_{11}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-Coo aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —O($Q_{21}$), —S($Q_{21}$), —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(═O)($Q_{21}$), and —S(═O)$_2$($Q_{21}$); and —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(═O)($Q_{31}$), and —S(═O)$_2$($Q_{31}$), and $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, a cyano group, a $C_1$-$C_{60}$ alkyl group, a phenyl group, and a biphenyl group, and a $C_6$-$C_{60}$ aryl group substituted with at least one selected from deuterium, —F, a cyano group, a $C_1$-$C_{10}$ alkyl group, a phenyl group, and a biphenyl group.

2. The organic light-emitting device of claim 1, wherein:

the organic light-emitting device has a non-resonance structure, an electroluminescence (EL) spectrum of the organic light-emitting device includes a first peak and a second peak, a maximum emission wavelength of the second peak is greater than a maximum emission wavelength of the first peak, a difference between the maximum emission wavelength of the second peak and the maximum emission wavelength of the first peak is in a range of about 5 nm to about 30 nm, and the intensity of the second peak is smaller than the intensity of the first peak.

3. The organic light-emitting device of claim 2, wherein:

the maximum emission wavelength of the first peak is in a range of about 390 nm to about 500 nm.

4. The organic light-emitting device of claim 2, wherein:

the first peak is an emission peak of phosphorescence emitted from the first compound, and the second peak is an emission peak of an exciplex formed by the first compound and the second compound.

5. The organic light-emitting device of claim 2, wherein:

the intensity of the second peak is in a range of about 20% to about 90% of the intensity of the first peak.

6. An electronic apparatus comprising the organic light-emitting device of claim 1.

7. The electronic apparatus of claim 6, further comprising a thin film transistor comprising a source electrode and a drain electrode, wherein the first electrode of the organic light-emitting device is electrically coupled to the source electrode or the drain electrode.

8. The organic light-emitting device of claim 1, wherein:

the organic light-emitting device satisfies at least one of Condition 1 to Condition 4:

Condition 1 a lowest unoccupied molecular orbital (LUMO) energy level (eV) of the third compound>a LUMO energy level (eV) of the first compound Condition 2 the LUMO energy level (eV) of the first compound>a LUMO energy level (eV) of the second compound Condition 3 a highest occupied molecular orbital (HOMO) energy level (eV) of the first compound>a HOMO energy level (eV) of the third compound Condition 4 the HOMO energy level (eV) of the third compound>a HOMO energy level (eV) of the second compound.

9. The organic light-emitting device of claim 1, wherein:

an absolute value of a difference between a lowest unoccupied molecular orbital (LUMO) energy level of the first compound and a LUMO energy level of the second compound is 0.1 eV to 1.0 eV.

10. The organic light-emitting device of claim 1, wherein:

an absolute value of a difference between a lowest unoccupied molecular orbital (LUMO) energy level of the first compound and a LUMO energy level of the third compound is 0.1 eV to 1.0 eV.

11. The organic light-emitting device of claim 1, wherein:

an absolute value of a difference between a highest occupied molecular orbital (HOMO) energy level of the first compound and a HOMO energy level of the second compound is 1.25 eV or less.

12. The organic light-emitting device of claim 1, wherein:

an absolute value of a difference between a highest occupied molecular orbital (HOMO) energy level of the first compound and a HOMO energy level of the third compound is 1.25 eV or less.

13. The organic light-emitting device of claim 1, wherein:

the third compound comprises at least two carbazole groups.

* * * * *